US012517314B2

(12) United States Patent
Pietambaram et al.

(10) Patent No.: US 12,517,314 B2
(45) Date of Patent: Jan. 6, 2026

(54) HIGH BANDWIDTH OPTICAL INTERCONNECTION ARCHITECTURES

(71) Applicant: Intel Corporation, Santa Clara, CA (US)

(72) Inventors: Srinivas V. Pietambaram, Chandler, AZ (US); Brandon C. Marin, Gilbert, AZ (US); Sameer Paital, Chandler, AZ (US); Sai Vadlamani, Gilbert, AZ (US); Rahul N. Manepalli, Chandler, AZ (US); Xiaoqian Li, Chandler, AZ (US); Suresh V. Pothukuchi, Chandler, AZ (US); Sujit Sharan, Chandler, AZ (US); Arnab Sarkar, Chandler, AZ (US); Omkar Karhade, Chandler, AZ (US); Nitin Deshpande, Chandler, AZ (US); Divya Pratap, Hillsboro, OR (US); Jeremy Ecton, Gilbert, AZ (US); Debendra Mallik, Chandler, AZ (US); Ravindranath V. Mahajan, Chandler, AZ (US); Zhichao Zhang, Chandler, AZ (US); Kemal Aygün, Tempe, AZ (US); Bai Nie, Chandler, AZ (US); Kristof Darmawikarta, Chandler, AZ (US); James E. Jaussi, Hillsboro, OR (US); Jason M. Gamba, Gilbert, AZ (US); Bryan K. Casper, Ridgefield, WA (US); Gang Duan, Chandler, AZ (US); Rajesh Inti, Hillsboro, OR (US); Mozhgan Mansuri, Portland, OR (US); Susheel Jadhav, Chandler, AZ (US); Kenneth Brown, Tempe, AZ (US); Ankur Agrawal, Chandler, AZ (US); Priyanka Dobriyal, Milpitas, CA (US)

(73) Assignee: Intel Corporation, Santa Clara, CA (US)

( * ) Notice: Subject to any disclaimer, the term of this patent is extended or adjusted under 35 U.S.C. 154(b) by 976 days.

(21) Appl. No.: 16/953,146

(22) Filed: Nov. 19, 2020

(65) Prior Publication Data

US 2022/0155539 A1 May 19, 2022

(51) Int. Cl.
*G02B 6/42* (2006.01)

(52) U.S. Cl.
CPC ......... *G02B 6/4248* (2013.01); *G02B 6/4214* (2013.01)

(58) Field of Classification Search
CPC ................ G02B 6/4214; G02B 6/4248; G02B 6/12004; G02B 6/12
See application file for complete search history.

(56) References Cited

U.S. PATENT DOCUMENTS 9,379,090 B1 * 6/2016 Syed ........................ H01L 23/13
2005/0161789 A1 * 7/2005 Towle .................. G02B 6/4203 257/680

(Continued)

FOREIGN PATENT DOCUMENTS

CA 2759790 A1 * 11/2010 ........... G01L 9/0076
CN 110196473 9/2019

(Continued)

OTHER PUBLICATIONS

Office Action from Netherlands Patent Application No. 2029423, mailed Oct. 27, 2021, 2pgs.

(Continued)

*Primary Examiner* — Thomas A Hollweg
*Assistant Examiner* — Mary A El-Shammaa
(74) *Attorney, Agent, or Firm* — Schwabe, Williamson & Wyatt P.C.

(57) ABSTRACT

Embodiments disclosed herein include optical packages. In an embodiment, an optical package comprises a package (Continued)

substrate, and a photonics die coupled to the package substrate. In an embodiment, a compute die is coupled to the package substrate, where the photonics die is communicatively coupled to the compute die by a bridge in the package substrate. In an embodiment, the optical package further comprises an optical waveguide embedded in the package substrate. In an embodiment, a first end of the optical waveguide is below the photonics die, and a second end of the optical waveguide is substantially coplanar with an edge of the package substrate.

17 Claims, 57 Drawing Sheets

(56) References Cited

U.S. PATENT DOCUMENTS

| | | | | |
|---|---|---|---|---|
| 2005/0249462 | A1 | 11/2005 | Alduino | |
| 2006/0263003 | A1 | 11/2006 | Asai | |
| 2011/0108716 | A1 | 5/2011 | Takashi | |
| 2013/0064505 | A1 | 3/2013 | Morris et al. | |
| 2013/0207127 | A1 | 8/2013 | Yu et al. | |
| 2014/0177998 | A1 | 6/2014 | Tseng | |
| 2015/0061126 | A1 | 3/2015 | Lee et al. | |
| 2018/0180808 | A1* | 6/2018 | Zhang | G02B 6/4274 |
| 2019/0385994 | A1* | 12/2019 | Rifani | H01L 23/32 |
| 2020/0057218 | A1 | 2/2020 | Islam et al. | |
| 2020/0284981 | A1* | 9/2020 | Harris | G02B 6/43 |
| 2021/0405311 | A1* | 12/2021 | Li | G02B 6/4292 |
| 2023/0341623 | A1* | 10/2023 | Marin | G02B 6/12002 |

FOREIGN PATENT DOCUMENTS

| | | |
|---|---|---|
| JP | 2004-533009 | 10/2004 |
| JP | 2007525712 | 9/2007 |
| JP | 2011-107206 A | 6/2011 |
| TW | 201346360 | 11/2013 |
| WO | WO 2005052666 | 6/2005 |
| WO | WO 2007111327 | 10/2007 |
| WO | WO 2009098834 | 8/2009 |

OTHER PUBLICATIONS

International Search Report and Written Opinion from International Patent Application No. 2029423, mailed Jan. 7, 2022, 10 pgs.

Search Report for Netherlands Patent Application No. 2029423, mailed Mar. 15, 2023, 12 pgs.

International Preliminary Report on Patentability for International Patent Application No. PCT/US2021/049666, mailed Jun. 1, 2023, 6 pgs.

Search Report for European Patent Application No. 21895299.2, mailed Oct. 1, 2024, 8 pgs.

Office Action from Japan Patent Application No. 2023-521840, mailed Jun. 10, 2025, 10 pgs.

Office Action from Taiwan Patent Application No. 110134689, mailed May 12, 2025, 10 pgs.

Office Action from Japan Patent Application No. 2023-521840, mailed Sep. 9, 2025, 8 pgs.

Notice of Allowance from Taiwan Patent Application No. 110134689, mailed Oct. 14, 2025, 3 pgs.

* cited by examiner

HIGH BANDWIDTH OPTICAL INTERCONNECTION ARCHITECTURES

TECHNICAL FIELD

Embodiments of the present disclosure relate to semiconductor devices, and more particularly to interconnect architectures for high bandwidth optical interconnects.

BACKGROUND

Optical interconnects provide solutions to overcome the bottlenecks of high-speed electrical transmission, such as limited electrical I/O bandwidth and signal integrity issues. Optical transmission essentially has a higher limiting bandwidth and higher noise tolerance against electromagnetic interferences (EMI) than electrical transmission. Currently, optical interconnects are connected to a photonics die using a V-groove approach. In such an architecture, the photonics die overhangs an edge of the package substrate and includes a V-groove on the underside surface. A fiber is then inserted into the V-groove to make the optical connections. This approach involves several assembly operations with an overhanging die, such as epoxy underfill processes, integrated heat spreader (IHS) attach with an overhanging die, and package warpage with an overhanging die. Many of these processes require further development and are not mature, leading to low yields and higher development costs.

EMBODIMENTS OF THE PRESENT DISCLOSURE

Described herein are interconnect architectures for high bandwidth optical interconnects, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Figure 1A:
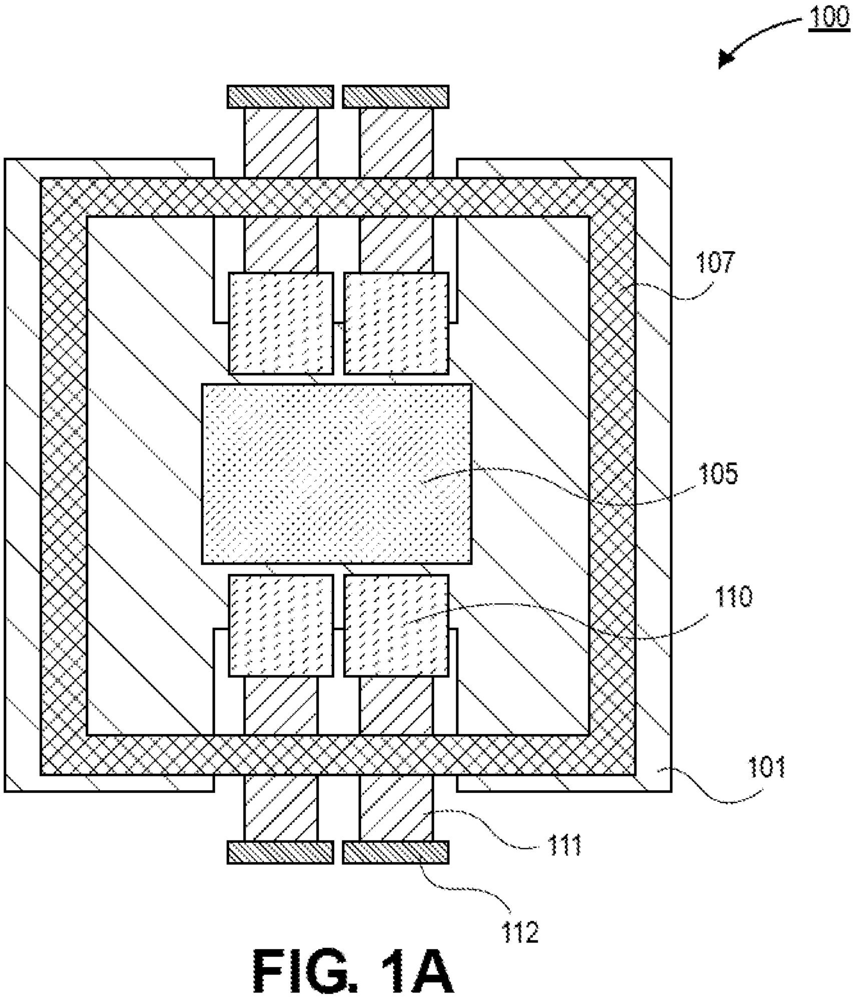
FIG. 1A is a plan view illustration of an optical package with photonics dies that are overhanging an edge of the package substrate.
Figure 1B:
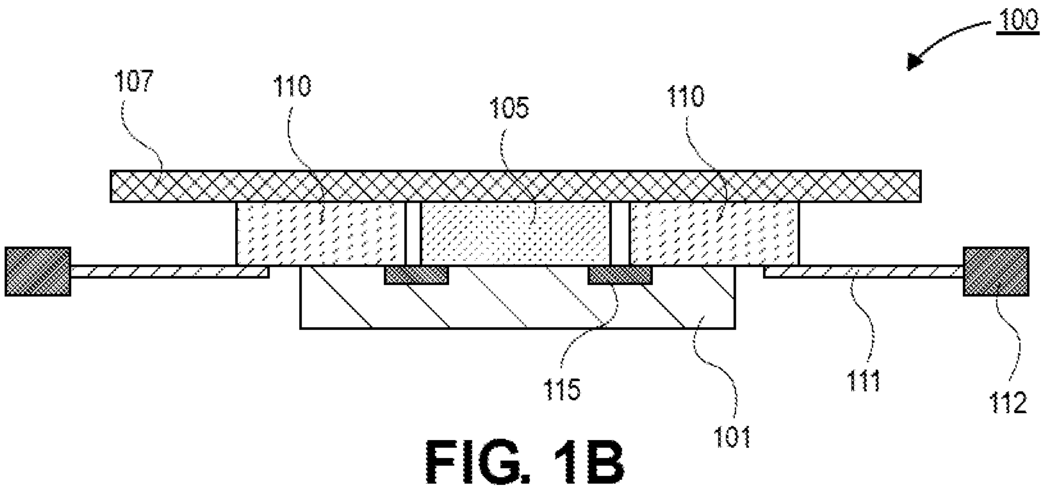
FIG. 1B is a cross-sectional illustration of the optical package in FIG. 1A.

FIG. 1A is a plan view illustration of an optical package 100 to provide context for embodiments disclosed herein. As shown, a package substrate 101 provides a base onto which a compute die 105 and a plurality of photonics dies 110 are placed. The compute die 105 is coupled to the photonics die 110 by a bridge 115. As shown, the package substrate 101 comprises an H-shaped footprint in order to allow the photonics dies 110 to overhang an edge of the package substrate 101. In FIG. 1A an integrated heat spreader (IHS) 107 is shown around a perimeter of the package substrate 101. It is to be appreciated that only the legs of the IHS 107 are shown in order to not block the view of the underlying compute die 105 and photonics dies 110. As shown in the cross-sectional view in FIG. 1B the optical interconnects 111 and connectors 112 are attached to the photonics dies 110 by V-grooves from below. As noted above, the need for V-groove attachment leads to increased assembly complexity.

Accordingly, embodiments disclosed herein provide embedded optical waveguides that transmit the optical signal from the photonics die to a fiber optic connector that can be adhered in place on the side of the package. As such, there is no need for an overhanging die. This allows for standard packaging process operations to be used to assemble the optical package. The optical waveguide has a first end below the photonics die and a second end at the edge of the package substrate. An angled surface at the first end of the optical waveguide reflects light to optically couple the optical waveguide to the bottom surface of the photonics die. As such, there is no need for a V-groove in the photonics die to optically couple a fiber to the photonics die.

In some embodiments, the optical waveguide is a discrete waveguide that is embedded in the package substrate. In other embodiments, the optical waveguide may be fabricated during the process flow of the manufacture of the package substrate. Various packaging architectures may be used to fabricate the embedded optical waveguide. In one embodiment, the optical waveguide is embedded in an organic package substrate. In other embodiments, the optical waveguide is embedded in a glass patch that is provided above an organic package substrate. In yet another embodiment, the optical waveguide is embedded in a package substrate that comprises a plurality of glass layers.

Figure 2A:
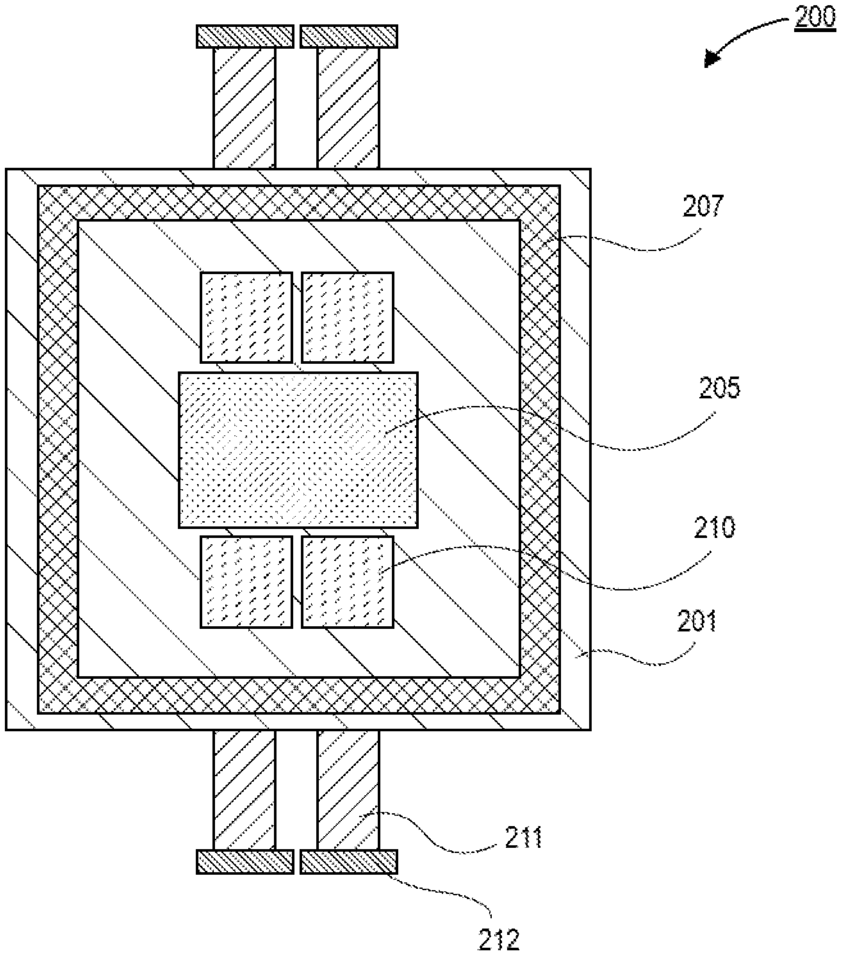
FIG. 2A is a plan view illustration of an optical package with photonics dies entirely within a footprint of the package substrate, in accordance with an embodiment.

Referring now to FIG. 2A, a plan view illustration of an optical package 200 is shown, in accordance with an embodiment. In an embodiment, the optical package 200 comprises a package substrate 201. The package substrate 201 may be an organic package substrate. The package substrate 201 may have a substantially rectangular footprint.

The rectangular footprint is possible since the photonics dies 210 do not need to overhang the package substrate 201, as is shown in the H-shaped package substrate 101 in FIG. 1A. In an embodiment, a compute die 205 is also provided over the package substrate 201. The compute die 205 may be any suitable die, such as a processor, a graphics processor, a system on a chip (SoC), or the like. In an embodiment, the photonics die 210 allows for the conversion between optical signals and electrical signals. In the illustrated embodiment, four photonics dies 210 are shown, but it is to be appreciated that any number of photonics dies 210 may be included in the optical package 200.

In an embodiment, an IHS 207 surrounds a perimeter of the package substrate 201. The IHS 207 in FIG. 2A is shown without a lid in order to not obscure the underlying components. However, it is to be appreciated that a lid portion of the IHS 207 is thermally coupled to the top surfaces of the compute die 205 and the photonics dies 210.

In an embodiment, optical interconnects 211 and connectors 212 are coupled to the package substrate 201. The optical interconnects 211 may include a fiber optic cable in some embodiments. The optical interconnects 211 are attached to edge surfaces of the package substrate 201. As will be illustrated in greater detail below, the optical interconnects 211 are attached to the package substrate 201 so as to be optically coupled to optical waveguides (not shown in FIG. 2A) that are embedded in the package substrate 201.

Figure 2B:
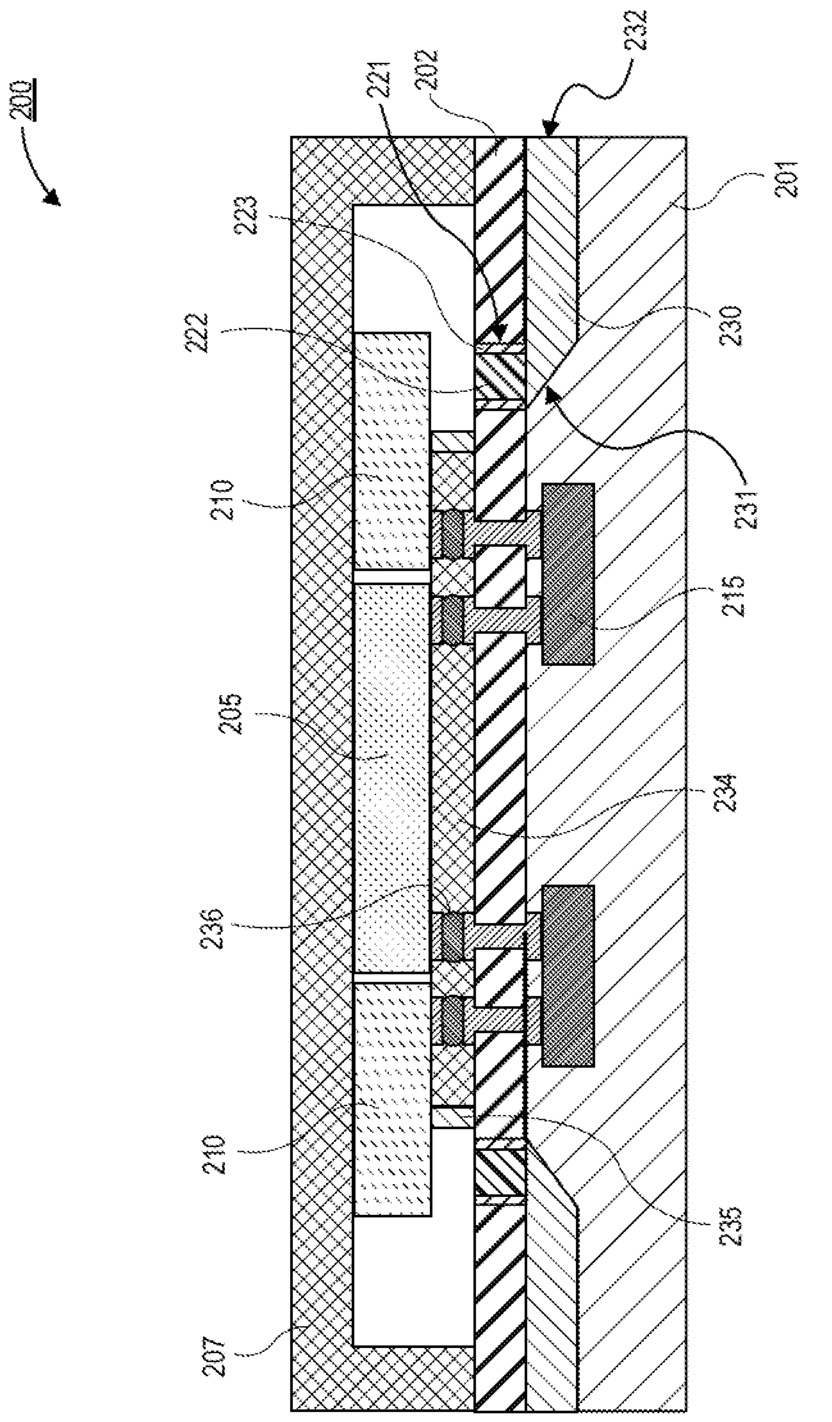
FIG. 2B is a cross-sectional illustration of the optical package with an optical waveguide embedded in the package substrate, in accordance with an embodiment.

Referring now to FIG. 2B, a cross-sectional illustration of the optical package 200 is shown, in accordance with an embodiment. In an embodiment, the optical package comprises a package substrate 201 with a solder resist layer 202 over the package substrate 201. As shown, the compute die 205 and the photonics dies 210 are connected to the package substrate by interconnects 236. The interconnects 236 may be any suitable interconnect architecture, such as first level interconnect (FLI) architectures. In an embodiment, the photonics dies 210 are entirely within a footprint of the package substrate 201. That is, the photonics dies 210 do not have any overhang over an edge of the package substrate 201. In an embodiment, the interconnects 236 may be surrounded by an underfill 234.

In an embodiment, the photonics dies 210 are communicatively coupled to the compute die 205 by embedded bridges 215. The bridges 215 are embedded in the package substrate 201 and are electrically coupled to the interconnects 236 by conductive features that pass through the solder resist layer 202. As shown in FIG. 2B, an IHS 207 is attached to the package substrate 201 and is thermally coupled to the top surfaces of the compute die 205 and the photonics dies 210. For example, a thermal interface material (TIM) (not shown) may be provided between the IHS 207 and the top surfaces of the compute die 205 and the photonics dies 210.

In an embodiment, an optical waveguide 230 is embedded in the package substrate 201. As used herein, an embedded component may refer to a component that is at least partially surrounded by another layer. For example, the bottom surface and sidewall surfaces of the optical waveguide 230 are covered by the package substrate 201. In some embodiments an embedded feature may have a top surface that is not covered. For example, the top surface of the optical waveguide 230 is covered by the solder resist 202 instead of the package substrate 201. Despite not having a top surface covered by the package substrate 201, the optical waveguide 230 may still be referred to as being embedded in the package substrate 201.

In an embodiment, the optical waveguide 230 may have a first end 231 and a second end 232. The first end 231 may be located below the photonics die 210. That is, the first end 231 is below the photonics die 210 and within a footprint of the photonics die 210. The second end 232 may be located at an edge of the package substrate 201. An optical interconnect (not shown) may be attached to the edge of the package substrate 201 to be optically coupled to the optical waveguide 230.

In an embodiment, the first end 231 of the optical waveguide 230 may have an angled surface. The angled surface allows for optical signals to be coupled to the bottom surface of the photonics die 210. Particularly, an optical path 221 through the solder resist layer 202 may be provided over the first end 231 to allow for optical signals to pass through the solder resist 202. In an embodiment, the optical path 221 may comprise a cladding layer 223 and a high refractive index core 222. In an embodiment, the underfill 234 may be prevented from being dispensed over the optical path 221. For example, a dam 235 or the like may prevent underfill 234 from being dispensed between the optical path 221 and the underside of the photonics dies 210.

In an embodiment, the optical waveguide 230 may comprise a high refractive index material. For example, the optical waveguide 230 may comprise a polyimide, a polyalkane, a polycyanate, a diazobenzoquinone, a metal-centered (e.g., Fe, Al, Cu, etc.) dendrite polymer, a high-density polycarbonate, a polythiphene, a polythiadiazole, or a polysulfone. In an embodiment, the optical waveguide 230 directly contacts the package substrate 201. That is, in some embodiments, there is no cladding layer over the optical waveguide 230. However, in other embodiments, a cladding layer (not shown) may be provided between the optical waveguide 230 and the package substrate 201. For example, a silver cladding layer or the like may be used to improve transmission efficiency.

Figure 2C:
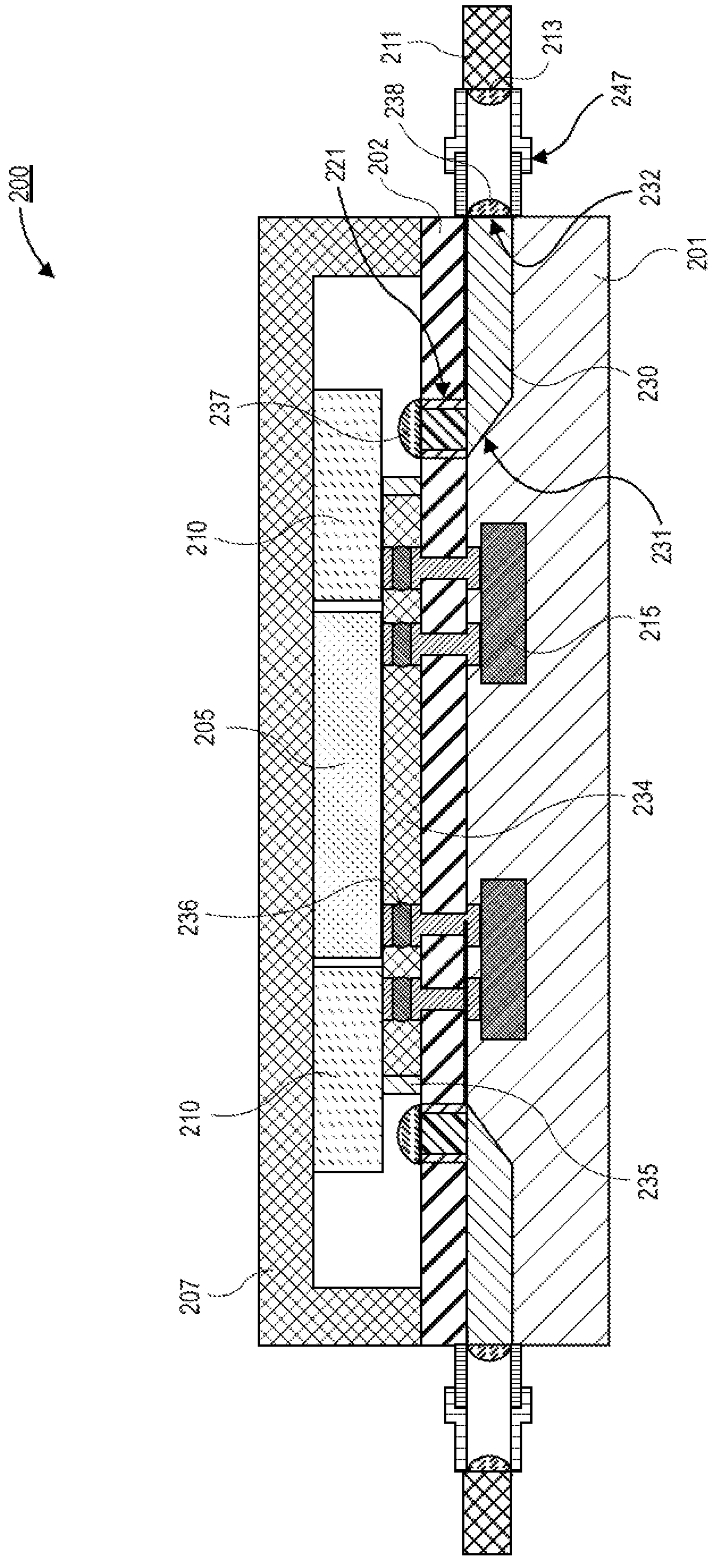
FIG. 2C is a cross-sectional illustration of the optical package with lenses over the embedded optical waveguide, in accordance with an embodiment.

Referring now to FIG. 2C, a cross-sectional illustration of an optical package 200 is shown, in accordance with an additional embodiment. The optical package 200 may be substantially similar to the optical package 200 in FIG. 2B, with the exception of the addition of various lenses 237, 238, 213. A lens 237 may be provided over the optical path 221 in order to improve the efficiency of signal transmission between the photonics die 210 and the optical path 221. Additionally a connector 247 with lenses 238 and 213 may be used to improve optical coupling between the second end 232 of the optical waveguide 230 and the optical interconnect 211 (such as a fiber optic cable).

Figure 2D:
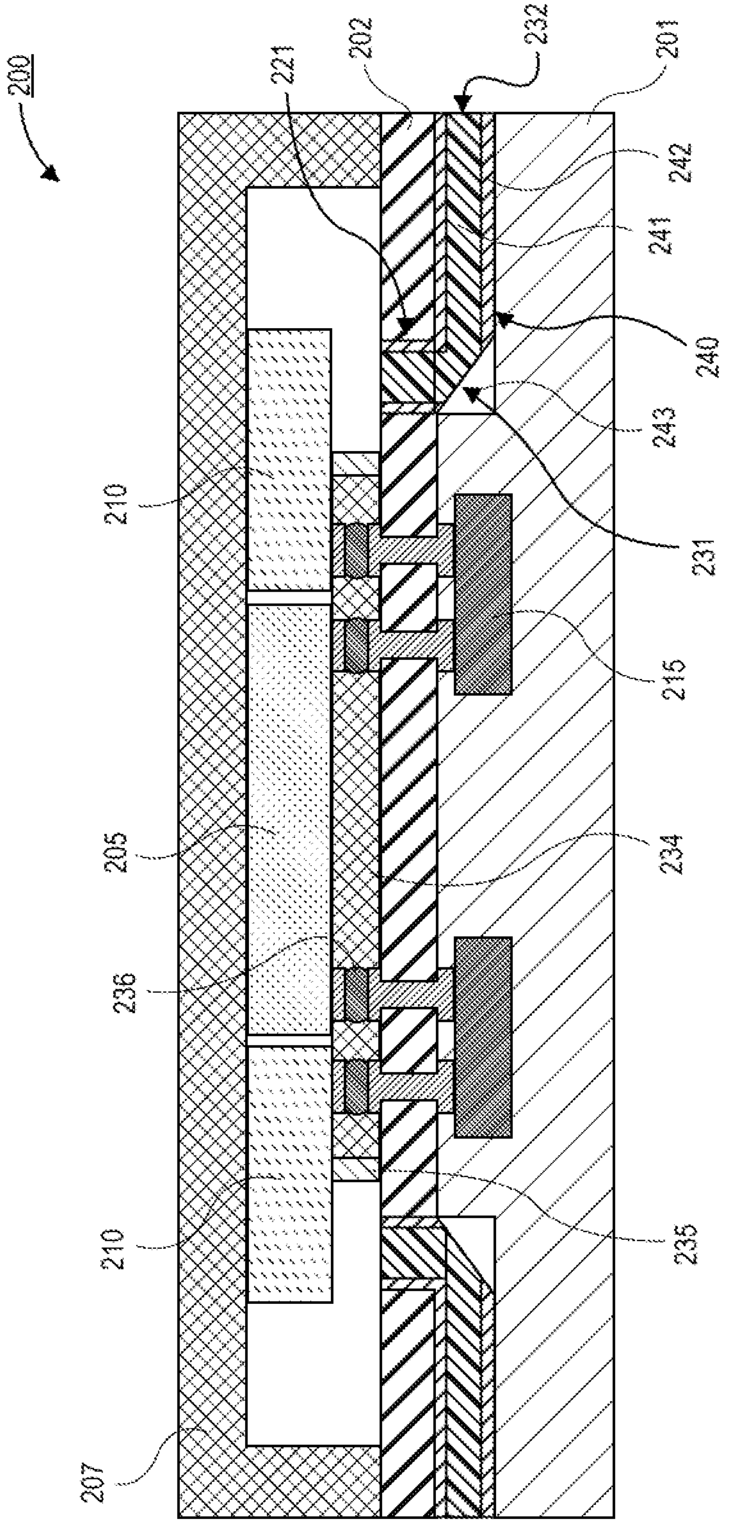
FIG. 2D is a cross-sectional illustration of the optical package with a discrete optical waveguide embedded in the package substrate, in accordance with an embodiment.

Referring now to FIG. 2D, a cross-sectional illustration of an optical package 200 is shown, in accordance with an additional embodiment. The optical package 200 in FIG. 2D may be substantially similar to the optical package 200 in FIG. 2B, with the exception of there being a discrete optical waveguide 240 that is embedded in the package substrate 201. Whereas the optical waveguide 230 may be fabricated during assembly of the optical package 200, the optical waveguide 240 may be a discrete optical waveguide that is inserted into the package substrate 201 using a pick and place process. The optical waveguide 240 may be manufactured to have improved optical transmission. For example, the optical waveguide 240 may comprise a cladding 242 and a core 241. Additionally a mirror 243 may be provided at the first end 231 in order to improve transmission efficiency between the optical path 221 and the optical waveguide 240. The mirror 243 may also be inserted into the package substrate 201 with a pick and place process. In some embodiments, the mirror 243 may be integrated with the optical waveguide 240 so that only a single pick and place process is needed.

Referring now to FIGS. 3A-3H, a series of cross-sectional illustrations depicting a process for assembling an optical package is shown, in accordance with an embodiment. The assembly in FIGS. 3A-3H may result in the formation of an optical package substantially similar to the optical package 200 in FIG. 2B.

Figure 3A:
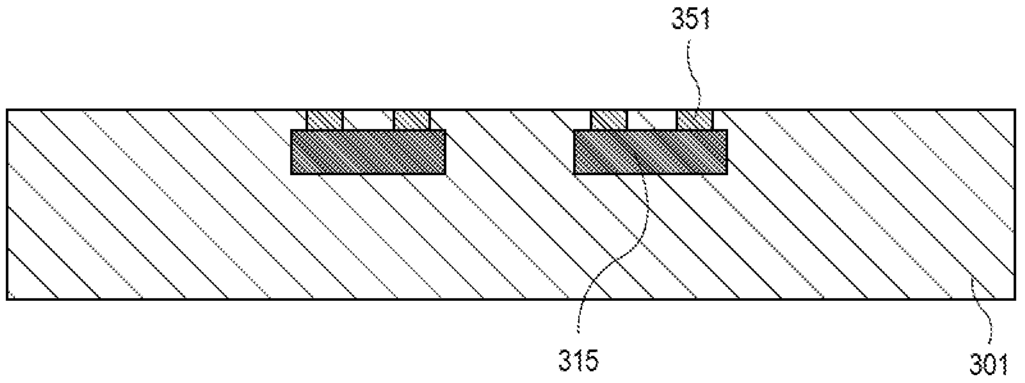
FIGS. 3A-3H are cross-sectional illustrations of a process for forming an optical package with an embedded optical waveguide, in accordance with an embodiment.

Referring now to FIG. 3A, a cross-sectional illustration of a package substrate 301 is shown, in accordance with an embodiment. The package substrate 301 may comprise a plurality of laminated organic layers. Conductive routing within the package substrate 301 is omitted for clarity. However, it is to be appreciated that conductive routing (e.g., traces, vias, pads, etc.) may be provided within the package substrate 301 in order to provide electrical coupling between a top surface of the package substrate 301 and a bottom surface of the package substrate 301.

In an embodiment bridges 315 may be embedded in the package substrate 301. The bridges 315 may allow for high density routing that will be used to electrically couple the compute die to the photonics dies in subsequent processing operations. In a particular embodiment, the bridges 315 are silicon bridges with fine line/spacing conductive routing provided thereon. Vias 351 may provide an electrical connection between the top surface of the package substrate 301 and the bridges 315.

Figure 3B:
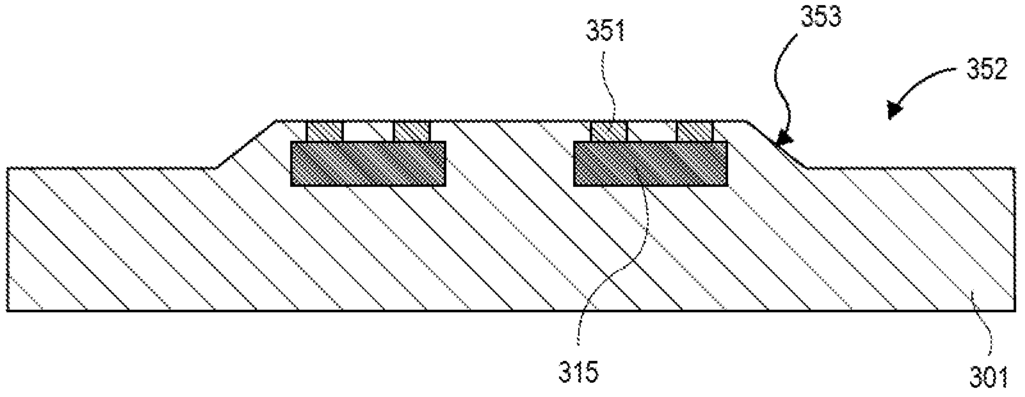

Referring now to FIG. 3B, a cross-sectional illustration of the package substrate 301 after trenches 352 are formed into the top surface of the package substrate is shown, in accordance with an embodiment. The trenches 352 may extend to an edge of the package substrate 301. In an embodiment, the trenches 352 may be formed with a laser drilling process, such as a $CO_2$ laser drilling process. In some embodiments, a dry etch is done to clean the trench 352 surfaces. For example, a fluorine-based gas used in a dry etching process may be sufficient to provide a smooth surface that minimizes light scattering. For example, the surfaces of the trenches 352 may have a surface roughness that is approximately 70 nm RMS or less.

In an embodiment, the trench 352 may comprise a tapered end 353. The tapered end 353 may have an angle of approximately 45°. The tapered end 353 can therefore be used to reflect light perpendicular to the direction of the channel 352 in order to couple optical signals to an overlying photonics die that is provided in a subsequent processing operation.

Figure 3C:
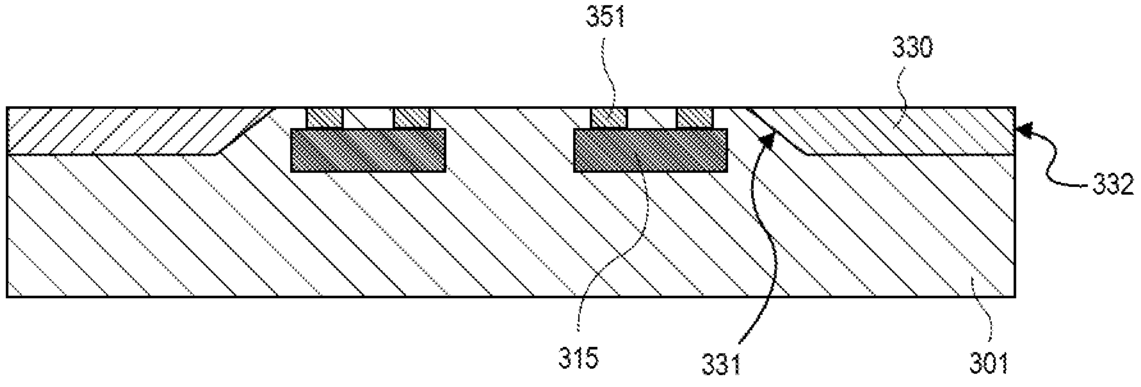

Referring now to FIG. 3C, a cross-sectional illustration of the package substrate 301 after an optical waveguide 330 is formed in the trench 352 is shown, in accordance with an embodiment. The optical waveguide 330 may comprise a high refractive index material. The high refractive index material may be a paste printable epoxy resin which can be filled into the trench 352, such as, but not limited to, a polyimide, a polyalkane, a polycyanate, a diazobenzoquinone, a metal-centered (e.g., iron, aluminum, copper, etc.) dendrite polymer, a high-density polycarbonate, a polythiphene, a polythiadiazole, or a polysulfone.

In the illustrated embodiment, the optical waveguide 330 is directly contacting the package substrate 301. Such embodiments are enabled by the ability to form smooth surfaces in the trench 352 (e.g., 70 nm RMS or lower). However, in some embodiments, a thin cladding layer (such as silver) may be formed over the surfaces of the trench 352 to provide improved efficiency. For example, an immersion silver plating process may be used prior to the deposition of the epoxy resin to form the optical waveguide 330. Such embodiments may enable total internal reflectance over a wide range of wavelengths, which results in a very low attenuation. After deposition of the optical waveguide 330, the surface of the package substrate 301 is polished to remove excess resin outside of the trench 352. In an embodiment, the optical waveguide 330 comprises a first end 331 and a second end 332. The first end 331 abuts the tapered surface 353, and the second end 332 is at the edge of the package substrate 301.

Figure 3D:
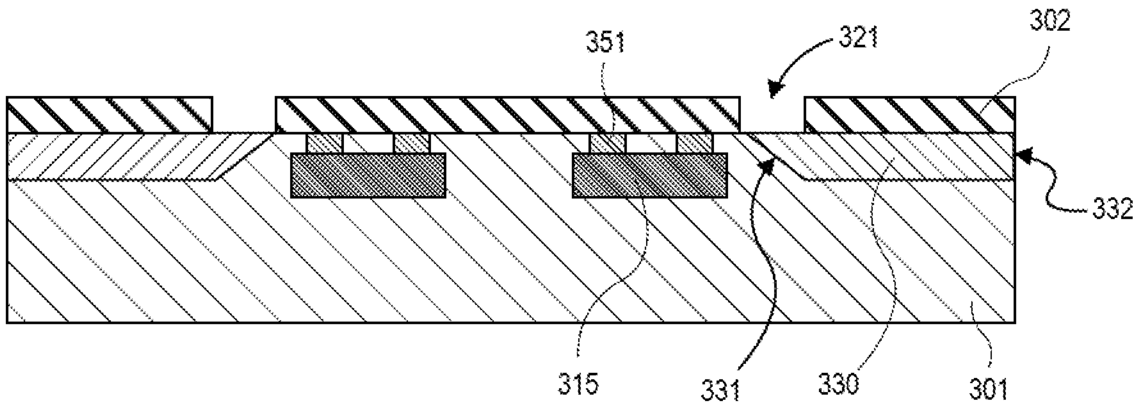

Referring now to FIG. 3D, a cross-sectional illustration of the package substrate 301 after a solder resist layer 302 is provided above a top surface of the package substrate 301 is shown, in accordance with an embodiment. In an embodiment, optical paths 321 are provided through the solder resist layer 302. The optical paths 321 may be formed with a laser drilling process. In an embodiment, the optical paths 321 are provided over the first end 331 of the optical waveguides 330.

Figure 3E:
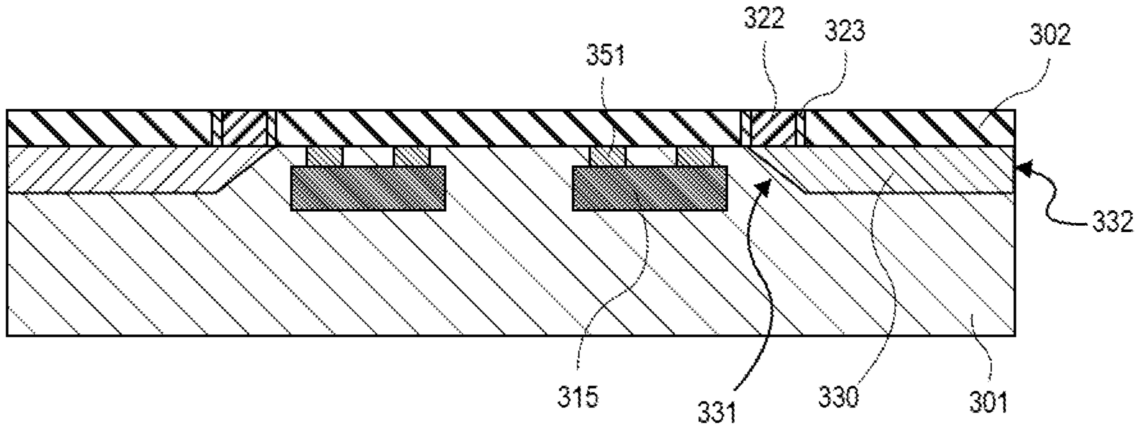

Referring now to FIG. 3E, a cross-sectional illustration of the package substrate 301 after the optical paths 321 are filled is shown, in accordance with an embodiment. In an embodiment, the optical paths 321 are filled with a cladding 323 and core 322. The cladding 323 ensure low roughness (e.g., 70 nm RMS or lower) and reduce light scattering and allows for low optical signal losses. In an embodiment, cladding 323 and core 322 materials may include, but are not limited to, low-density versions of polyimides, polyalkanes, polycyanates, polyacrylates, polysiloxanes, and thin metal layers, such as copper, silver, gold, and aluminum. Additionally, polyperflurocarbon polymers may be used as the cladding 323.

Figure 3F:
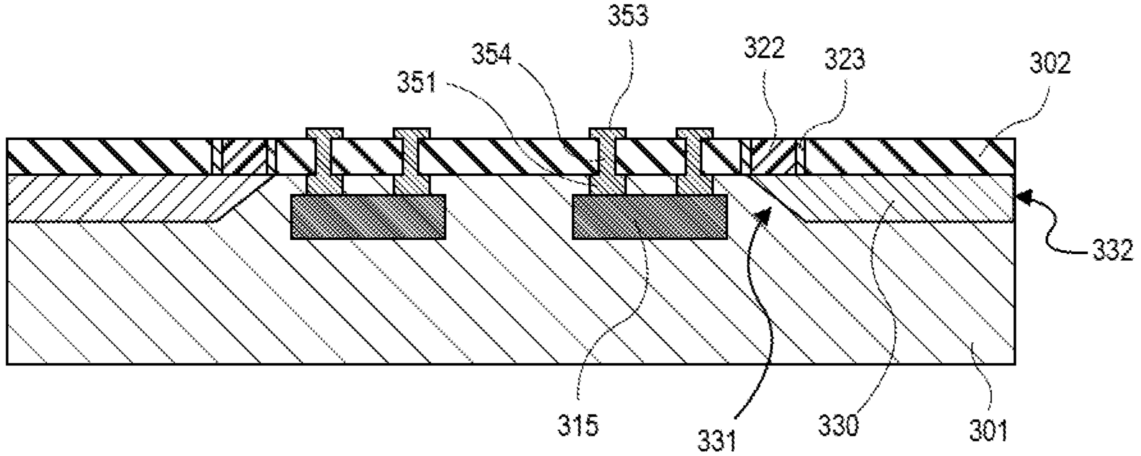

Referring now to FIG. 3F, a cross-sectional illustration of the package substrate 301 after bridge 315 interconnects are formed is shown, in accordance with an embodiment. In an embodiment, the interconnects may comprise a via 354 through the solder resist layer 302 and a pad 353 over the solder resist layer 302. In an embodiment, the optical paths 321 are protected by a mask layer (not shown) during the formation of the bridge 315 interconnects.

Figure 3G:
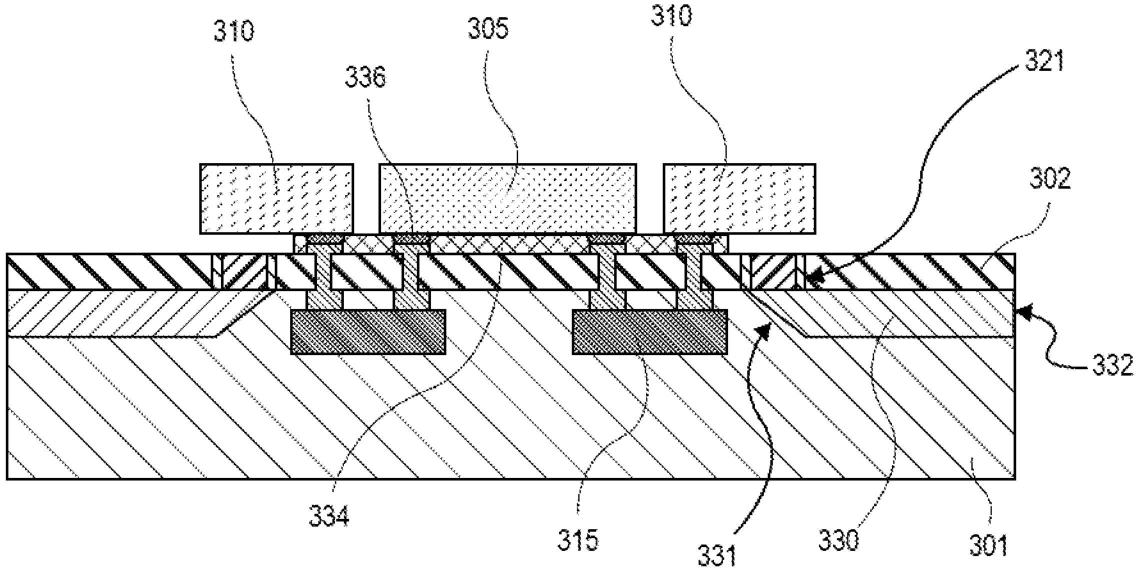

Referring now to FIG. 3G, a cross-sectional illustration of the package substrate 301 after a compute die 305 and photonics dies 310 are attached to the package substrate 301 is shown, in accordance with an embodiment. In an embodiment, the compute die 305 and the photonics dies 310 are attached by FLIs 336. In an embodiment, an underfill 334 is dispensed around the interconnects 336. A dam or the like may prevent the flow of underfill 334 over the optical paths 321. As such, an optical path from the edge of the package substrate 301 to a bottom surface of the photonics die 310 is provided.

As shown, the photonics dies 310 are entirely within a footprint of the underlying package substrate 301. That is, the photonics dies 310 do not include any overhang over an edge of the package substrate 301. In an embodiment, the photonics dies 310 may be positioned so that the first end 331 of the optical waveguide 330 is below (and within a footprint of) the photonics dies 310. As such, the optical paths 321 provide a vertical path from the optical waveguide 330 to the bottom surface of the photonics dies 310. As such, the photonics dies 310 do not require a V-groove connection.

Figure 3H:
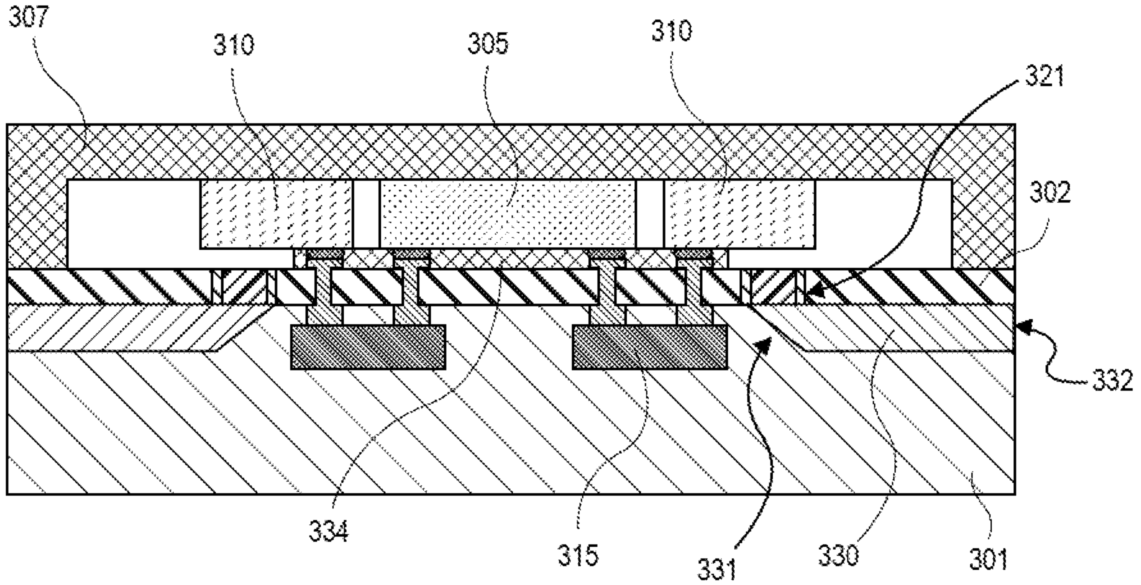

Referring now to FIG. 3H, a cross-sectional illustration of the package substrate 301 after an IHS 307 is attached to the package substrate 301 is shown, in accordance with an embodiment. The IHS 307 may be thermally coupled to the compute die 305 and the photonics dies 310 by a TIM (not shown) in some embodiments. In an embodiment, an optical engine (not shown) may then be coupled to the second end 332 of the optical waveguide 330 using an optical connector from the side of the package substrate 301.

Figure 4A:
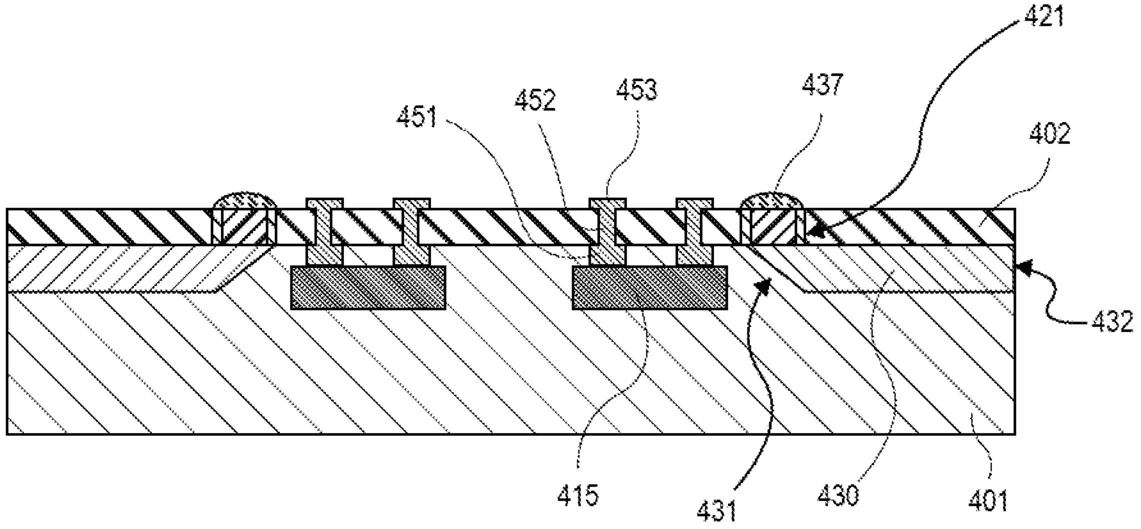
FIGS. 4A-4C are cross-sectional illustrations of a process for forming an optical package with lenses over an embedded optical waveguide, in accordance with an embodiment.
Figure 4B:
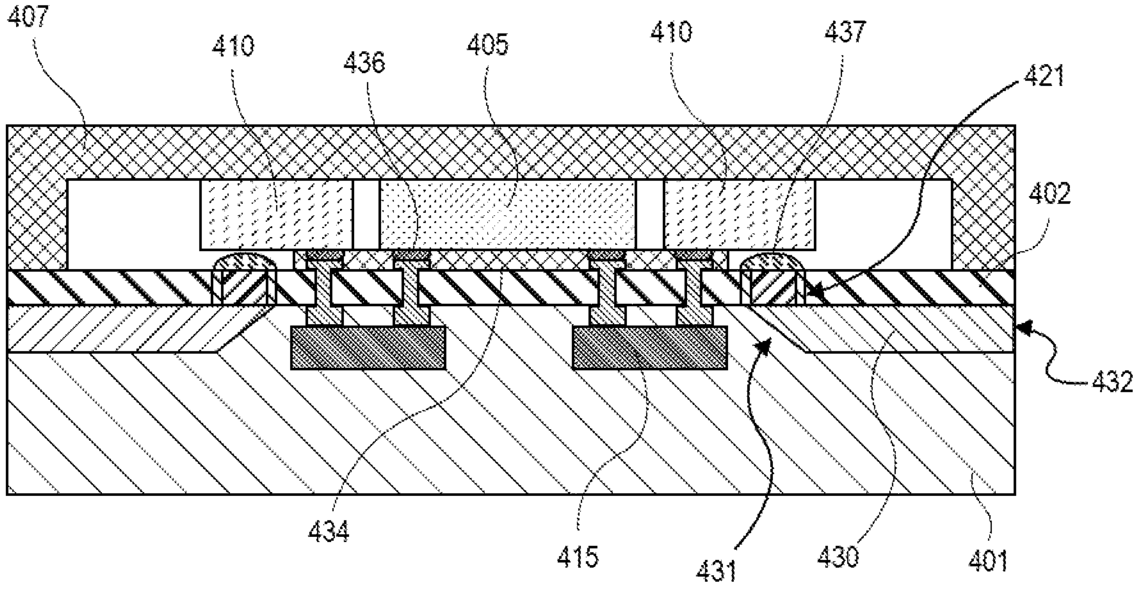
Figure 4C:
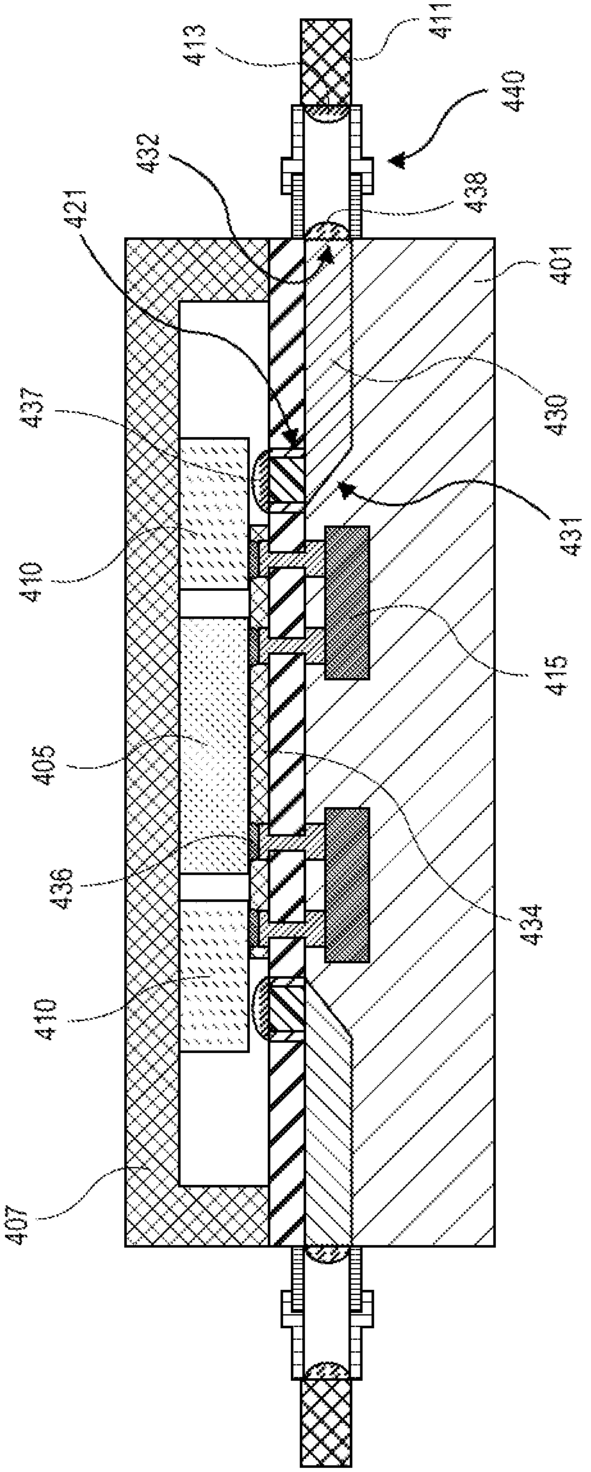

Referring now to FIGS. 4A-4C, cross-sectional illustrations of operations for forming an optical package similar to the optical package 200 in FIG. 2C are shown, in accordance with an embodiment. The processing of the optical package before FIG. 4A is substantially similar to the processing operations illustrated in FIGS. 3A-3F.

Referring now to FIG. 4A, a cross-sectional illustration of a package substrate 401 is shown, in accordance with an embodiment. The package substrate 401 may comprise embedded bridges 415 that are coupled to a top surface of a solder resist layer 402 by pad 451, via 452 and pad 453. In an embodiment, embedded optical waveguides 430 with a first end 431 and a second end 432 are provided in the package substrate 401. An optical path 421 is provided over the first end 431 of the optical waveguide 430.

As shown in FIG. 4A, a lens 437 may be provided over the optical path 421 of each optical waveguide 430. The lens 437 may be placed with a pick and place process. The use of a lens 437 over the optical path 421 may improve optical coupling with the photonics die that will subsequently be placed over the first end of the optical waveguide 430.

Referring now to FIG. 4B, a cross-sectional illustration of the package substrate 401 after the compute die 405, photonics dies 410, and the IHS 407 are attached to the package substrate 401 is shown, in accordance with an embodiment. As shown, the compute die 405 and the photonics dies 410 may be attached to the pads 453 by FLI 436. The FLIs 436 may be surrounded by an underfill 434. The underfill 434 may be blocked from flowing over the lenses 437 by a dam (not shown) or the like. As such, an optical path from the edge of the package substrate 401 to a bottom surface of the photonics die 410 is provided.

Referring now to FIG. 4C, a cross-sectional illustration of the package substrate 401 after a connector 440 is attached to an edge of the package substrate 401 over the second end 432 of the optical waveguide 430 is shown, in accordance with an embodiment. In an embodiment, the connector 440 may include a lens 438 directly over the second end 432 of the optical waveguide 430. A second lens 413 may be provided adjacent to the optical interconnect 411, such as a fiber optic cable. As such, optical transmission efficiency into the optical waveguide 430 is improved.

Referring now to FIGS. 5A-5D, a series of cross-sectional illustrations depicting a process for forming an optical package with discrete embedded optical waveguides are shown, in accordance with an embodiment. The resulting optical package in FIG. 5D may be substantially similar to the optical package 200 in FIG. 2D.

Figure 5A:
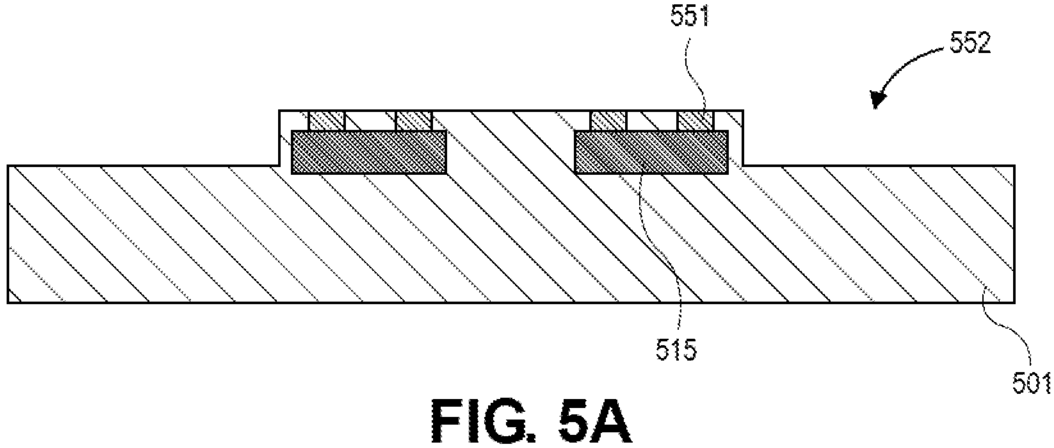
FIGS. 5A-5D are cross-sectional illustrations of a process for forming an optical package with a discrete optical waveguide embedded in a package substrate, in accordance with an embodiment.

Referring now to FIG. 5A, a cross-sectional illustration of a package substrate 501 is shown, in accordance with an embodiment. In an embodiment, the package substrate 501 comprises bridges 515 embedded in the package substrate 501. Vias 551 provide an electrical connection from the bridges 515 to a top surface of the package substrate 501. In an embodiment, trenches 552 are formed into a top surface of the package substrate 501. The trenches 552 each extend to an edge of the package substrate 501. In an embodiment, the trenches 552 may comprise a uniform depth across their length. That is, there may not be a tapered end similar to the embodiments described above. However, in other embodiments, a tapered end of the trench 552 may be included.

Figure 5B:
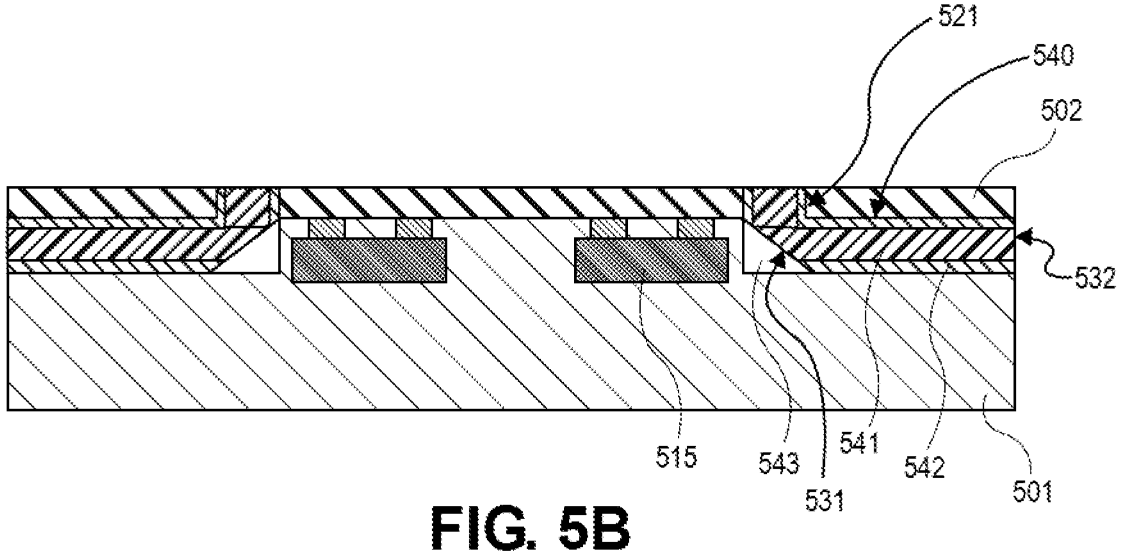

Referring now to FIG. 5B, a cross-sectional illustration of the package substrate 501 after installation of discrete optical waveguides 540 and a solder resist layer 502 with optical paths 521 are formed is shown, in accordance with an embodiment. In an embodiment, the discrete optical waveguides 540 may be inserted into the trenches 552 with a pick and place tool or the like. Since the optical waveguides 540 are discrete components, they may be optimized to provide enhanced optical transmission efficiency. For example, the discrete optical waveguides 540 may comprise a cladding 542 and a core 541. In an embodiment, a first end 531 may be tapered and adjacent to a mirror 543. The mirror 543 may also be a discrete component that is pick and placed into the trench 552. In other embodiments, the mirror 543 may be formed as part of the discrete optical waveguide 540. A second end 532 of the discrete optical waveguide 540 may be at the edge of the package substrate 501. Since a pick and place process is used, paste printing of the high refractive index material and polishing may be omitted, which simplifies processing operations. In an embodiment, an optical path 521 may be provided through the solder resist layer 502 over the first end 531 of the discrete optical waveguide 540. The optical path 521 may comprise a cladding and a core, similar to embodiments described above.

Figure 5C:
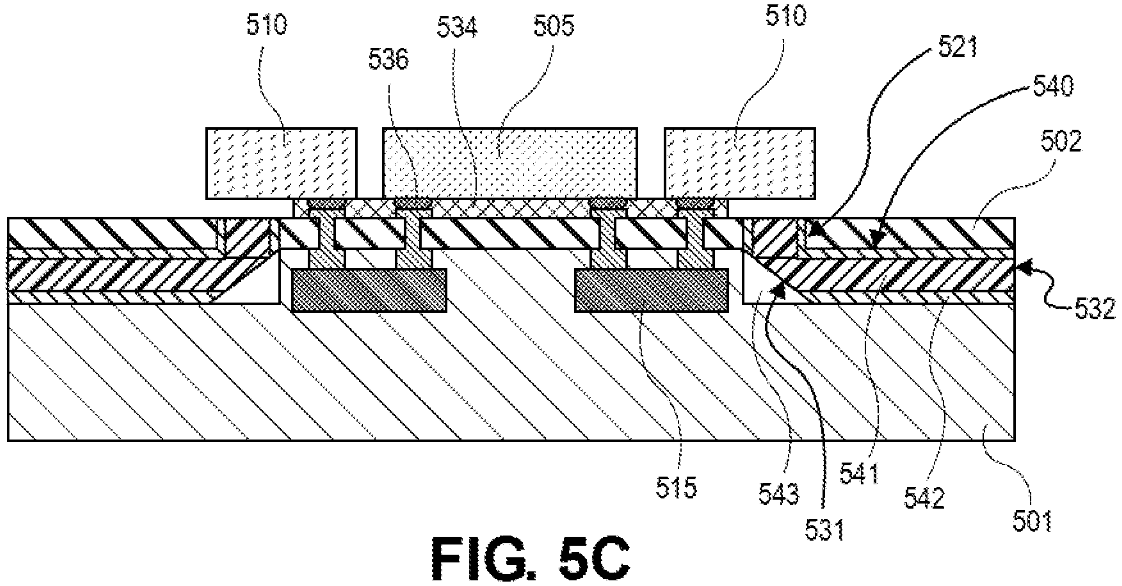

Referring now to FIG. 5C, a cross-sectional illustration of the package substrate 501 after a compute die 505 and photonics dies 510 are attached to the package substrate 501 is shown, in accordance with an embodiment. In an embodiment, the compute die 505 and the photonics dies 510 may be attached with FLIs 536 that are surrounded by an underfill 534. The underfill 534 may be prevented from flowing over the optical paths 521 by a dam (not shown) or the like. As shown, the first end 531 of the discrete optical waveguide 540 is below (and within the footprint) of the photonics die 510. As such, an optical path from the edge of the package substrate 501 to a bottom surface of the photonics die 510 is provided.

Figure 5D:
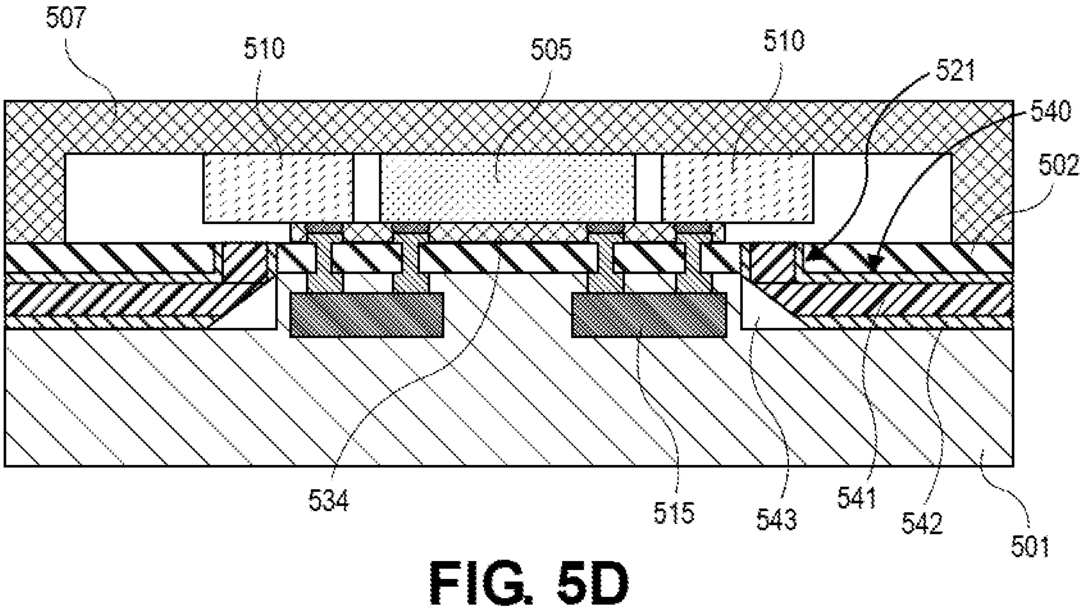

Referring now to FIG. 5D, a cross-sectional illustration of the package substrate 501 after an IHS 507 is attached to the package substrate 501 is shown, in accordance with an embodiment. In an embodiment, the IHS 507 may be thermally coupled to the compute die 505 and the photonics dies 510 by a TIM (not shown). While FIGS. 5A-5D illustrate a process that does not rely on additional lenses (similar to the embodiment shown in FIGS. 4A-4C), it is to be appreciated that similar lenses may optionally be included to improve efficiency in the embodiments described with respect to FIGS. 5A-5D.

In the embodiments described above, the optical waveguide is embedded in an organic package substrate. It is to be appreciated that organic substrates may be susceptible to warpage or other deformation. As such, the alignment of the optical paths with the photonics die may not be as accurate as desired. Accordingly, additional embodiments disclosed herein include the use of more dimensionally stable substrates in order to provide improved alignment. In an embodiment, the optical waveguide is embedded in a glass material. In a particular embodiment, the optical waveguide is provided in a glass patch that is coupled to an organic package substrate, or the optical waveguide is provided in a package substrate that is comprised of a plurality of laminated glass layers.

Referring now to FIGS. 6A-8F, a series of illustrations depicting optical packages that utilize a glass patch are shown. The use of a glass patch provides dimensional stability while still allowing for routing to be provided over conventional organic package substrates. As such, the complexity of manufacture is simplified, while still allowing for the dimensional stability provided by a glass substrate.

Figure 6A:
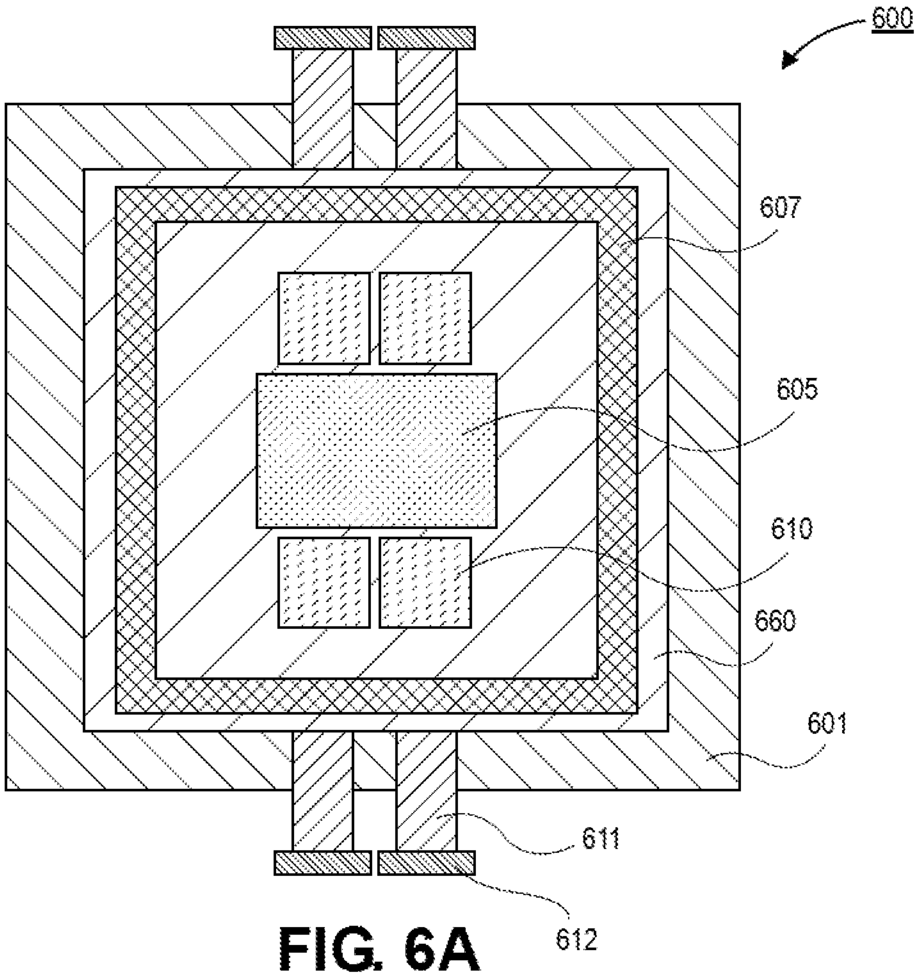
FIG. 6A is a plan view illustration of an optical package with a glass patch over a package substrate, in accordance with an embodiment.

Referring now to FIG. 6A, a plan view illustration of an optical package 600 is shown in accordance with an additional embodiment. The optical package 600 comprises a package substrate 601. The package substrate 601 may be a traditional organic package substrate 601. A glass patch 660 is provided over the package substrate 601. In an embodiment, a compute die 605 and photonics dies 610 are attached to the glass patch 660. In an embodiment, an IHS 607 is attached to the glass patch 660 and surrounds the compute die 605 and the photonics die 610. The lid portion of the IHS 607 is omitted in order to not obscure the underlying features.

In an embodiment, the optical interconnects 611 and the connectors 612 are coupled to an edge of the glass patch 660. The optical interconnects 611 are attached over embedded optical waveguides (not visible in FIG. 6A) that provide optical coupling to the photonics dies 610.

Figure 6B:
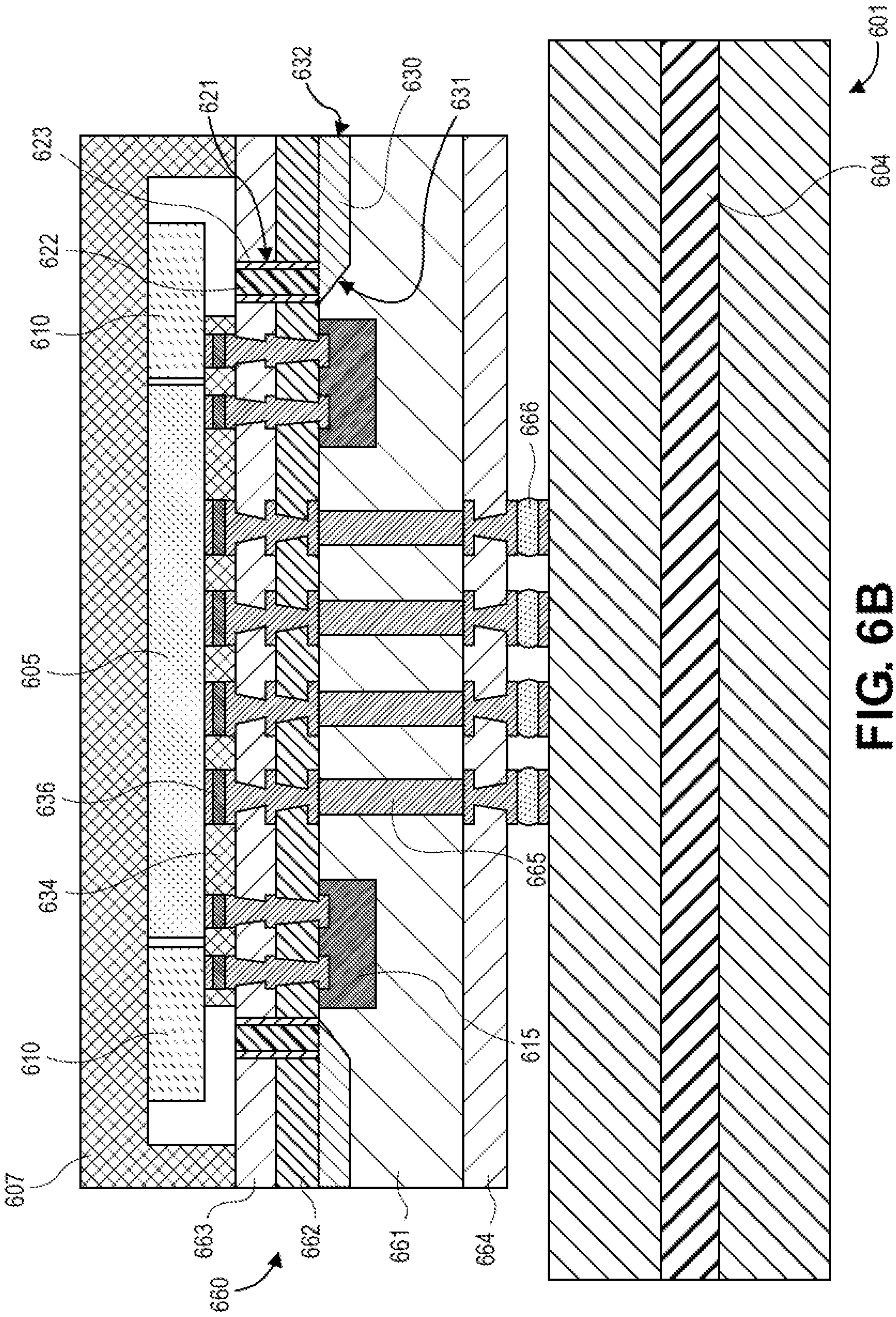
FIG. 6B is a cross-sectional illustration of the optical package in FIG. 6A with an embedded bridge providing the electrical connection between a compute die and a photonics die, in accordance with an embodiment.

Referring now to FIG. 6B, a cross-sectional illustration of the optical package 600 is shown, in accordance with an embodiment. In an embodiment, the optical package 600 comprises a package substrate 601. The package substrate 601 may be an organic package substrate 601 with a core 604. Though, in some embodiments, the package substrate 601 may be coreless. Conductive routing in the package substrate 601 and the core 604 is omitted in order to not obscure embodiments disclosed herein. However, it is to be appreciated that the package substrate 601 comprises conductive features, such as pads, traces, vias, and the like.

The package substrate 601 may be electrically coupled to the glass patch 660 by interconnects 666. In an embodiment, the interconnects 666 may be coupled to through glass vias (TGVs) 665 by vias through a solder resist 664. The TGVs 665 provide an electrical connection from a bottom side of the glass substrate 661 to a top side of the glass substrate 661. In the illustrated embodiment the TGVs 665 are shown with substantially vertical sidewalls. However, it is to be appreciated that the TGVs 665 may have tapered sidewalls to form an hourglass-like shape in some embodiments. In an embodiment, the top side of the TGVs 665 may be electrically coupled to the compute die 605 by routing through a buildup layer 662 and a solder resist layer 663. FLIs 636 may provide a portion of the connection between the compute die 605 and the TGVs 665. In an embodiment, the FLIs 636 may be surrounded by an underfill 634.

In an embodiment, the compute die 605 may be communicatively coupled to the photonics dies 610 by bridges 615 embedded in the glass substrate 661. The bridges 615 may be silicon, for example. The bridges 615 allow for high-density routing of electrical signals between the photonics dies 610 and the compute die 605. In an embodiment, vias, pads, traces, and the like may provide electrical routing through the buildup layer 662 and the solder resist layer 663.

In an embodiment, the photonics dies 610 may be entirely within a footprint of the glass patch 660. That is, the photonics dies 610 may not overhang an edge of the glass patch 660. Additionally, the photonics dies 610 may be disposed over a first end 631 of an embedded optical waveguide 630. An optical path 621 through the buildup layer 662 and the solder resist layer 663 may provide optical coupling between the optical waveguide 630 and the photonics dies 610. In an embodiment, the optical path 621 may comprise a cladding 623 and a core 622 to improve optical transmission efficiency.

In an embodiment, each of the optical waveguides 630 have a first end 631 that is below (and within the footprint) of one of the photonics dies 610, and a second end 632 that is at the edge of the glass substrate 661. The first end 631 of the optical waveguide 630 may be tapered in order to reflect optical signals to/from the photonics die 610 positioned above. For example, the tapered first end 631 may have an angle of approximately 45°. In an embodiment, the optical waveguide 630 may be a high index of refraction material, such as, but not limited to a polyimide, a polyalkane, a polycyanate, a diazobenzoquinone, a metal-centered (e.g., iron, aluminum, copper, etc.) dendrite polymer, a high-density polycarbonate, a polythiphene, a polythiadiazole, or a polysulfone. In the illustrated embodiment, the optical waveguide 630 is directly contacting the glass substrate 661. In other embodiments, a cladding layer (e.g., silver) may be provide between the glass substrate 661 and the optical waveguide 630.

In an embodiment, the optical waveguide 630 is considered to be embedded in the glass substrate 661. That is, the glass substrate 661 may surround a bottom surface and sidewall surfaces (except the second end 632) of the optical waveguide 630. The top surface of the optical waveguide 630 may be at least partially covered by the dielectric buildup layer 662 and/or the solder resist layer 663.

In the illustrated embodiment, the optical coupling from the optical path 621 to the photonics die 610 is provided through air. Since the distance is small, the optical losses are minimal. However, in some embodiments a lens may be provided over the optical path 621, similar to the embodiment shown in FIG. 2C. Similar to the embodiment in FIG. 2C, a connector with a lens may also be provided at the second end 632 of the optical waveguide 630. In an embodiment, a dam (not shown) may be used to prevent the underfill 634 from spreading over the optical path 621. In an embodiment, the optical waveguide 630 may also be replaced with a discrete optical waveguide similar to the embodiment in FIG. 2D.

Figure 6C:
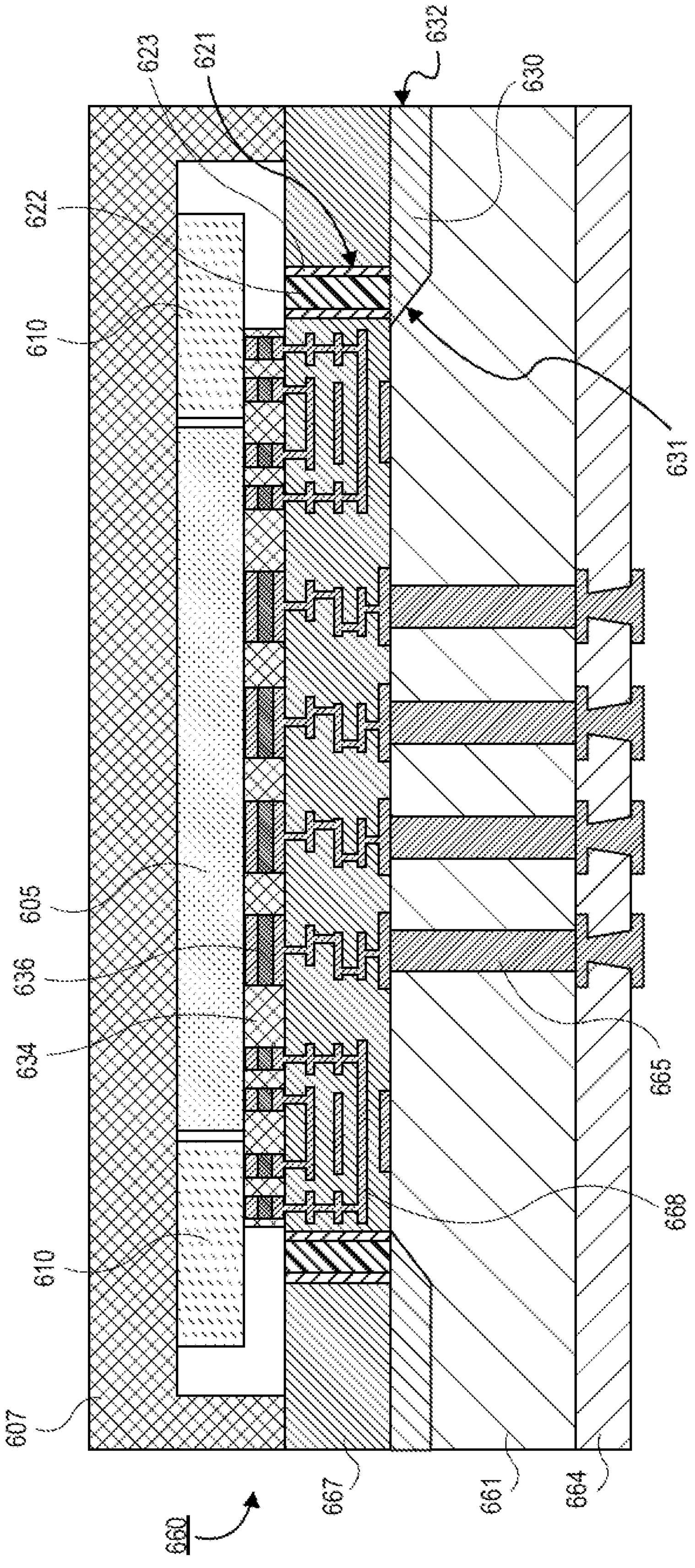
FIG. 6C is a cross-sectional illustration of the optical package in FIG. 6A with a high-density routing layer to provide the electrical connection between a compute die and a photonics die, in accordance with an embodiment.

Referring now to FIG. 6C, a cross-sectional illustration of a glass patch 660 is shown in accordance with an additional embodiment. The glass patch 660 may be coupled to an organic package substrate (not shown) similar to the embodiment shown in FIG. 6B. Furthermore, the glass patch 660 in FIG. 6C may be substantially similar to the glass patch 660 in FIG. 6B, with the exception of the interconnect scheme between the photonics dies 610 and the compute die 605. Instead of using embedded bridge architectures, the embodiment in FIG. 6C utilizes a high-density routing stack 667. Due to the use of a glass substrate 661, it is possible to provide high-density routing using various patterning operations, such as lithographically defined vias and/or zero misalignment via architectures. Particularly, it is noted that in some embodiments, the vias in the high-density routing stack 667 have substantially vertical sidewalls as is typical of lithographically defined routing architectures. In a particular embodiment, electrical features 668 provide the routing between the photonics die 610 and the compute die 605.

Figure 7A:
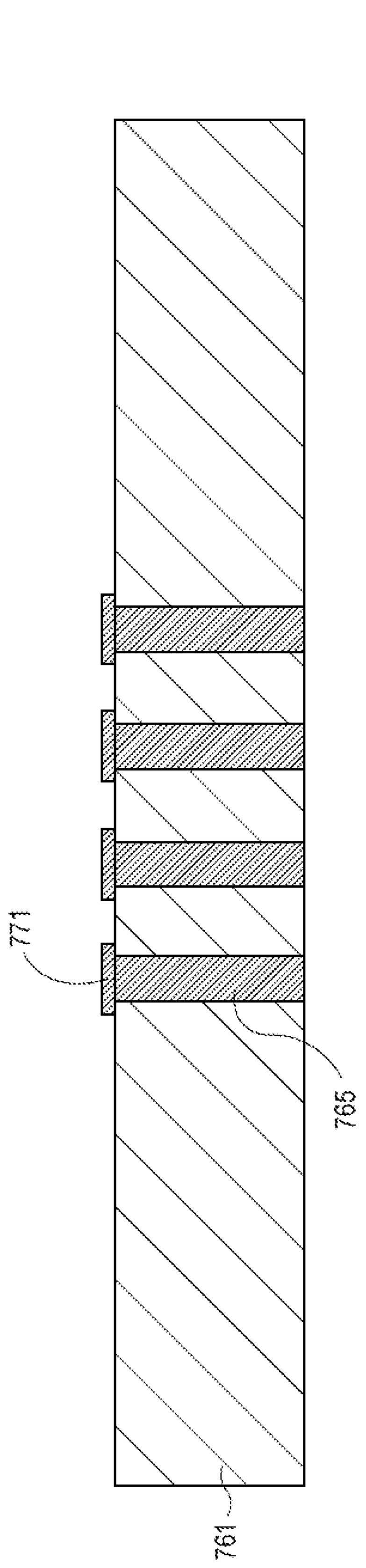
FIGS. 7A-7I are cross-sectional illustrations of a process for forming a glass patch for an optical package with embedded bridges and embedded optical waveguides, in accordance with an embodiment.

Referring now to FIGS. 7A-7I, a series of cross-sectional illustrations depicting a process for forming a glass patch similar to the glass patch 660 in FIG. 6B is shown, in accordance with an embodiment. Referring now to FIG. 7A, a cross-sectional illustration of a glass substrate 761 is shown, in accordance with an embodiment. In an embodiment, the glass substrate 761 may have a thickness between approximately 300 μm and approximately 600 μm. While illustrated as a single unit, it is to be appreciated that a panel with multiple units may be formed substantially in parallel.

TGVs 765 may be provided through an entire thickness of the glass substrate 761. The TGVs 765 may have an hourglass-shaped profile, or sidewalls with a vertical profile, as shown in FIG. 7A. The TGVs 765 may be formed with a laser drilling process or an etching process, and are subsequently filled (e.g., with copper) using a standard plating process. Excess copper may be removed with a polishing process. In an embodiment pads 771 are then provided over the TGVs 765 on a top side surface of the glass substrate 761 using a standard semi-additive process (SAP).

Figure 7B:
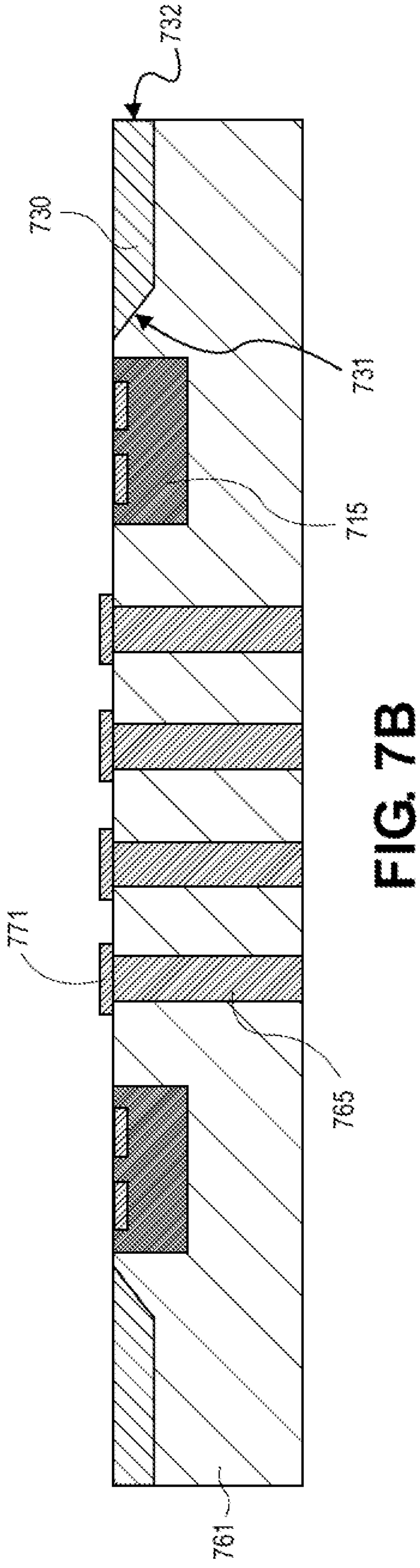

Referring now to FIG. 7B, a cross-sectional illustration of the glass substrate 761 after bridges 715 are embedded and an optical waveguide 730 is formed is shown, in accordance with an embodiment. In an embodiment, cavities for the bridges 715 are formed with a laser and/or etching process, and the bridges 715 are set in the cavities. In an embodiment, trenches for the optical waveguides 730 may be formed using laser drilling, a dry etch, and/or a wet etch process. The process to form the trenches for the optical waveguides 730 may result in the formation of a sloped first end 731. The sloped first end 731 may be approximately 45° in order to allow for optical signals from above to be routed out the second end 732 of the optical waveguide 730. In an alternative embodiment, a mirror with an angled surface may be placed at the first end 731 of the optical waveguide 730. In an embodiment, the processing used to form the channel for the optical waveguide 730 may result in smooth surfaces (e.g., approximately 70 nm RMS or less) that minimizes optical scattering and improves transmission efficiency.

In an embodiment, the optical waveguide 730 may be formed with a paste printable high index of refraction epoxy resin, such as, but not limited to a polyimide, a polyalkane, a polycyanate, a diazobenzoquinone, a metal-centered (e.g., iron, aluminum, copper, etc.) dendrite polymer, a high-density polycarbonate, a polythiphene, a polythiadiazole, or a polysulfone. In an embodiment, the optical waveguide 730 is in direct contact with the glass substrate 761. However, in other embodiments, a cladding layer (e.g., silver) may be provided between the optical waveguide 730 and the glass substrate 761 to further improve efficiency by enabling total internal reflectance over a wide range of wavelengths, which results in very low attenuation. In some embodiments, a polishing process may be needed to remove excess resin from the top surface of the glass substrate 761. In such instances, the pads 771 may be formed after the polishing process. Additionally, while an in-built optical waveguide 730 is described in FIG. 7B, it is to be appreciated that a prefabricated optical waveguide 730 may also be inserted into the trench formed in the glass substrate 761. Such embodiments may allow for even higher efficiencies to be obtained.

Figure 7C:
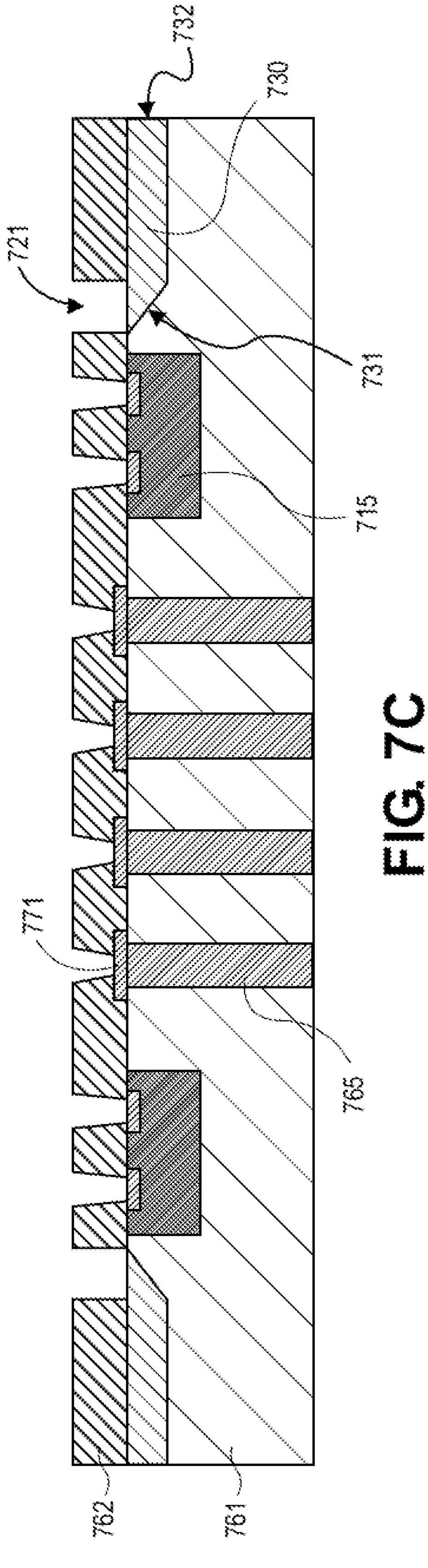

Referring now to FIG. 7C, a cross-sectional illustration of the glass substrate 761 after a buildup layer 762 is disposed over the glass substrate 761 and is patterned is shown, in accordance with an embodiment. In an embodiment, the buildup layer 762 may be any typical build-up material with desired properties (e.g., low loss, low dielectric constant, etc.). The buildup layer 762 may be disposed over the glass substrate 761 with a lamination process or the like. In an embodiment, the buildup layer 762 is patterned with a laser drilling process. The laser drilling process may include a first laser (e.g., $CO_2$ laser) to form the larger vias to the pads 771, and a second layer (e.g., UV laser) to form the smaller vias to the pads of the bridge 715. Optical paths 721 may also be drilled over the first end 731 of the optical waveguide 730. While shown as being substantially vertical, it is to be appreciated that the sidewalls of the optical paths 721 may be tapered, as is common with laser drilled openings.

Figure 7D:
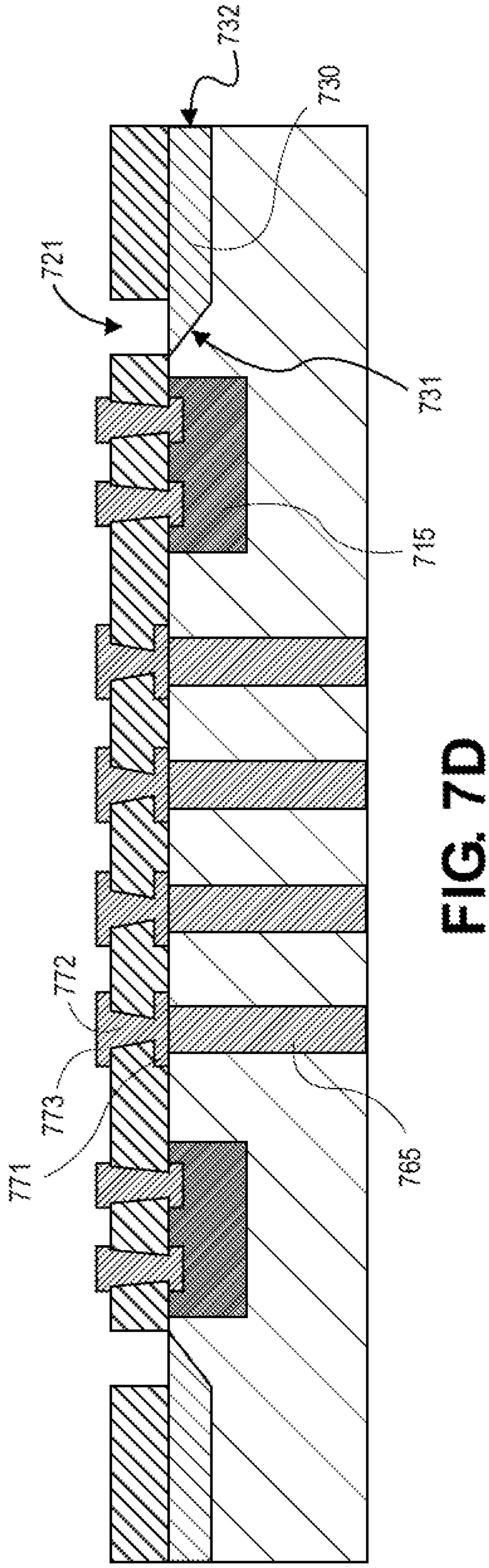

Referring now to FIG. 7D, a cross-sectional illustration of the glass substrate 761 after the via openings are filled with conductive material is shown, in accordance with an embodiment. In an embodiment, the conductive vias 772 and pads 773 may be formed with typical plating processes. For example, a seed layer may be formed followed by plating and patterning to define the pads 773. A flash etch may then remove residual portions of the seed layer. In an embodiment, the optical paths 721 may be covered by a mask layer during formation of the vias 772 and pads 773. Alternatively, the optical paths 721 may be drilled after the formation of the vias 772 and pads 773.

Figure 7E:
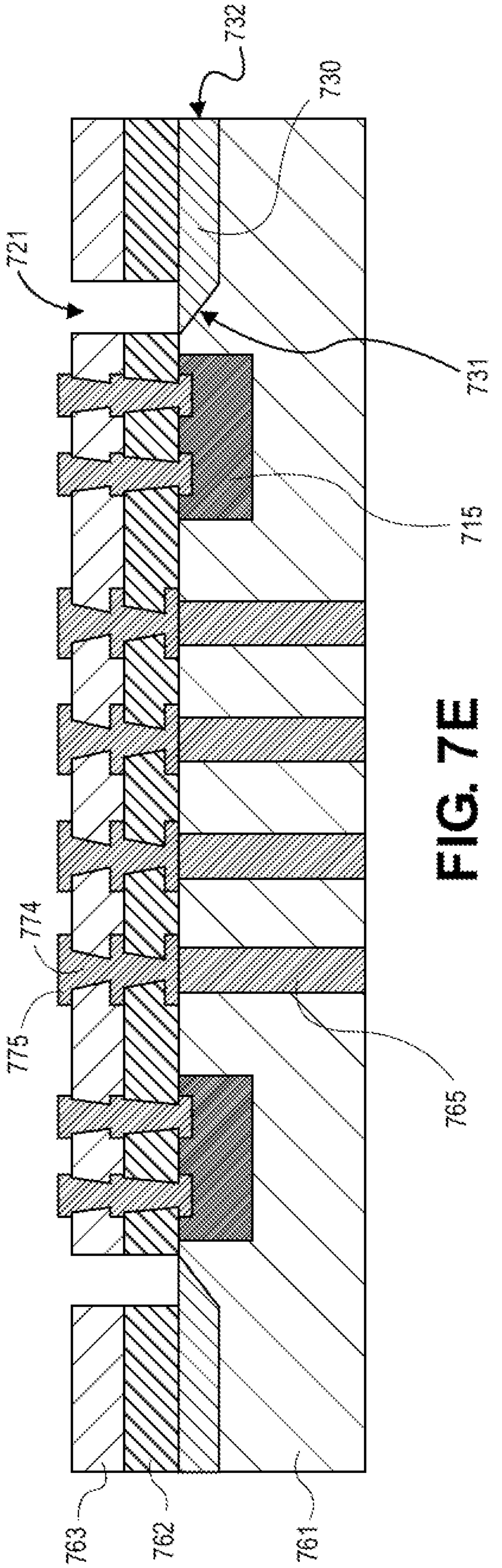

Referring now to FIG. 7E, a cross-sectional illustration of the glass substrate 761 after a solder resist layer 763 is formed over the buildup layer 762 is shown, in accordance with an embodiment. In an embodiment, the solder resist layer 763 may be patterned and plated with conductive material in order to form vias 774 and pads 775. The patterning and plating processes may be standard processes used in electronic packaging applications.

In an embodiment, after the formation of the vias 774 and the pads 775, the optical path 721 may be formed through the solder resist layer 763. In the illustrated embodiment, the optical path 721 is shown as having openings in the buildup layer 762 and the solder resist layer 763 that are perfectly aligned with each other. However, there may be some misalignment between portions of the optical path 721 in the different layers. Additionally, the sidewalls of the optical path 721 in each of the buildup layer 762 and the solder resist layer 763 may have tapered sidewalls common in laser drilled holes.

Figure 7F:
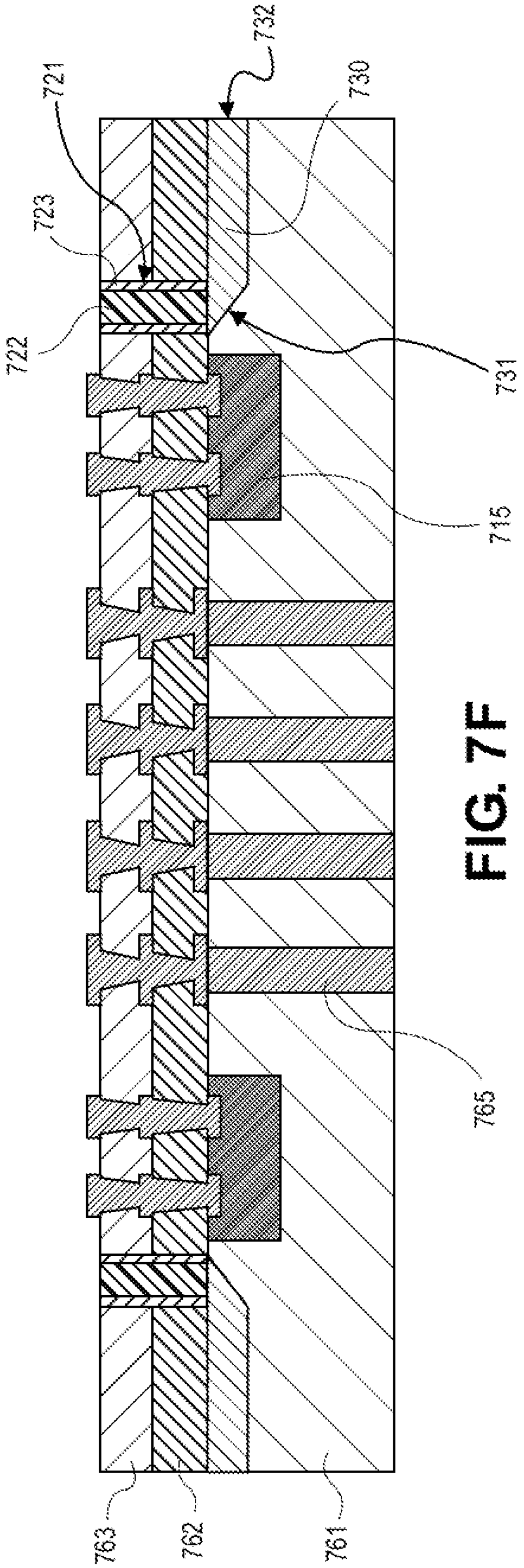

Referring now to FIG. 7F, a cross-sectional illustration of the glass substrate after the optical path 721 is filled is shown, in accordance with an embodiment. In an embodiment, the optical path 721 is filled with a resin using a dispenser. The resin may be any traditional epoxy resin with an inorganic filler. The filled resin is subsequently drilled, filled with a cladding 723 and a core 722, cured and polished. Cladding 723 ensures low roughness (e.g., approximately 70 nm RMS or lower) that minimizes light scattering. Standard cladding 723 and core 722 materials may be used, such as, but not limited to low-density versions of polyimides, polyalkanes, polycyanates, polyacrylates, polysiloxanes, and thin metal layers, such as copper, silver, gold, and aluminum. Additionally, polyperflurocarbon polymers may be used as the cladding 723.

Figure 7G:
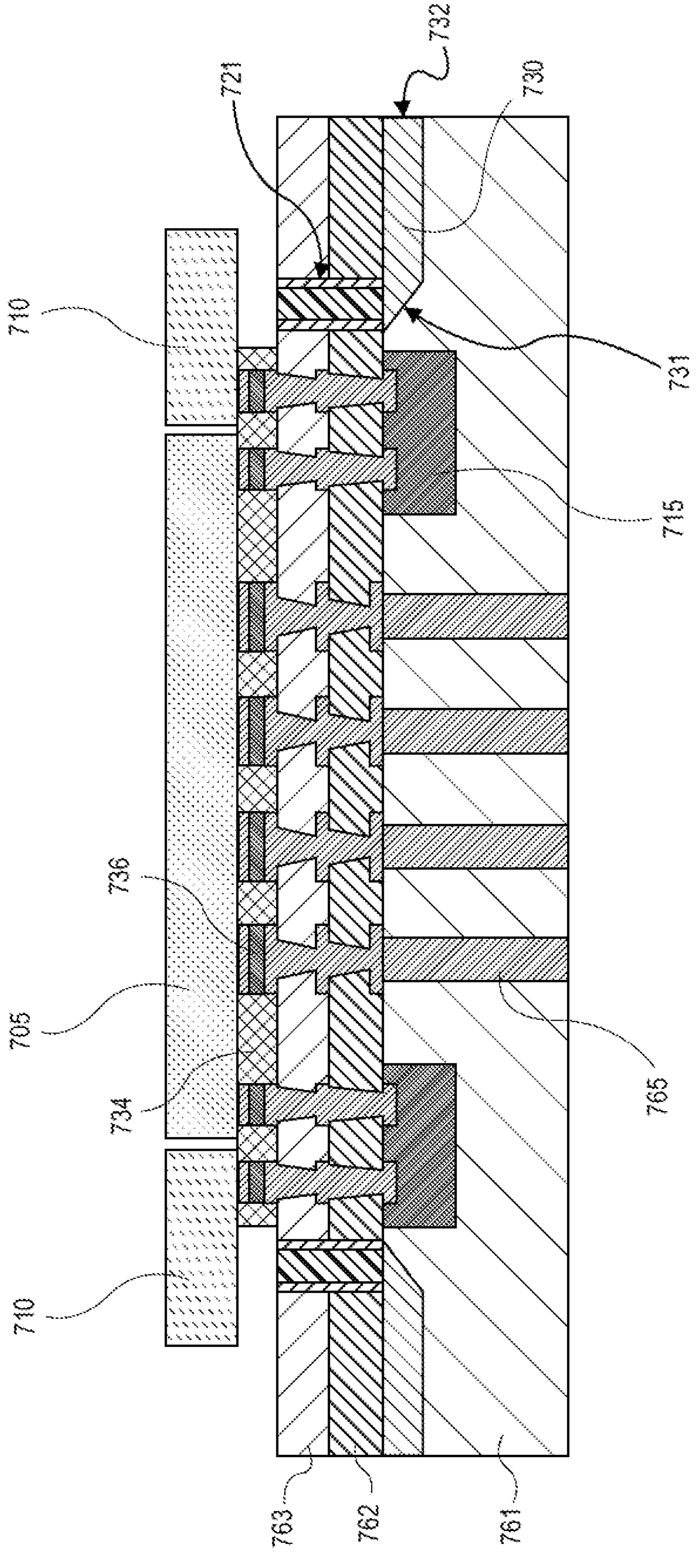

Referring now to FIG. 7G, a cross-sectional illustration of the glass substrate 761 after a compute die 705 and photonics dies 710 are attached is shown, in accordance with an embodiment. In an embodiment, the compute die 705 and the photonics dies 710 may be attached using FLIs 736. In an embodiment, the FLIs 736 are surrounded by an underfill 734. The underfill 734 may be prevented from flowing over the optical paths 721 by a dam (not shown) or the like. The photonics dies 710 may be communicatively coupled to the compute die 705 by the embedded bridges 715 and the overlying conductive features in the buildup layer 762 and the solder resist layer 763.

As shown in FIG. 7G, the photonics dies 710 are entirely within a footprint of the glass substrate 761. That is, there is no portion of the photonics dies 710 that extend past and overhang an edge of the glass substrate 761. Instead, optical coupling from the photonics dies 710 to the edge of the glass substrate 761 is provided by the optical paths 721 and the optical waveguides 730.

Figure 7H:
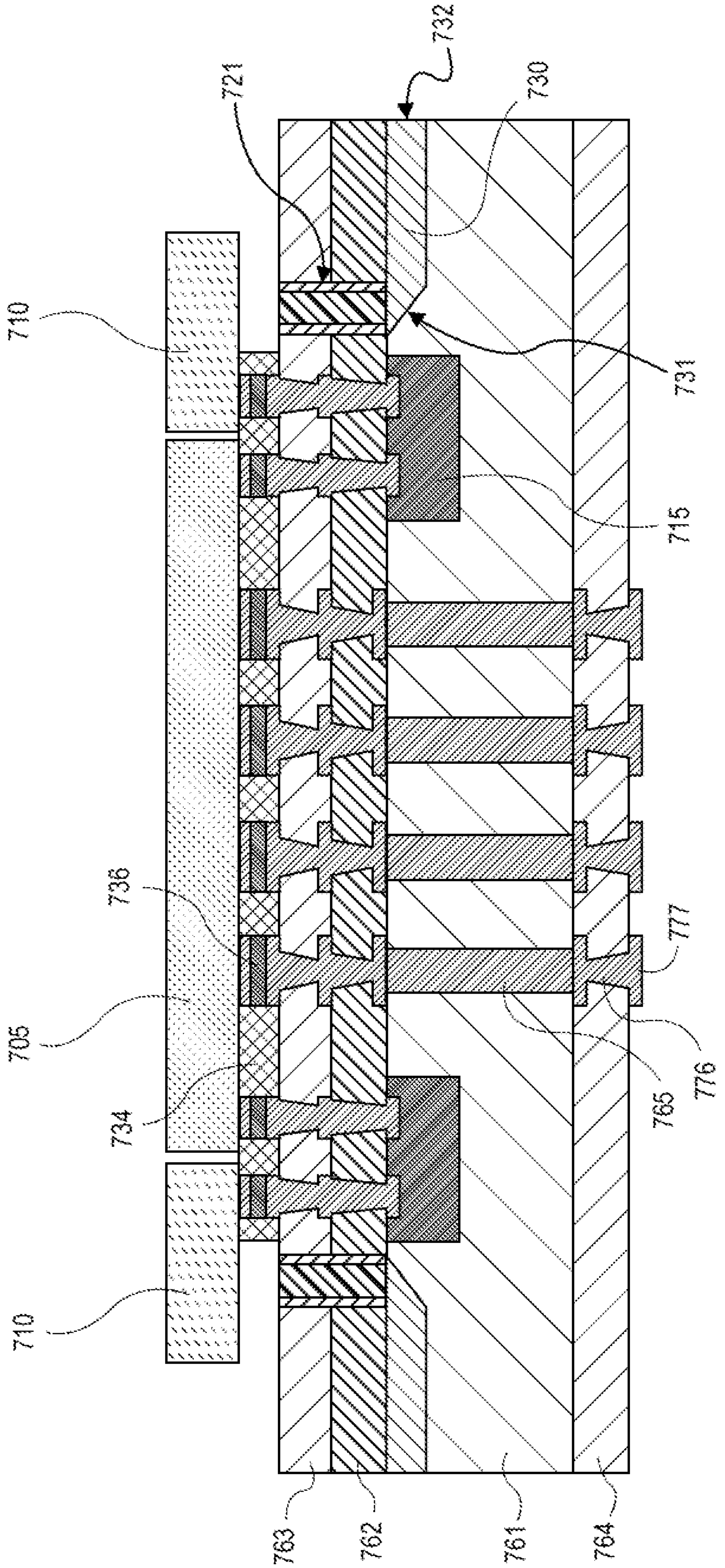

Referring now to FIG. 7H, a cross-sectional illustration of the glass substrate 761 after backside processing is performed is shown, in accordance with an embodiment. In an embodiment, the structure may be flipped over and put on a carrier (not shown) to expose the backside surface of the glass substrate 761. A solder resist layer 764 is provided over the bottom surface of the glass substrate 761. Vias 776 and pads 777 may then be provided through and on the solder resist layer 764.

Figure 7I:
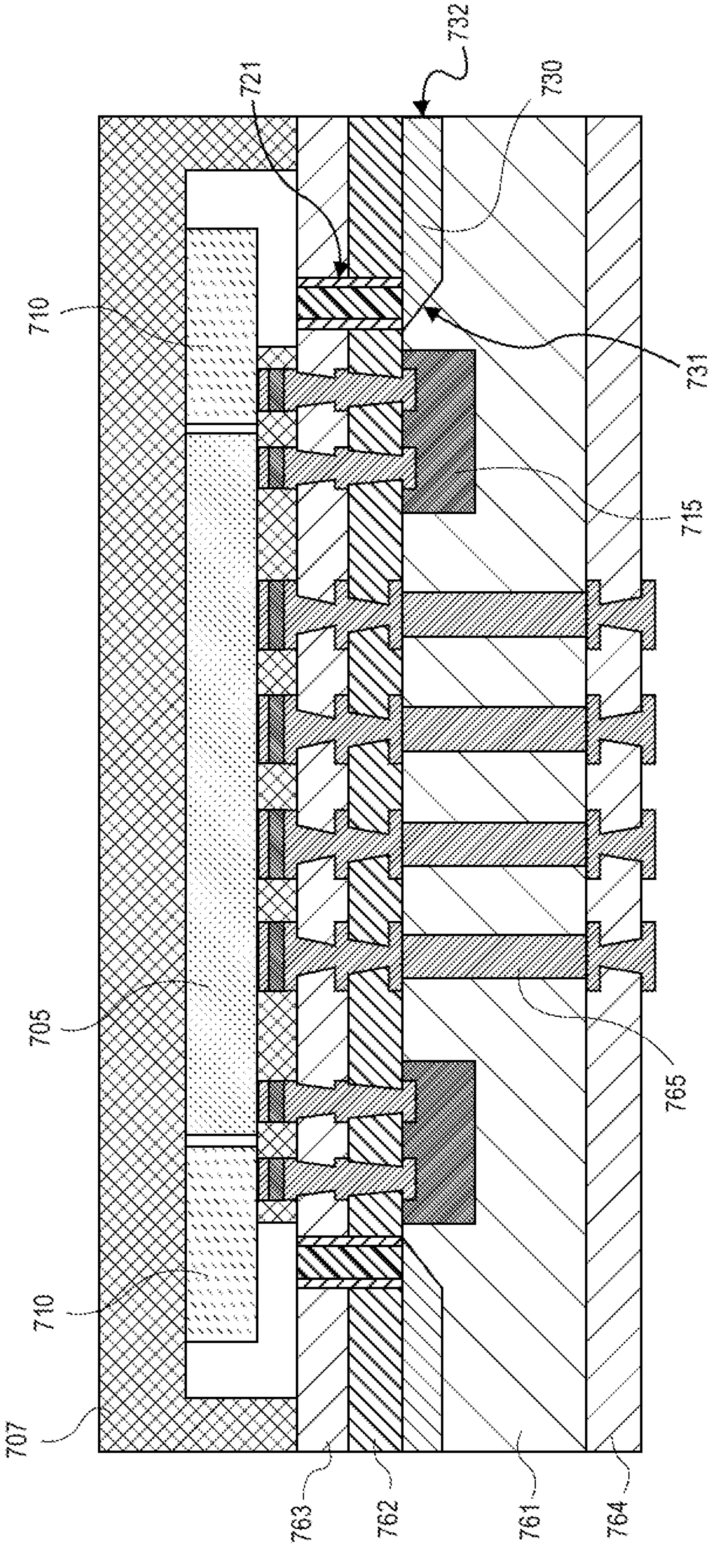

Referring now to FIG. 7I, a cross-sectional illustration of the glass substrate 761 after an IHS 707 is provided over the photonics dies 710 and the compute die 705 is shown, in accordance with an embodiment. In an embodiment, the IHS 707 may be thermally coupled to the photonics dies 710 and the compute die 705 by a TIM (not shown). The legs of the IHS 707 may connect to the solder resist 763 in some embodiments. In an embodiment, the glass patch may then be attached to an organic package substrate similar to what is shown in FIG. 6B.

Referring now to FIGS. 8A-8F, a series of cross-sectional illustrations depicting a process for forming a glass patch with a high-density routing stack is shown, in accordance with an embodiment. The glass patch in FIGS. 8A-8F may be substantially similar to the glass patch illustrated and described with respect to FIG. 6C.

Figure 8A:
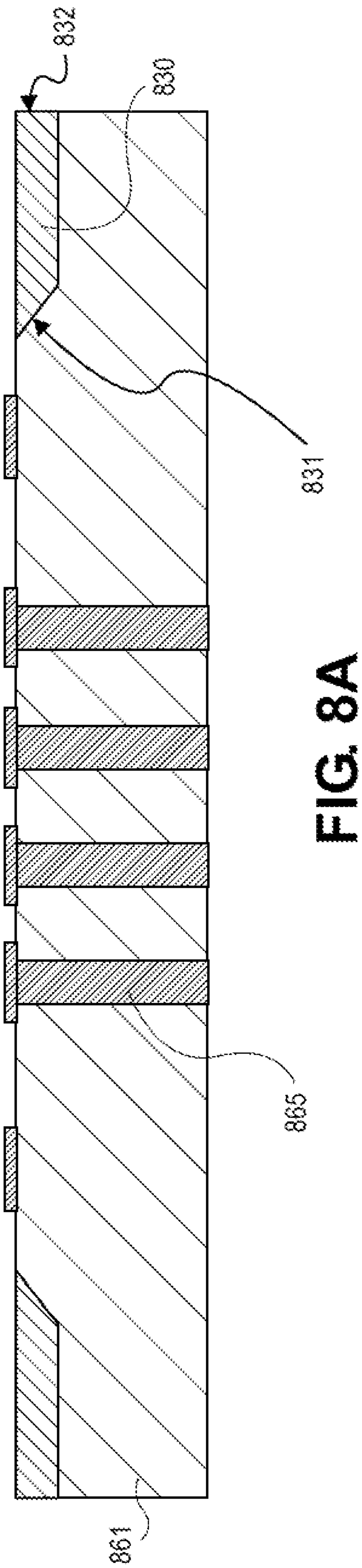
FIGS. 8A-8F are cross-sectional illustrations of a process for forming a glass patch for an optical package with high-density routing layers and embedded optical waveguides, in accordance with an embodiment.

Referring now to FIG. 8A, a cross-sectional illustration of a glass substrate 861 is shown, in accordance with an embodiment. In an embodiment, the glass substrate 861 has a thickness between approximately 200 μm and approximately 600 μm. TGVs 865 may pass through an entire thickness of the glass substrate 861. In the illustrated embodiment, the TGVs 865 are shown having substantially vertical sidewalls. In other embodiments, the TGVs 865 may have an hourglass shape.

In an embodiment, optical waveguides 830 are embedded in the glass substrate 861. In an embodiment, trenches for the optical waveguides 830 may be formed using laser drilling, a dry etch, and/or a wet etch process. The process to form the trenches for the optical waveguides 830 may result in the formation of a sloped first end 831. The sloped first end 831 may be approximately 45° in order to allow for optical signals from above to be routed out the second end 832 of the optical waveguide 830. In an alternative embodiment, a mirror with an angled surface may be placed at the first end 831 of the optical waveguide 830. In an embodiment, the processing used to form the channel for the optical waveguide 830 may result in smooth surfaces (e.g., approximately 70 nm RMS or less) that minimizes optical scattering and improves transmission efficiency.

In an embodiment, the optical waveguide 830 may be formed with a paste printable high index of refraction epoxy resin, such as, but not limited to a polyimide, a polyalkane, a polycyanate, a diazobenzoquinone, a metal-centered (e.g., iron, aluminum, copper, etc.) dendrite polymer, a high-density polycarbonate, a polythiphene, a polythiadiazole, or a polysulfone. In an embodiment, the optical waveguide 830 is in direct contact with the glass substrate 861. However, in other embodiments, a cladding layer (e.g., silver) may be provided between the optical waveguide 830 and the glass substrate 861 to further improve efficiency by enabling total internal reflectance over a wide range of wavelengths, which results in very low attenuation. In some embodiments, a polishing process may be needed to remove excess resin from the top surface of the glass substrate 861. Additionally, while an in-built optical waveguide 830 is described in FIG. 8A, it is to be appreciated that a prefabricated optical waveguide may also be inserted into the trench formed in the glass substrate 861. Such embodiments may allow for even higher efficiencies to be obtained.

Figure 8B:
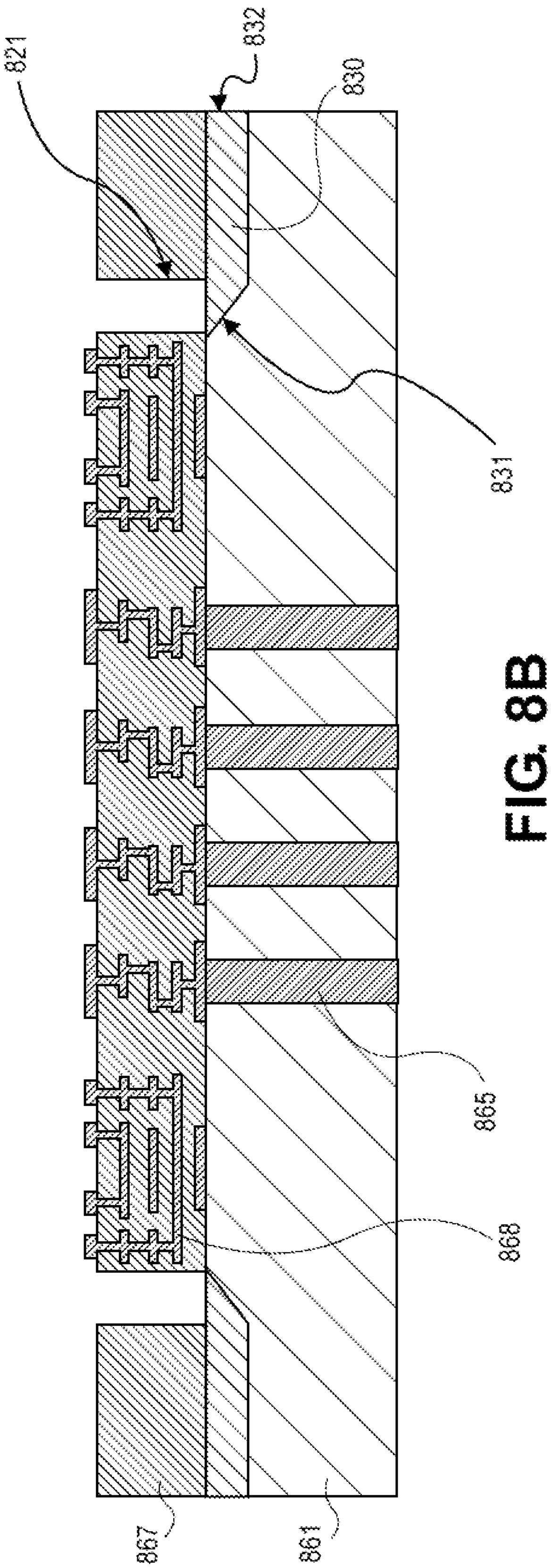

Referring now to FIG. 8B, a cross-sectional illustration of the glass substrate 861 after a high-density routing stack 867 is provided over the glass substrate 861 is shown, in accordance with an embodiment. Since glass is dimensionally stable, finer patterning can be achieved compared to that of organic substrates. As such, the high-density routing stack 867 can be used to provide routing 868 between photonic dies and the compute die. In an embodiment, the routing 868 may be formed with high-resolution photo-imageable dielectrics, use self-aligned via approaches, or zero mis-alignment via approaches. The use of such via fabrication processes may result in vias that have substantially vertical sidewalls, as opposed to tapered sidewalls typical of laser drilling processes.

In an embodiment, optical paths 821 may be formed through the high-density routing stack 867. The optical paths 821 may be formed with a laser drilling process, or by using lithography. In an embodiment, the optical paths 821 are provided over the first ends 831 of the optical waveguides 830.

Figure 8C:
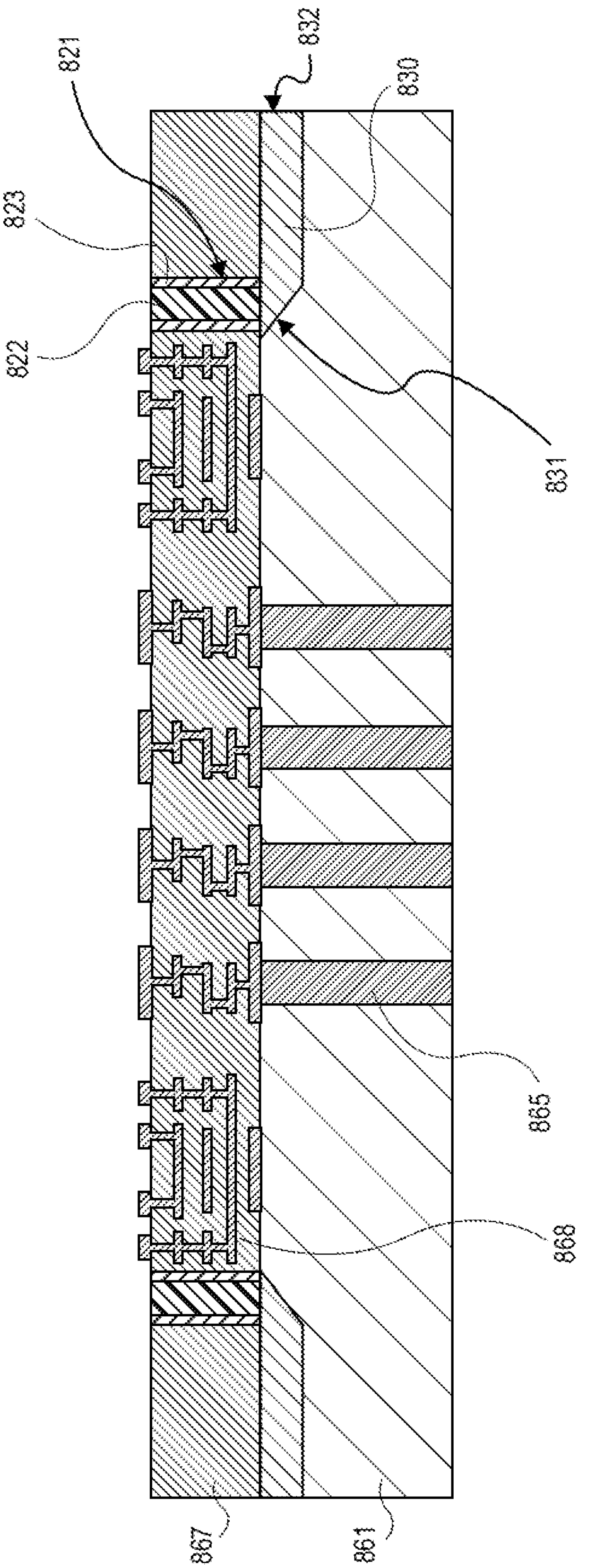

Referring now to FIG. 8C, a cross-sectional illustration of the glass substrate 861 after the optical paths 821 are filled is shown, in accordance with an embodiment. In an embodiment, the optical path 821 is filled with a resin using a dispenser. The resin may be any traditional epoxy resin with an inorganic filler. The filled resin is subsequently drilled, filled with a cladding 823 and a core 822, cured and polished. Cladding 823 ensures low roughness (e.g., approximately 70 nm RMS or lower) that minimizes light scattering. Standard cladding 823 and core 822 materials may be used, such as, but not limited to low-density versions of polyimides, polyalkanes, polycyanates, polyacrylates, polysiloxanes, and thin metal layers, such as copper, silver, gold, and aluminum. Additionally, polyperflurocarbon polymers may be used as the cladding 823.

Figure 8D:
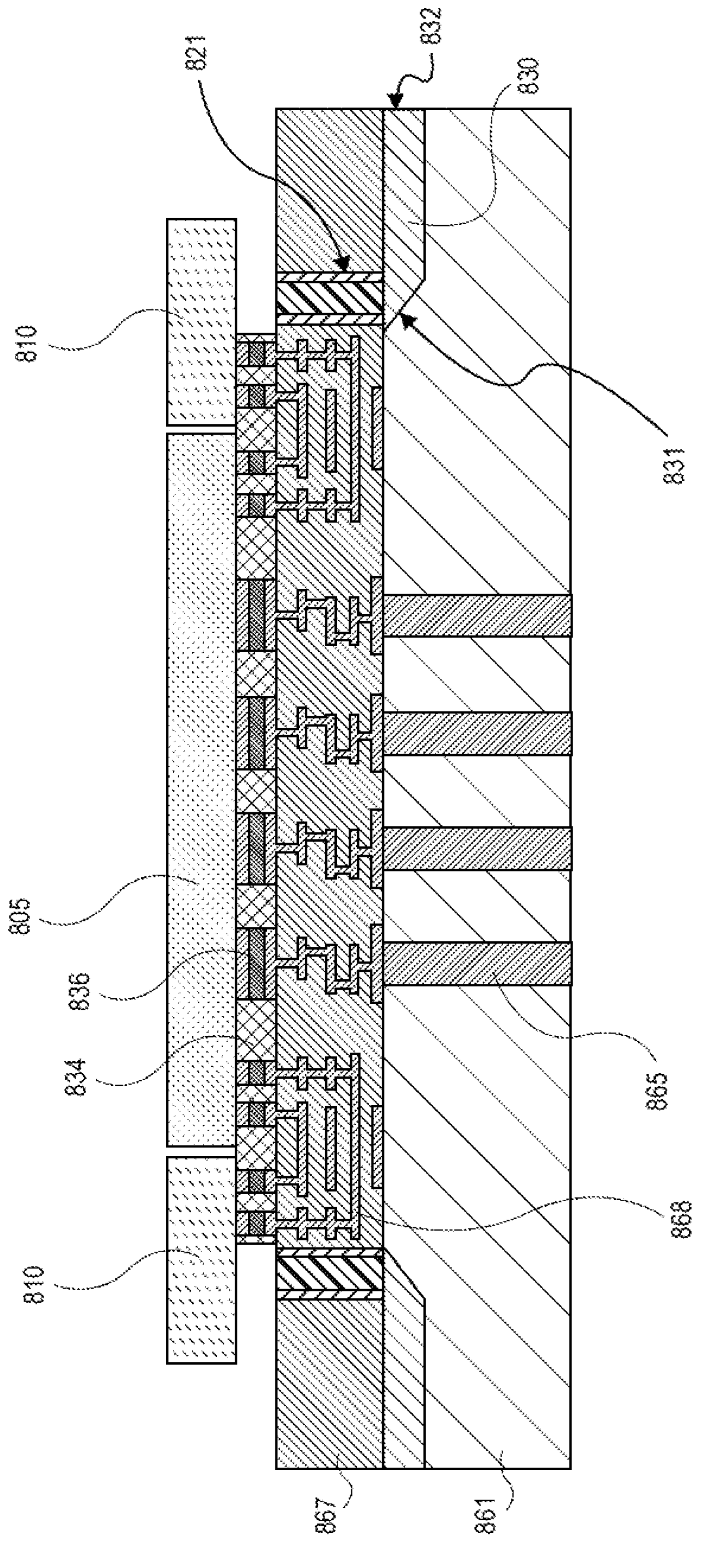

Referring now to FIG. 8D, a cross-sectional illustration of the glass substrate 861 after a compute die 805 and photonics dies 810 are attached is shown, in accordance with an embodiment. In an embodiment, the compute die 805 and the photonics dies 810 may be attached using FLIs 836. In an embodiment, the FLIs 836 are surrounded by an underfill 834. The underfill 834 may be prevented from flowing over the optical paths 821 by a dam (not shown) or the like. The photonics dies 810 may be communicatively coupled to the compute die 805 by the routing 868 in the high-density routing stack 867.

As shown in FIG. 8D, the photonics dies 810 are entirely within a footprint of the glass substrate 861. That is, there is no portion of the photonics dies 810 that extend past and overhang an edge of the glass substrate 861. Instead, optical coupling from the photonics dies 810 to the edge of the glass substrate 861 is provided by the optical paths 821 and the optical waveguides 830.

Figure 8E:
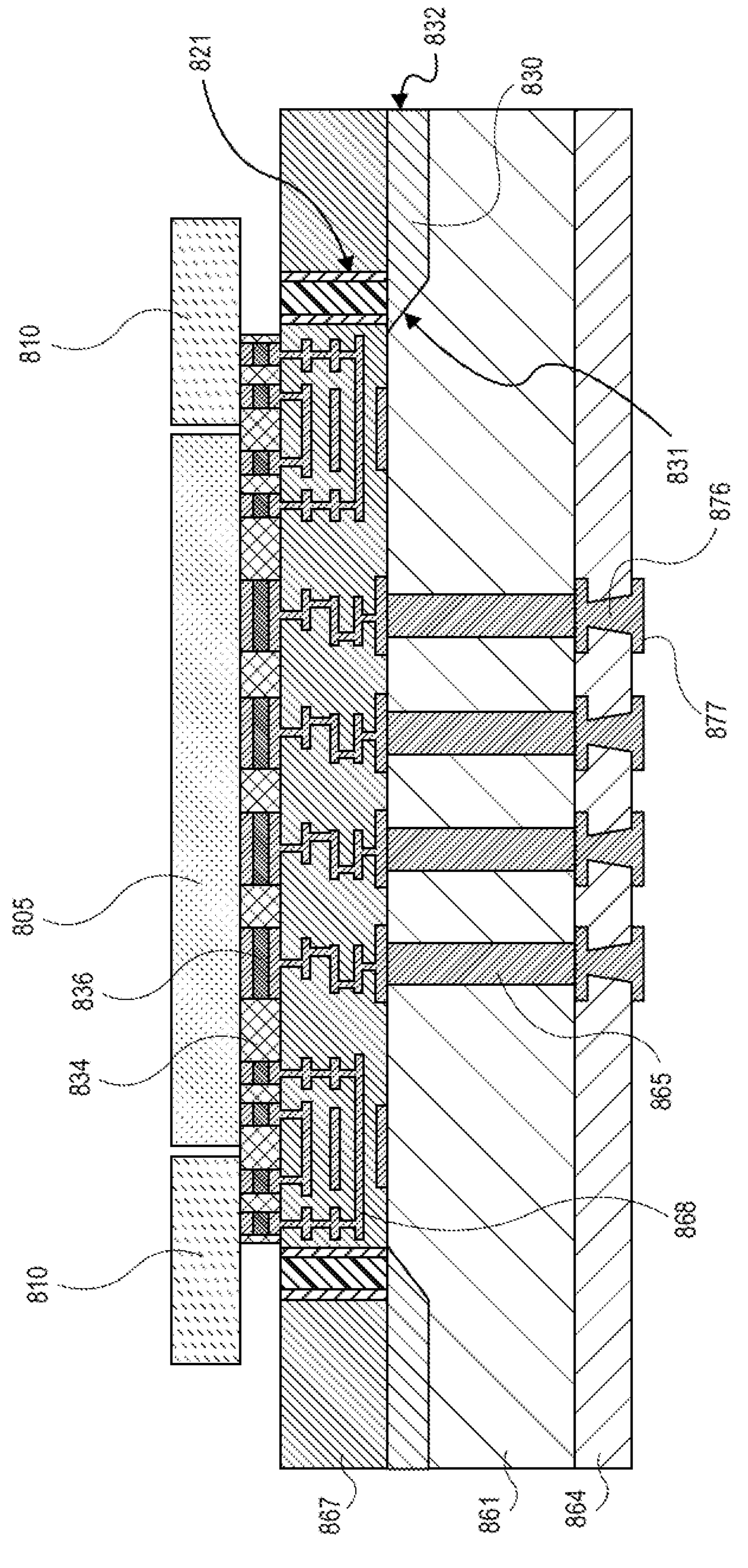

Referring now to FIG. 8E, a cross-sectional illustration of the glass substrate 861 after backside processing is performed is shown, in accordance with an embodiment. In an embodiment, the structure may be flipped over and put on a carrier (not shown) to expose the backside surface of the glass substrate 861. A solder resist layer 864 is provided over the bottom surface of the glass substrate 861. Vias 876 and pads 877 may then be provided through and on the solder resist layer 864.

Figure 8F:
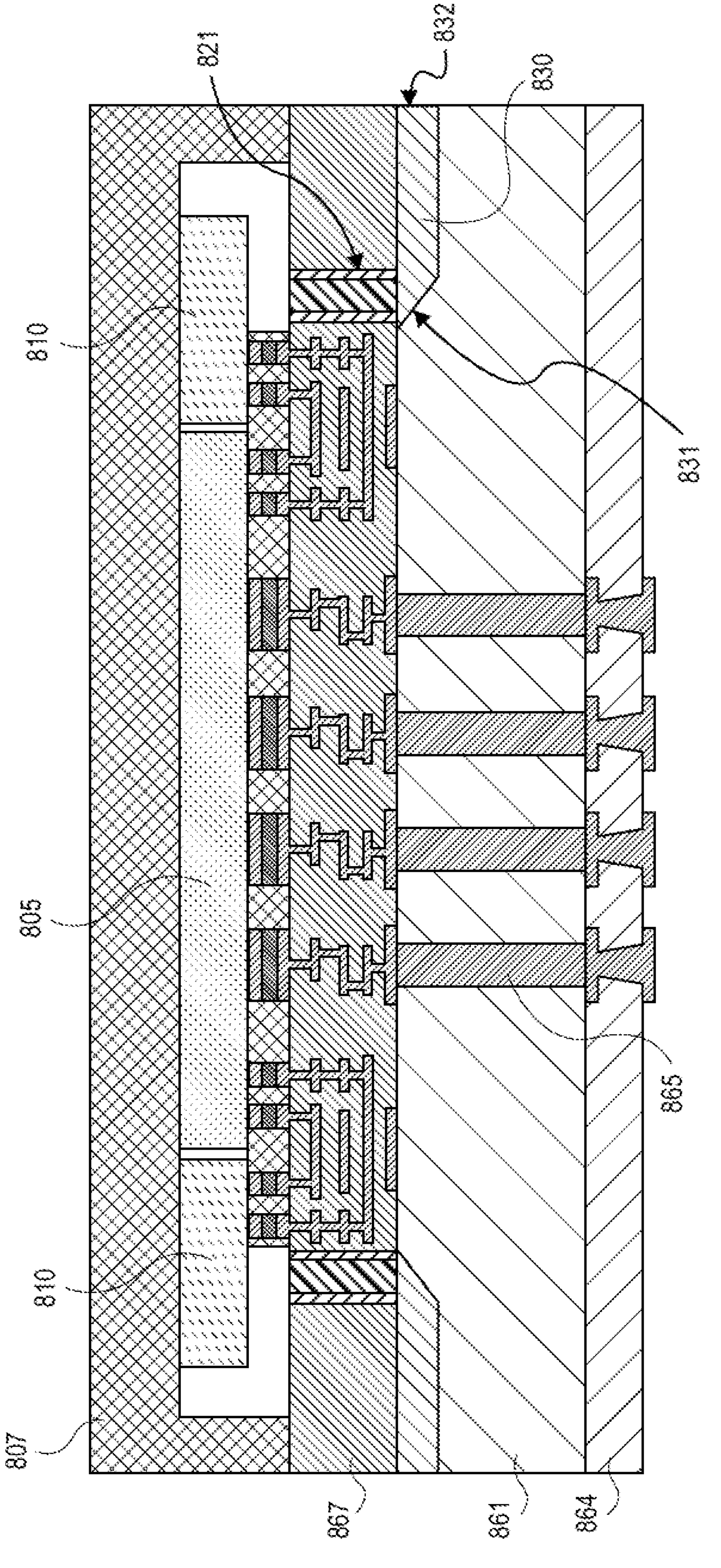

Referring now to FIG. 8F, a cross-sectional illustration of the glass substrate 861 after an IHS 807 is provided over the photonics dies 810 and the compute die 805 is shown, in accordance with an embodiment. In an embodiment, the IHS 807 may be thermally coupled to the photonics dies 810 and the compute die 805 by a TIM (not shown). The legs of the IHS 807 may connect to the high-density routing layer 867 in some embodiments. In an embodiment, the glass patch may then be attached to an organic package substrate similar to what is shown in FIG. 6B.

Figure 9A:
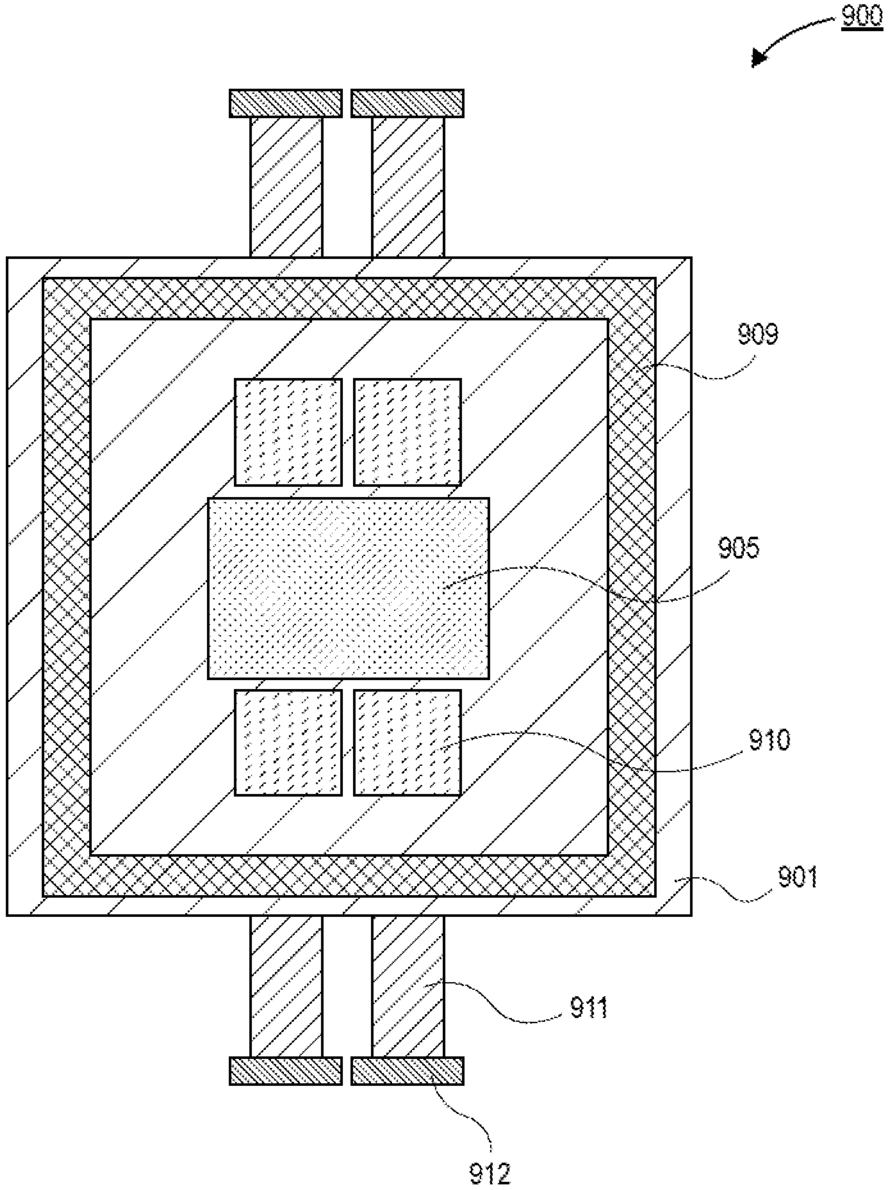
FIG. 9A is a plan view illustration of an optical package with a glass package substrate, in accordance with an embodiment.

Referring now to FIG. 9A, a plan view illustration of an optical package 900 is shown, in accordance with an embodiment. In an embodiment, the optical package 900 comprises a package substrate 901. In an embodiment, the package substrate comprises laminated glass layers. The glass layers may be adhered to each other by dielectric layers. In an embodiment, a compute die 905 and photonics dies 910 may be provided over the package substrate 901. An IHS 909 may be provided around the compute die 905 and the photonics dies 910. As shown, optical interconnects 911 and connectors 912 may be coupled to the edge of the package substrate 901.

The use of a glass package substrate 901 provides enhanced dimensional stability and coplanarity. This allows for improved alignment between the optical waveguides (not visible in FIG. 9A) that are embedded in the package substrate 901 and the photonics dies 910.

Figure 9B:
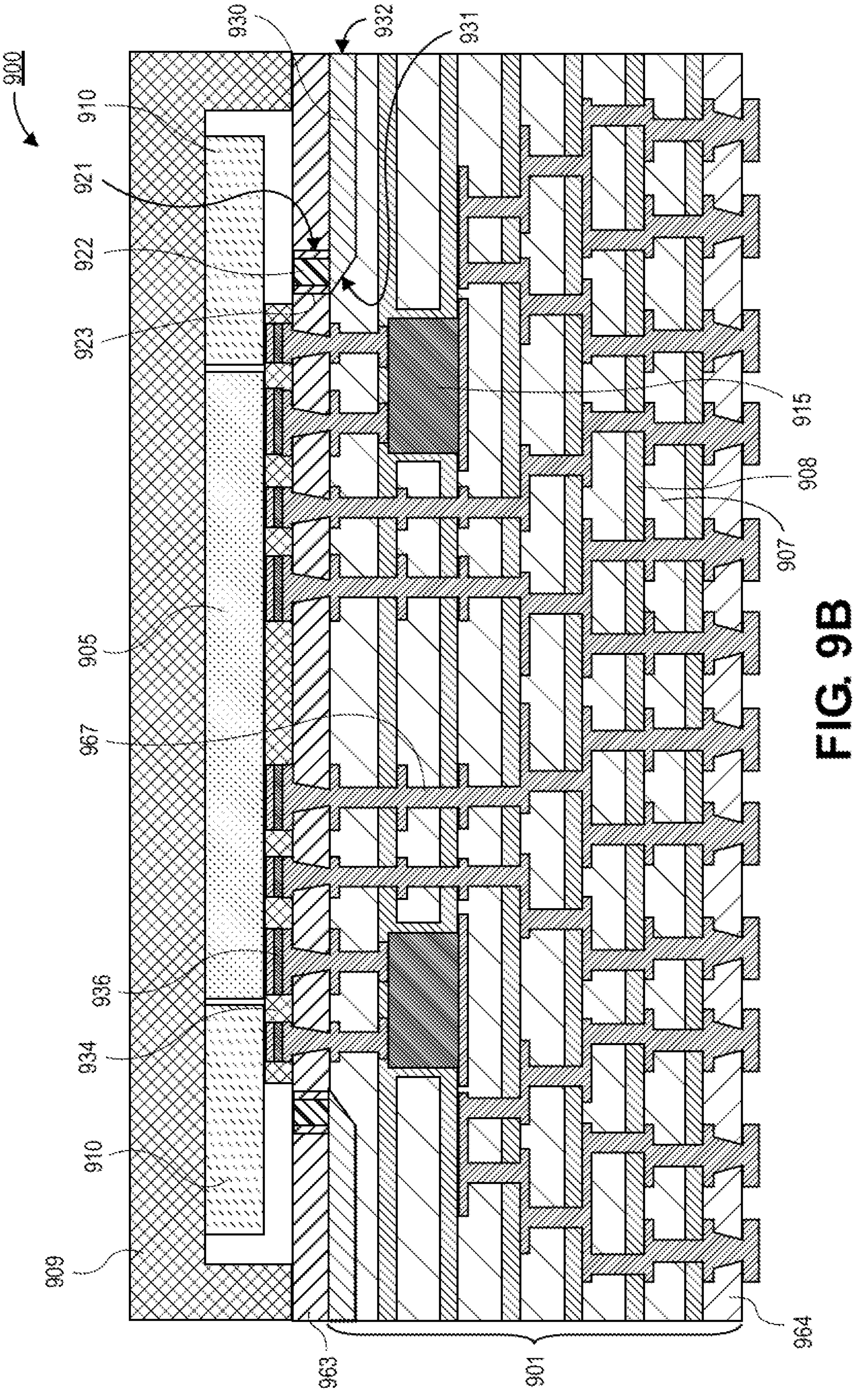
FIG. 9B is a cross-sectional illustration of the optical package in FIG. 9A with an embedded bridge and optical waveguide, in accordance with an embodiment.

Referring now to FIG. 9B, a cross-sectional illustration of an optical package 900 is shown, in accordance with an embodiment. In an embodiment, the optical package 900 comprises a package substrate 901. The package substrate 901 may comprise a plurality of glass layers 907 and a plurality of adhesive dielectric layers 908. The dielectric layers 908 allow for the glass layers 907 to be adhered to each other in order to form the package substrate 901. In an embodiment, the package substrate 901 may comprise conductive routing 967. The conductive routing 967 may comprise traces, vias, pads, and the like that are embedded in the glass layers 907 and the dielectric layers 908. In an embodiment, a first solder resist layer 963 is provided over the top surface of the package substrate 901, and a second solder resist layer 964 is provided over the bottom surface of the package substrate 901.

In an embodiment, bridges 915 may be embedded in the package substrate 901. The bridges 915 may provide electrical coupling between photonics dies 910 and the compute die 905. In an embodiment, the photonics dies 910 and the compute die 905 are attached to the package substrate 901 by FLIs 936. The FLIs 936 may be surrounded by an underfill 934. In an embodiment, the photonics dies 910 and the compute die 905 are thermally coupled to an IHS 909. For example, a TIM (not shown) may be provided between the IHS 909 and the photonics dies 910 and the compute die 905.

In an embodiment, an optical waveguide 930 is embedded in the package substrate 901. For example, the optical waveguide 930 may be embedded in a topmost glass layer 907. The optical waveguide 930 may comprise a first end 931 that is below (and within the footprint) of the photonics die 910. A second end 932 of the optical waveguide 930 may be at an edge of the package substrate 901. In an embodiment, the first end 931 of the optical waveguide 930 is sloped (e.g., at an angle of approximately) 45°. The sloped first end 931 allows for optical signals from the photonics die 910 above to be routed to the edge of the package substrate 901 at the second end 932 of the optical waveguide 930.

In an embodiment, the optical waveguide 930 may comprise a high index of refraction material, such as, but not limited to, polyimide, a polyalkane, a polycyanate, a diazobenzoquinone, a metal-centered (e.g., iron, aluminum, copper, etc.) dendrite polymer, a high-density polycarbonate, a polythiphene, a polythiadiazole, or a polysulfone. In an embodiment, the optical waveguide 930 is in direct contact with the glass layer 907. However, in other embodiments, a cladding layer (e.g., silver) may be provided between the optical waveguide 930 and the glass layer 907 to further improve efficiency by enabling total internal reflectance over a wide range of wavelengths, which results in very low attenuation. Additionally, while an in-built optical waveguide 930 is described in FIG. 9B, it is to be appreciated that a prefabricated optical waveguide may also be inserted into a trench formed in the glass layer 907, similar to the embodiment shown in FIG. 2D. Such embodiments may allow for even higher efficiencies to be obtained.

In an embodiment, an optical path 921 is provided above the first end 931 of the optical waveguide 930 through the first solder resist layer 963. The optical path 921 may be filled in some embodiments. For example, the optical path 921 may be filled with a cladding 923 and a core 922. Cladding 923 ensures low roughness (e.g., approximately 70 nm RMS or lower) that minimizes light scattering. Standard cladding 923 and core 922 materials may be used, such as, but not limited to low-density versions of polyimides, polyalkanes, polycyanates, polyacrylates, polysiloxanes, and thin metal layers, such as copper, silver, gold, and aluminum. Additionally, polyperflurocarbon polymers may be used as the cladding 923.

In an embodiment, the underfill 934 is prevented from flowing over the optical path 921 by a dam (not shown) or the like. Accordingly, optical signals can pass from the photonics die 910 to the optical path 921 through air. In some embodiments, a lens (e.g., similar to the embodiment in FIG. 2C) may be provided over the optical path 921 and over the second end 932 of the optical waveguide 930 in order to improve transmission efficiency.

Figure 9C:
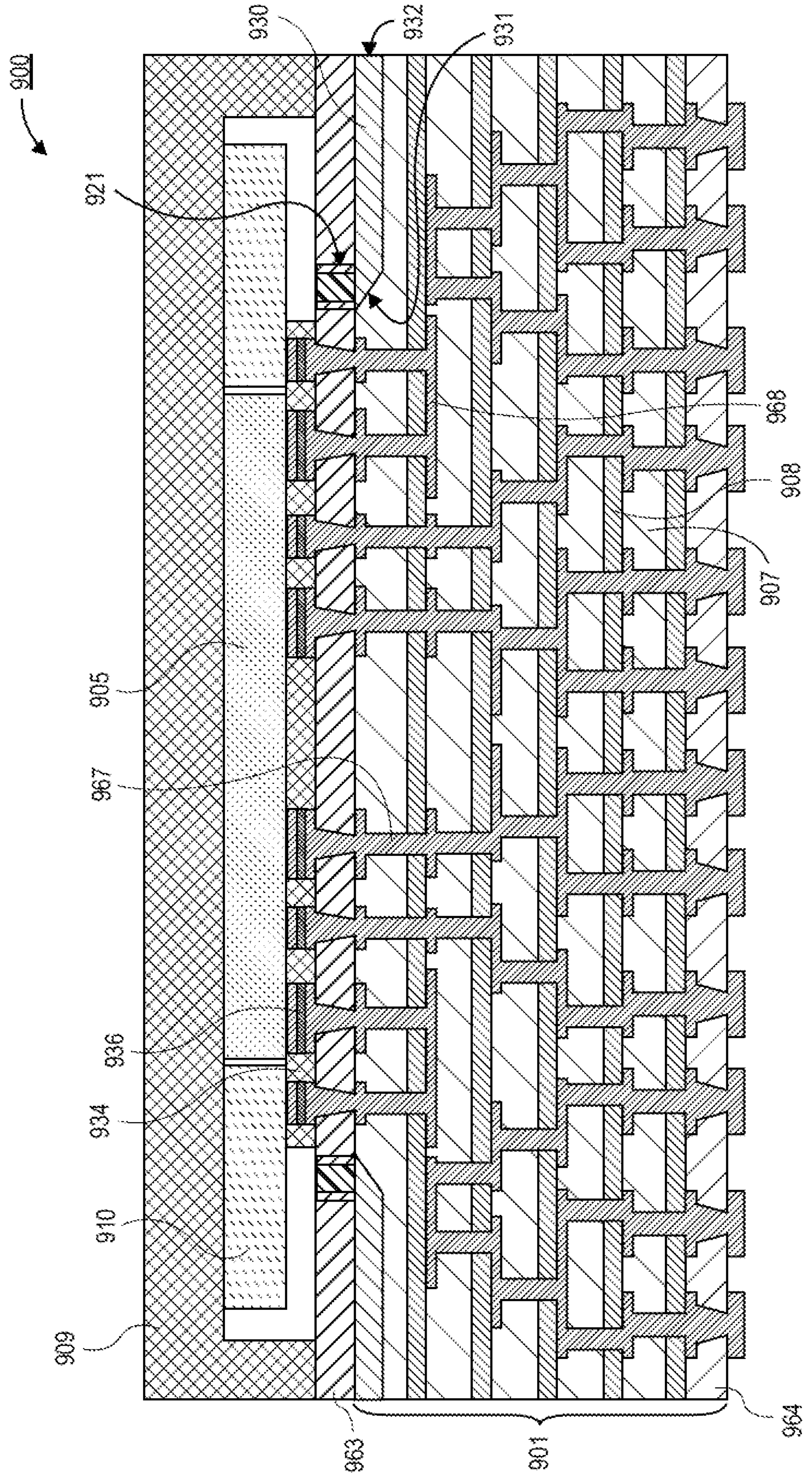
FIG. 9C is a cross-sectional illustration of the optical package in FIG. 9A with a high-density routing layer and an optical waveguide, in accordance with an embodiment.

Referring now to FIG. 9C, a cross-sectional illustration of an optical package 900 is shown, in accordance with an additional embodiment. The optical package 900 in FIG. 9C may be substantially similar to the optical package 900 in FIG. 9B, with the exception that the bridge 915 is removed. Instead, high density routing to couple the photonics dies 910 to the compute die 905 is provided through routing 968 in the package substrate 901. Due to the high dimensional stability and coplanarity of the glass based package substrate 901, high density routing suitable for coupling the photonics dies 910 to the compute die 905 is able to be formed.

Figure 10A:
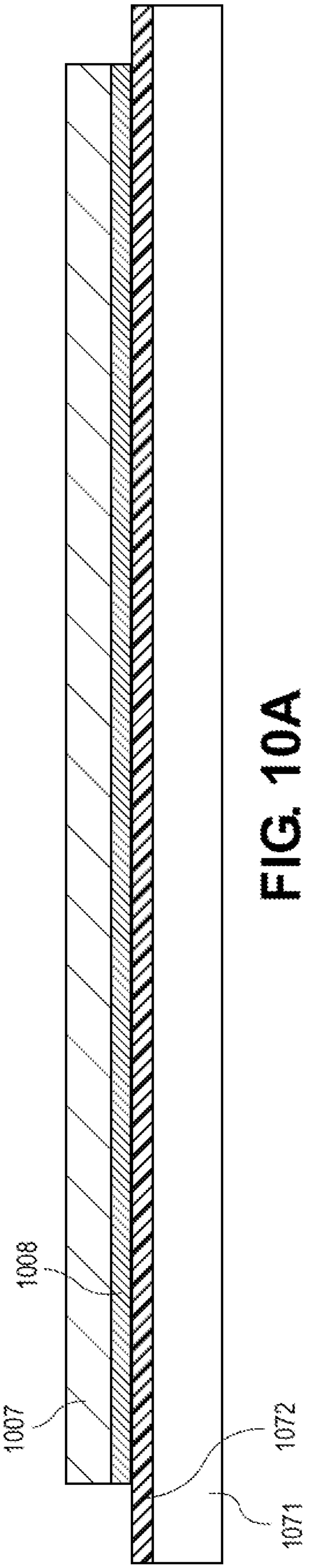
FIGS. 10A-10P are cross-sectional illustrations of a process for forming an optical package with a multi-layer glass substrate with an embedded bridge and optical waveguide, in accordance with an embodiment.
Figure 10B:
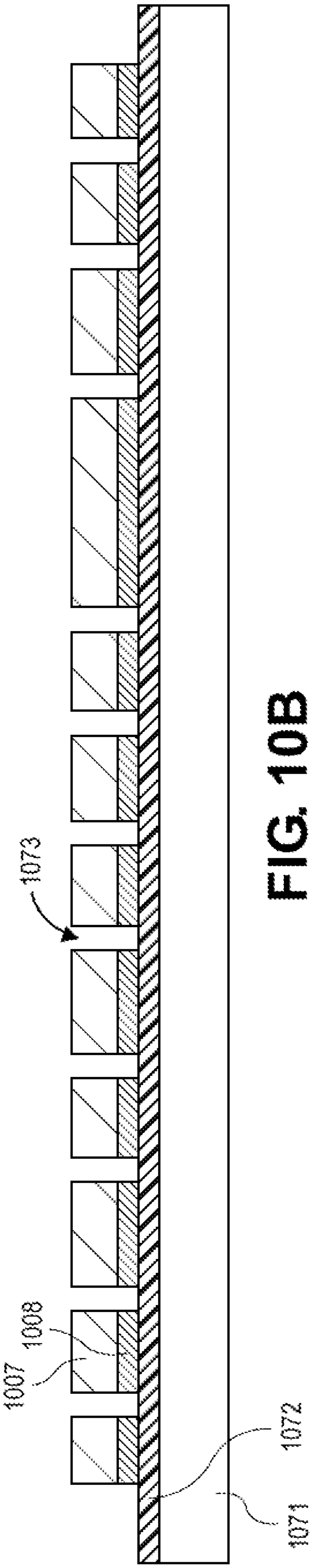
Figure 10C:
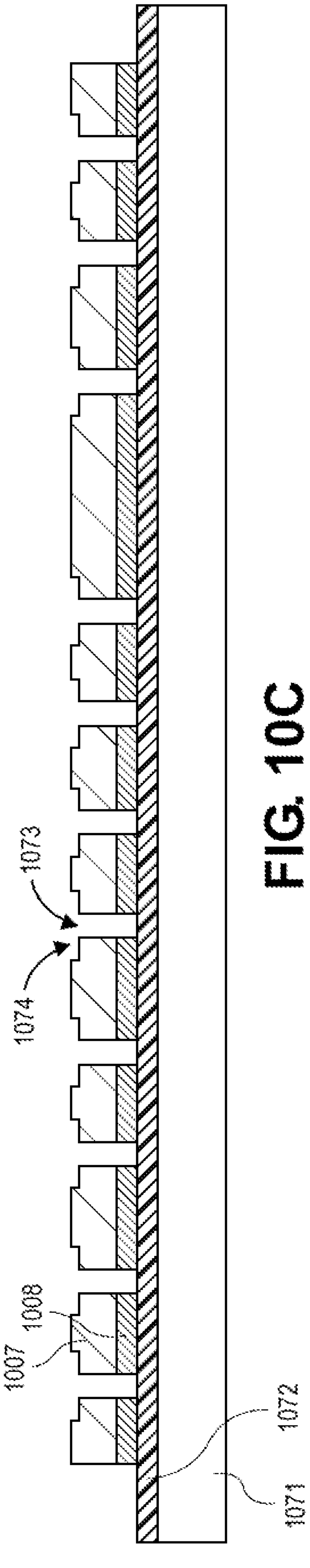
Figure 10D:
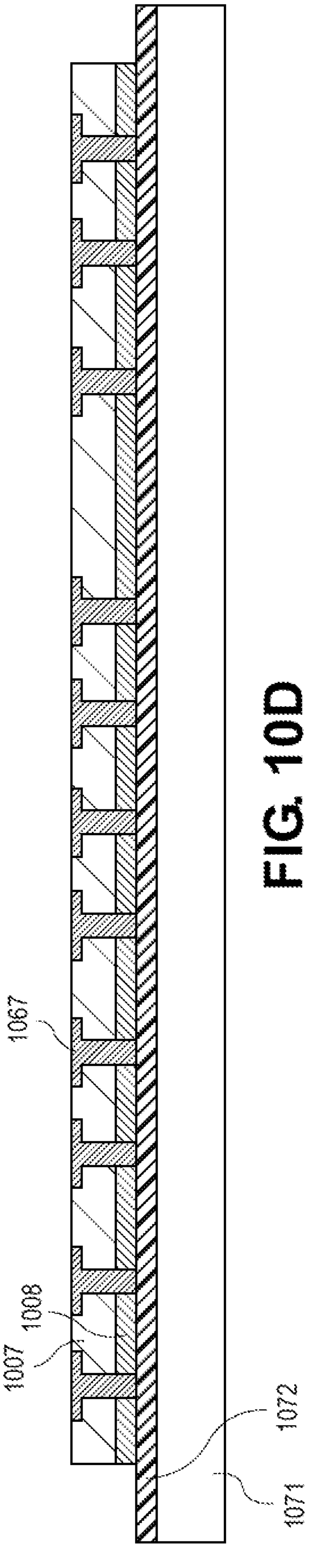
Figure 10E:
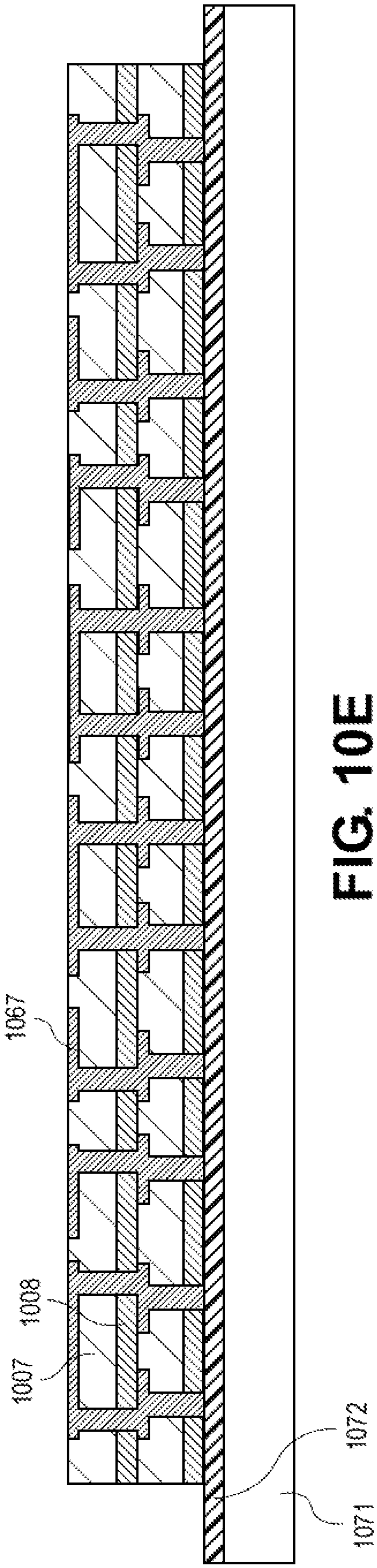
Figure 10F:
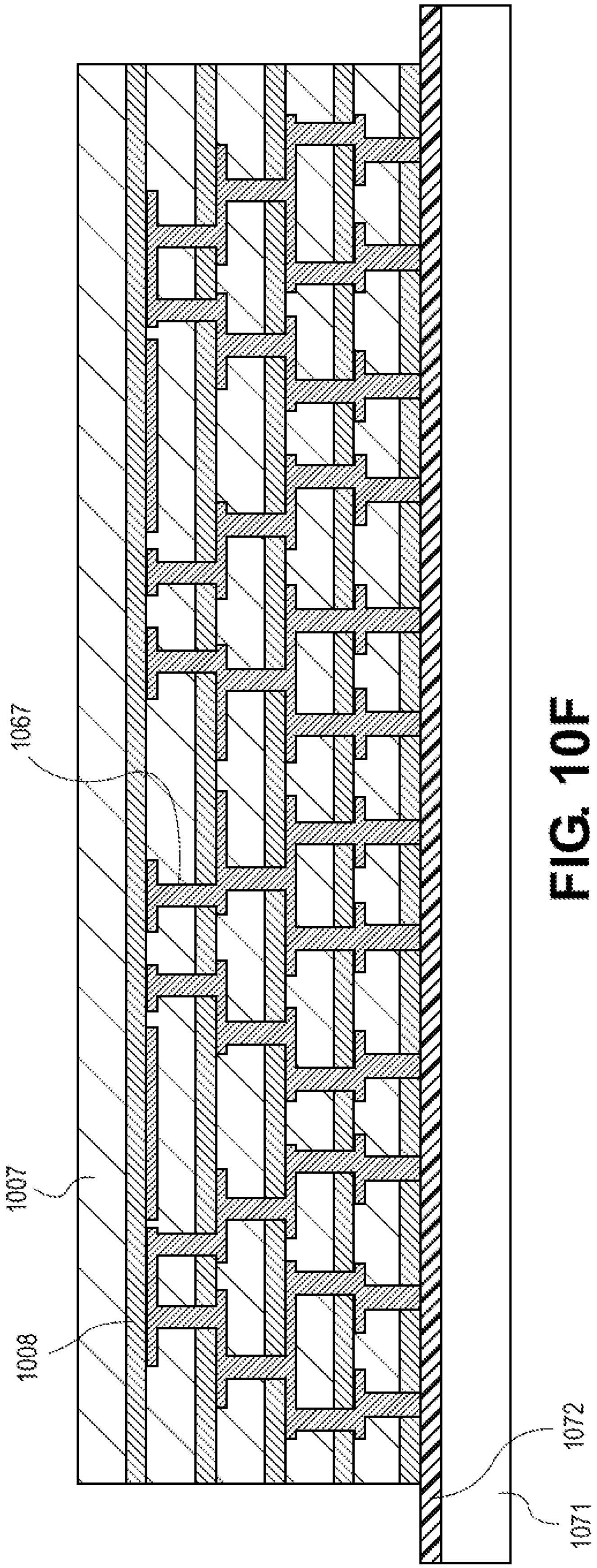
Figure 10G:
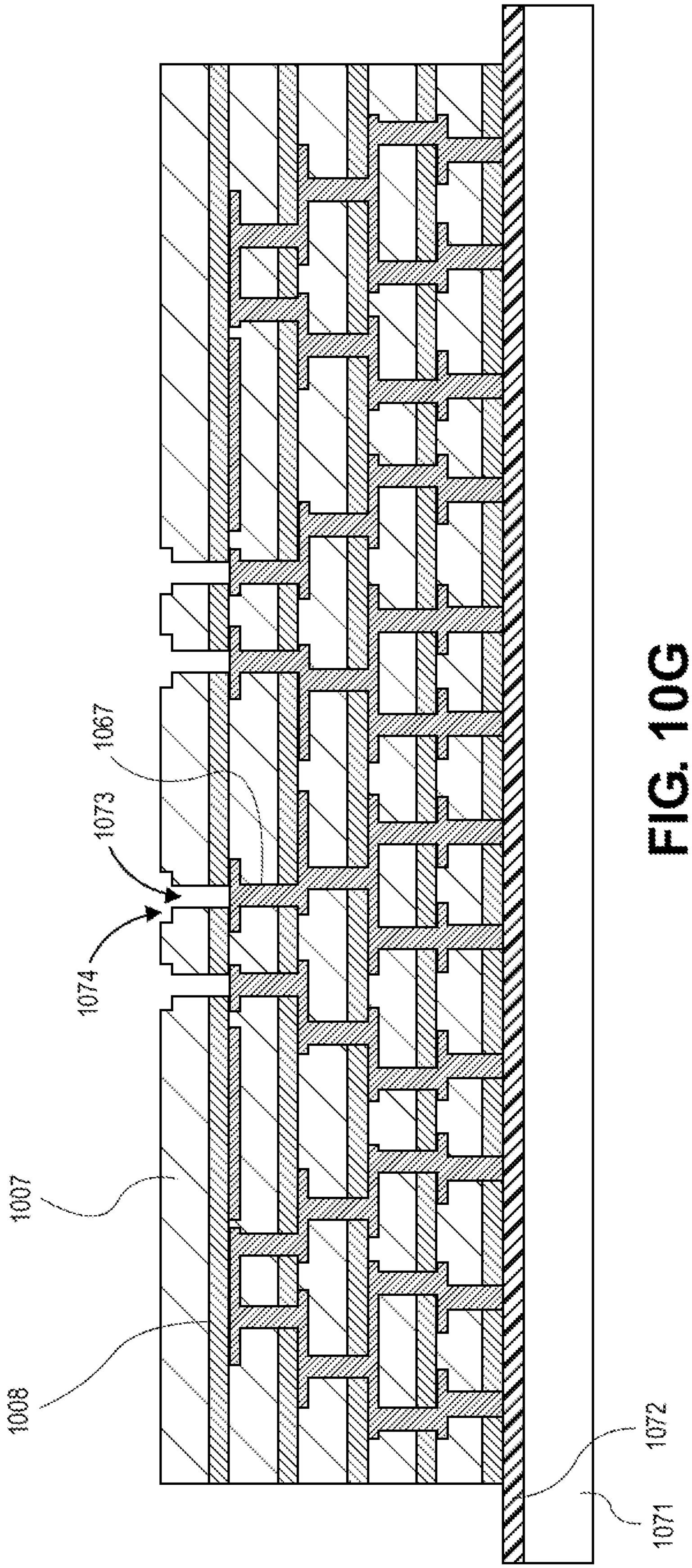
Figure 10H:
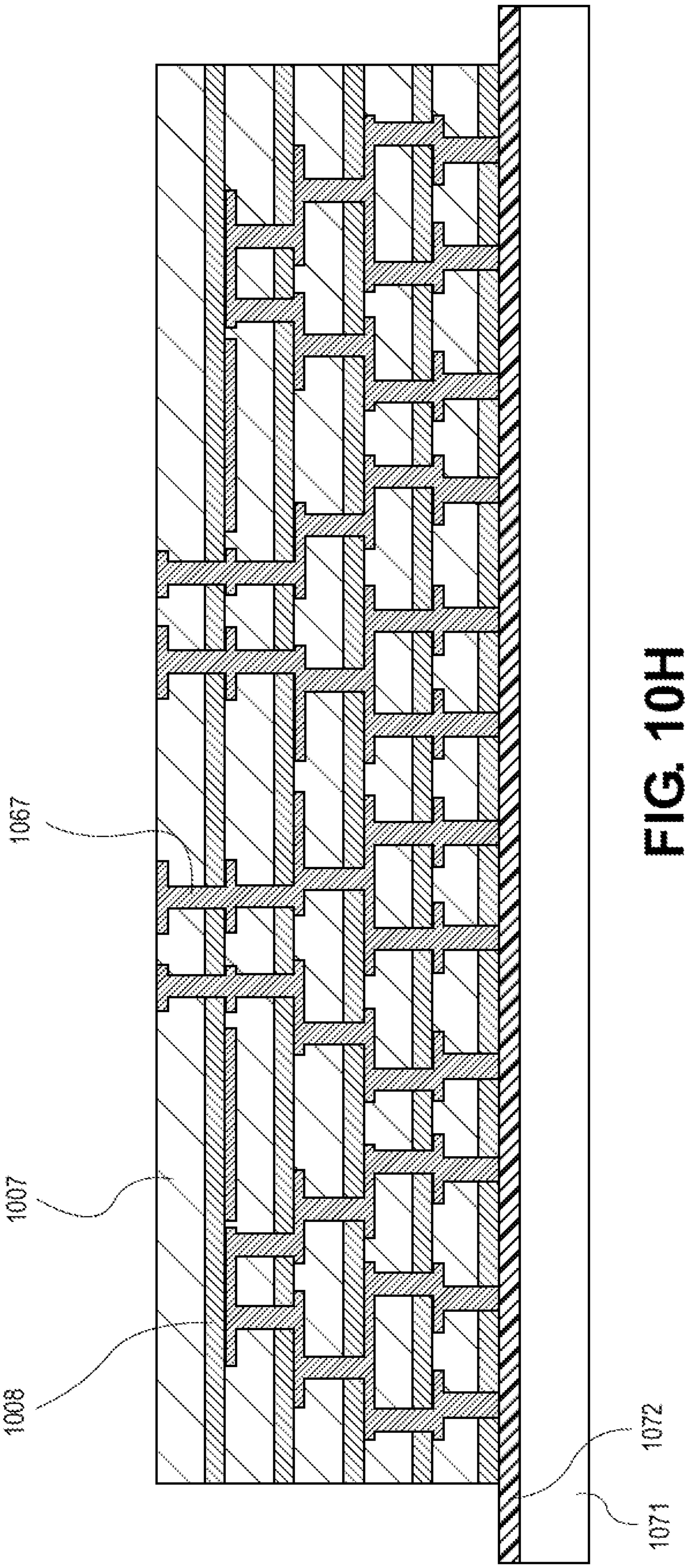
Figure 10I:
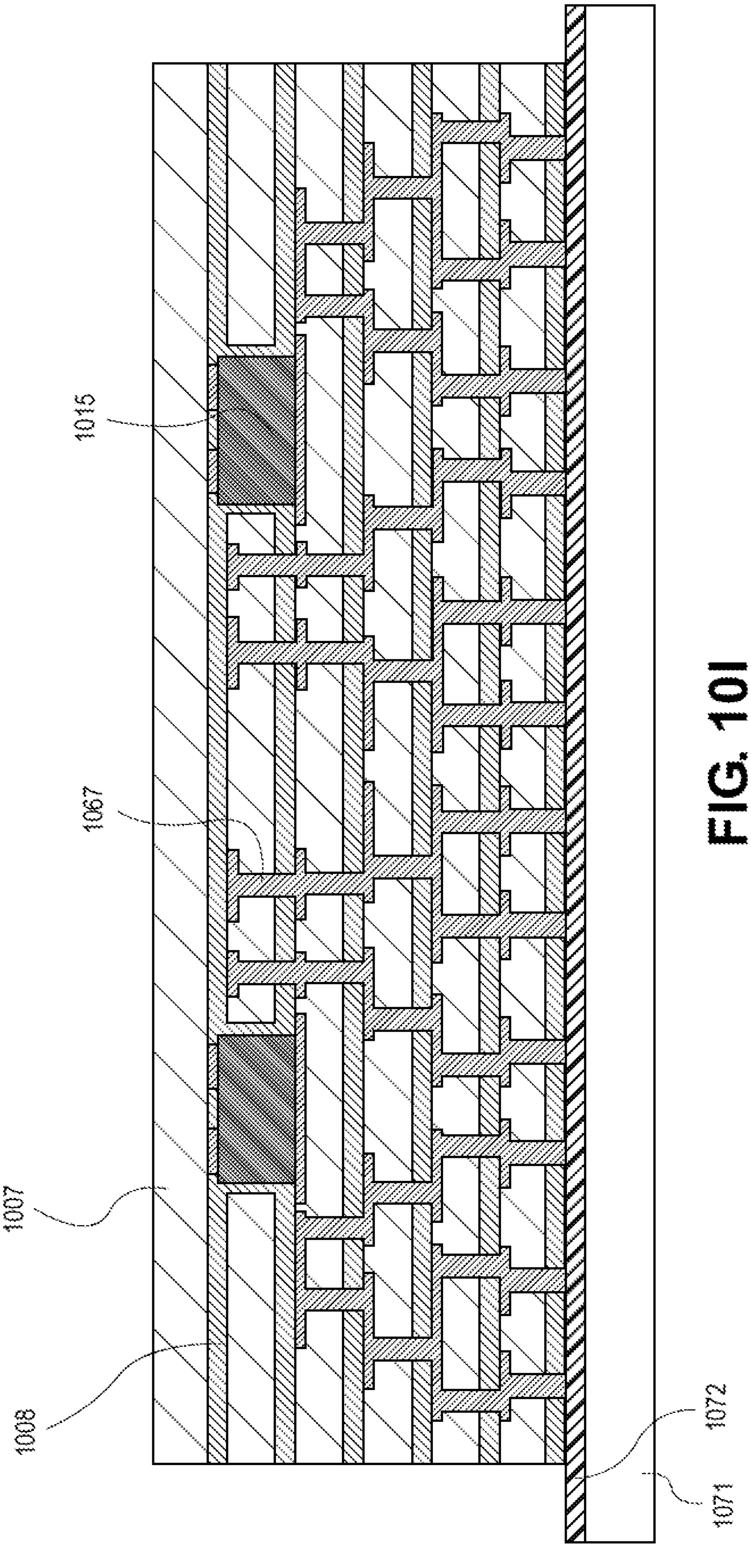
Figure 10J:
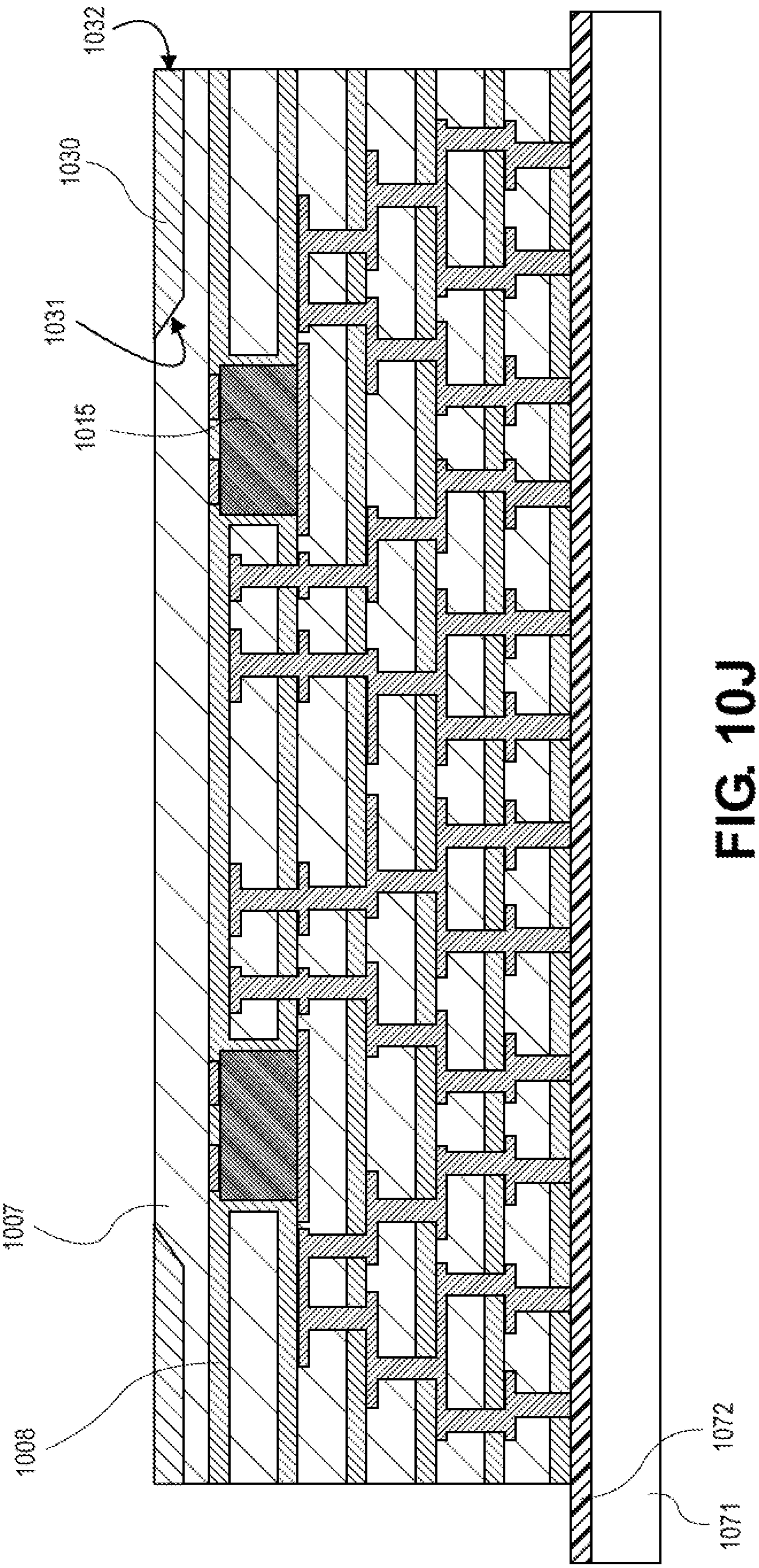
Figure 10K:
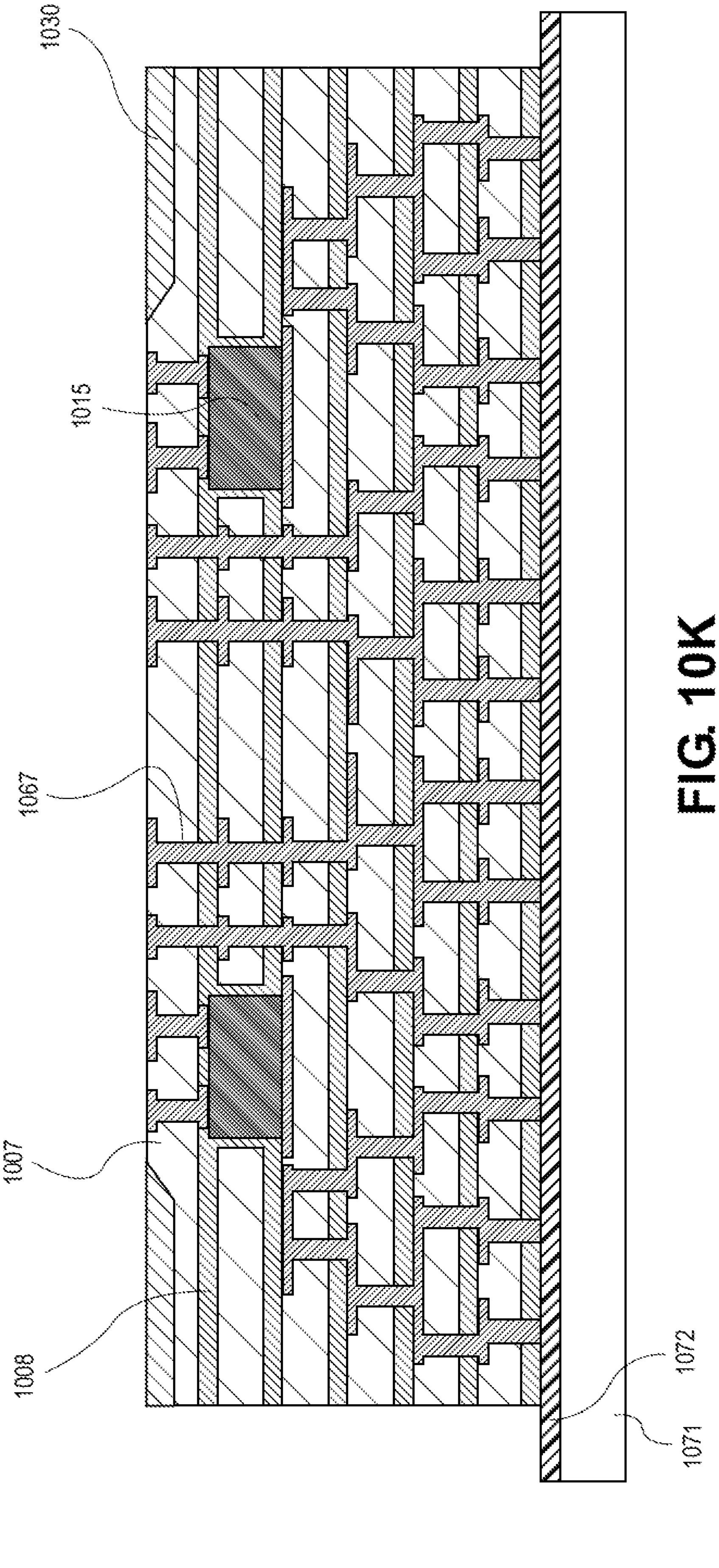
Figure 10L:
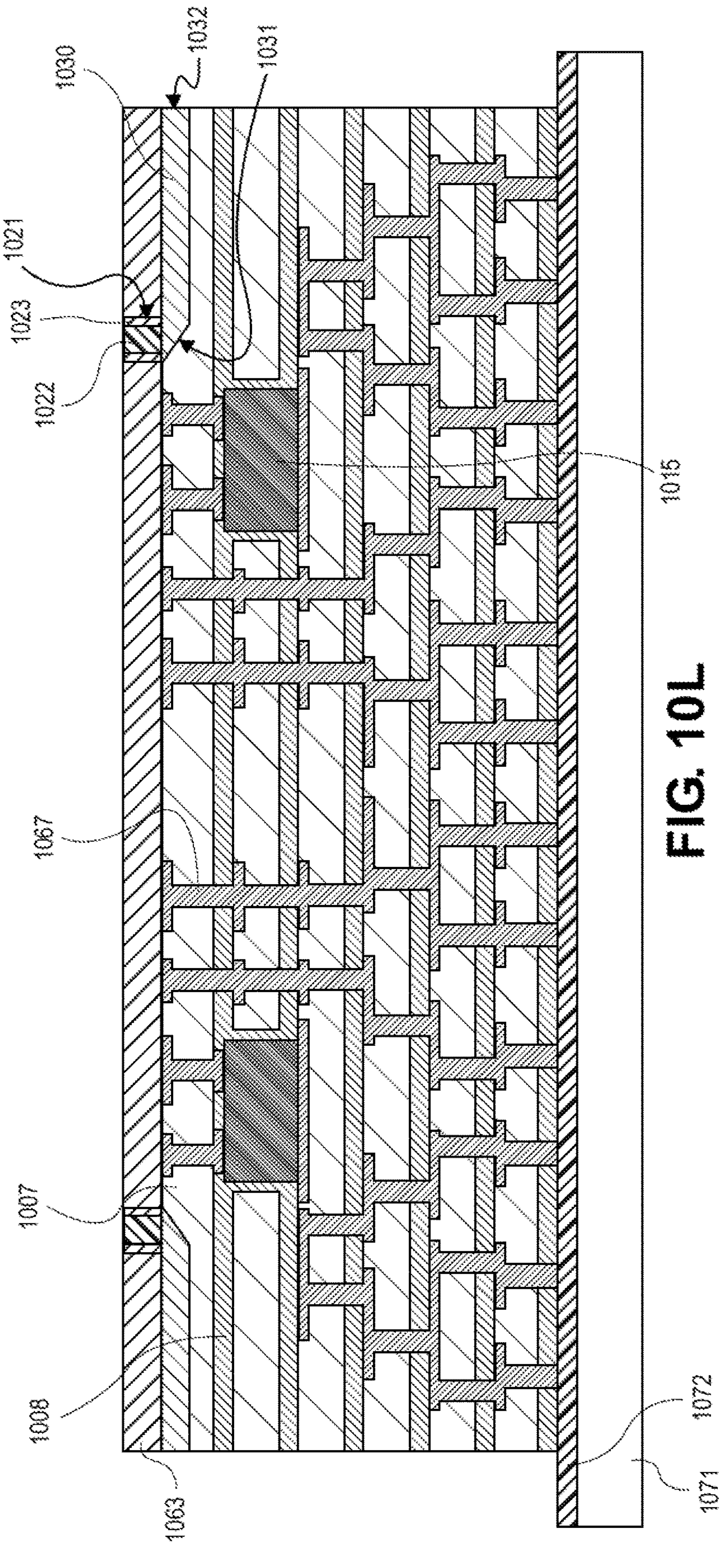
Figure 10M:
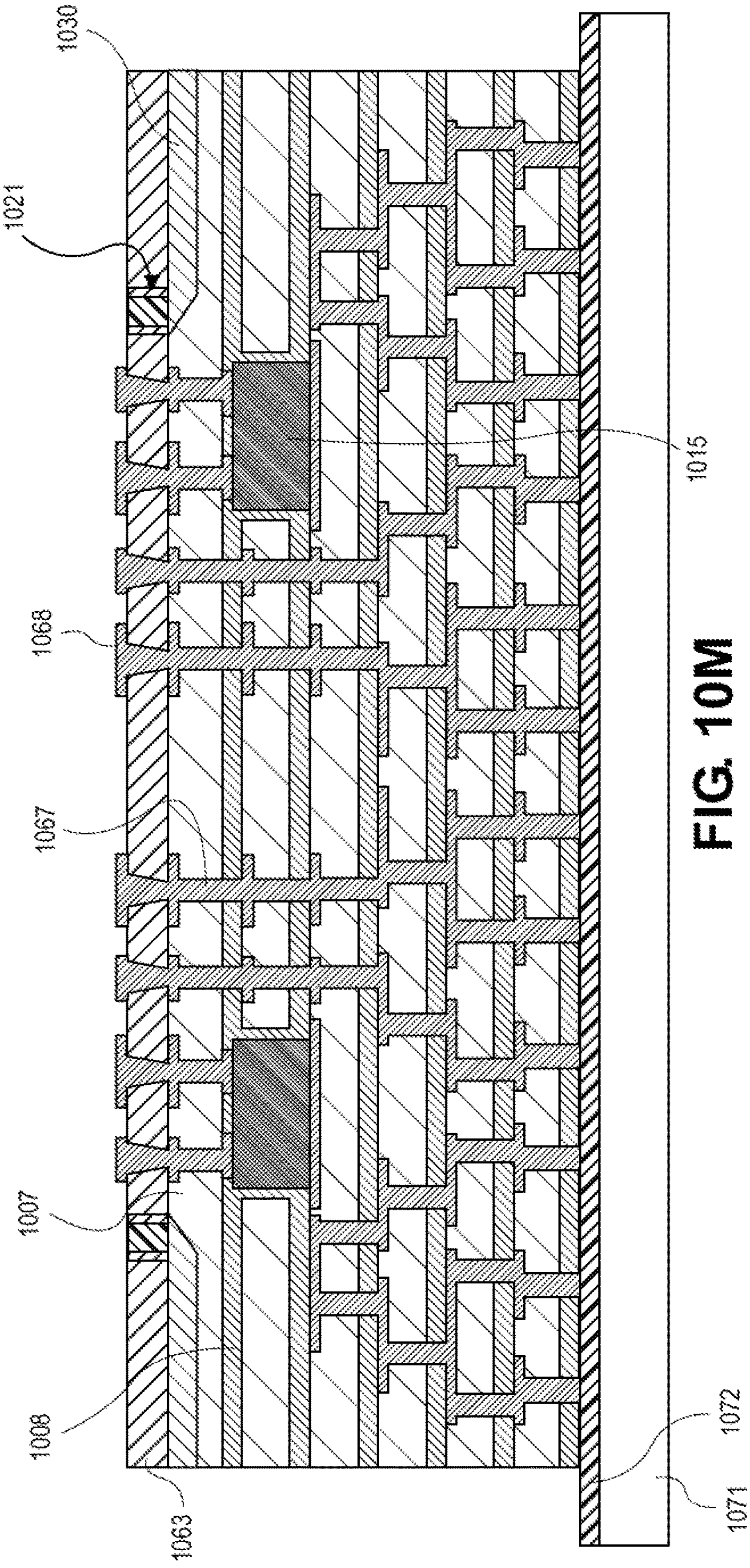
Figure 10N:
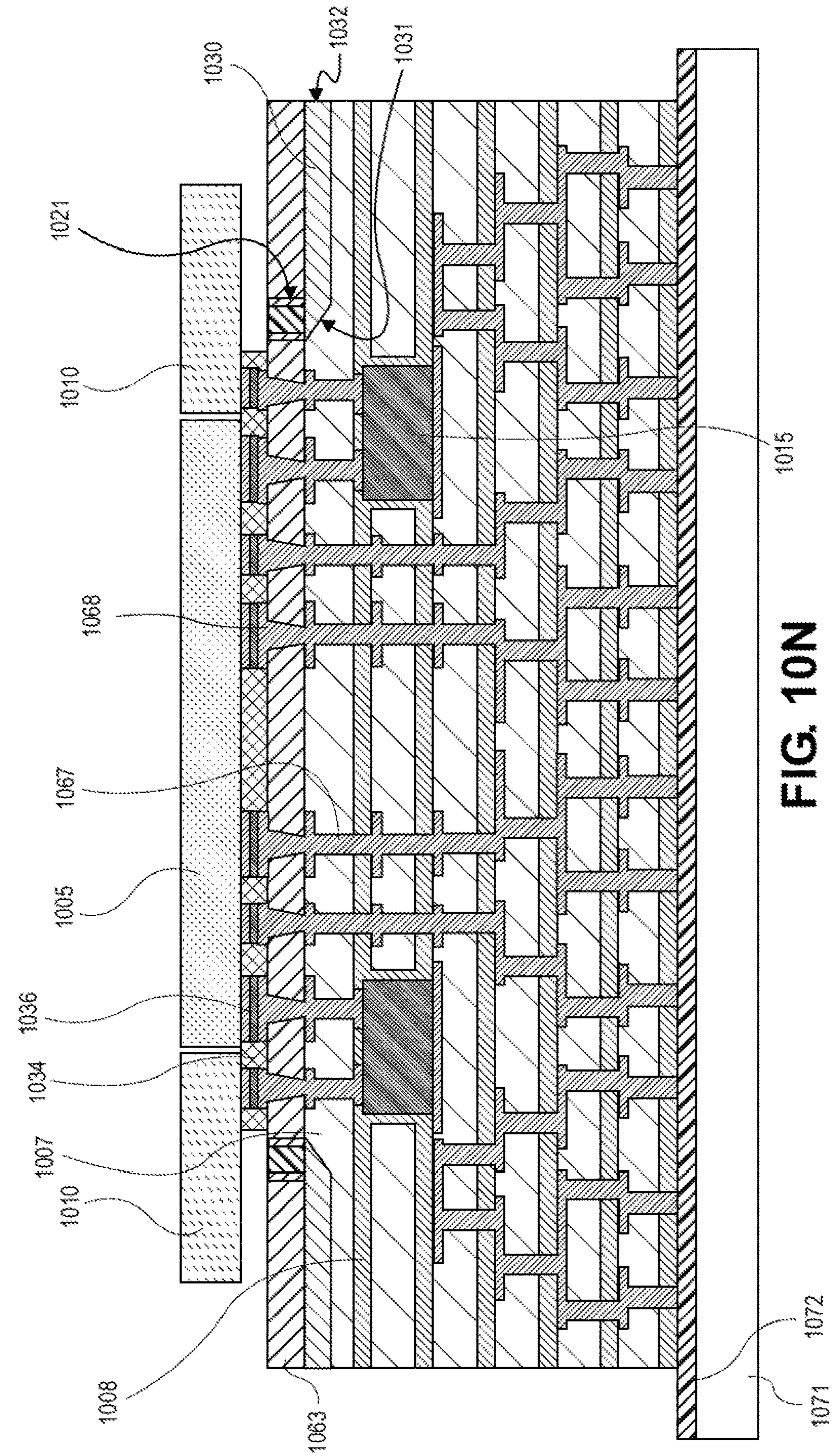
Figure 10O:
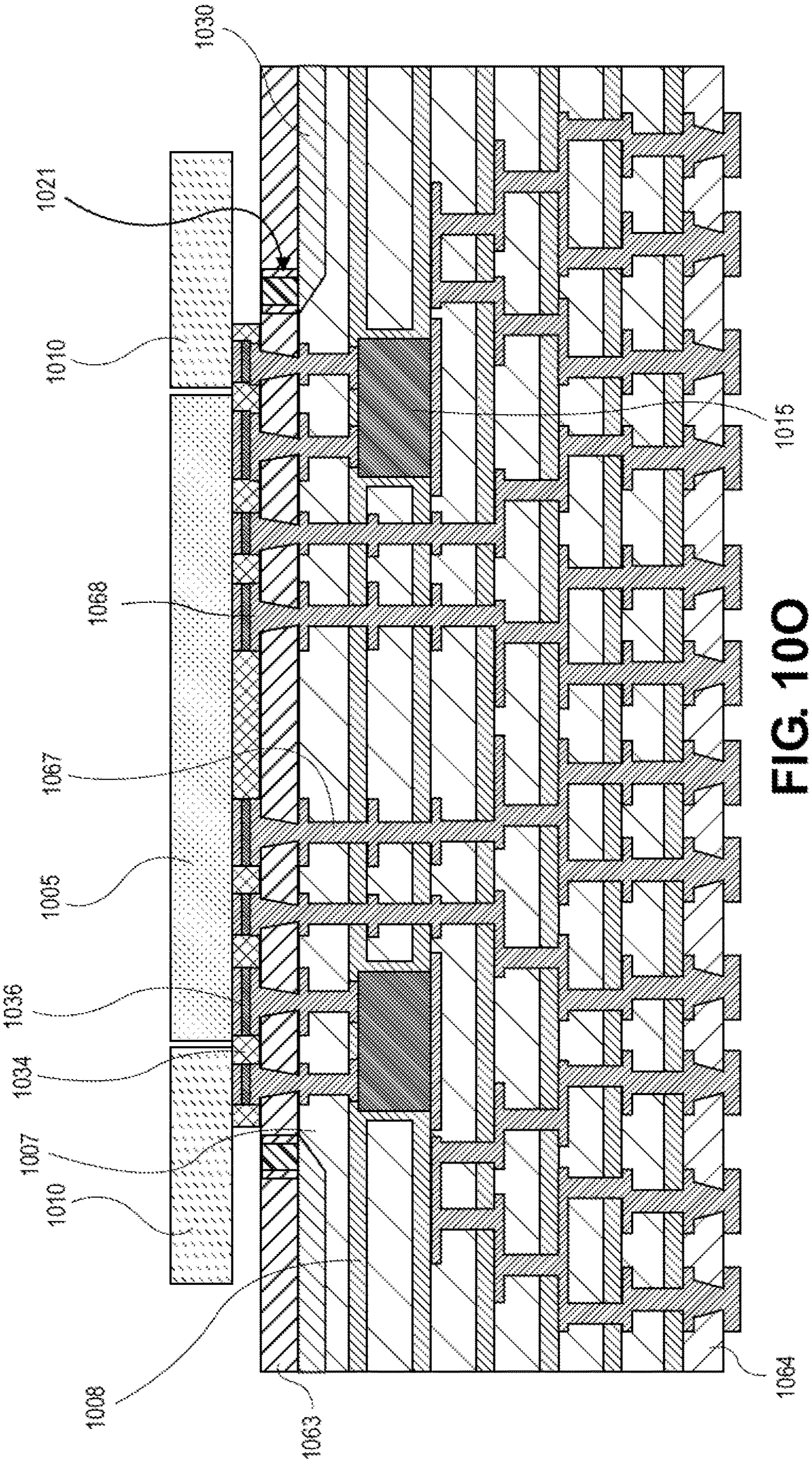
Figure 10P:
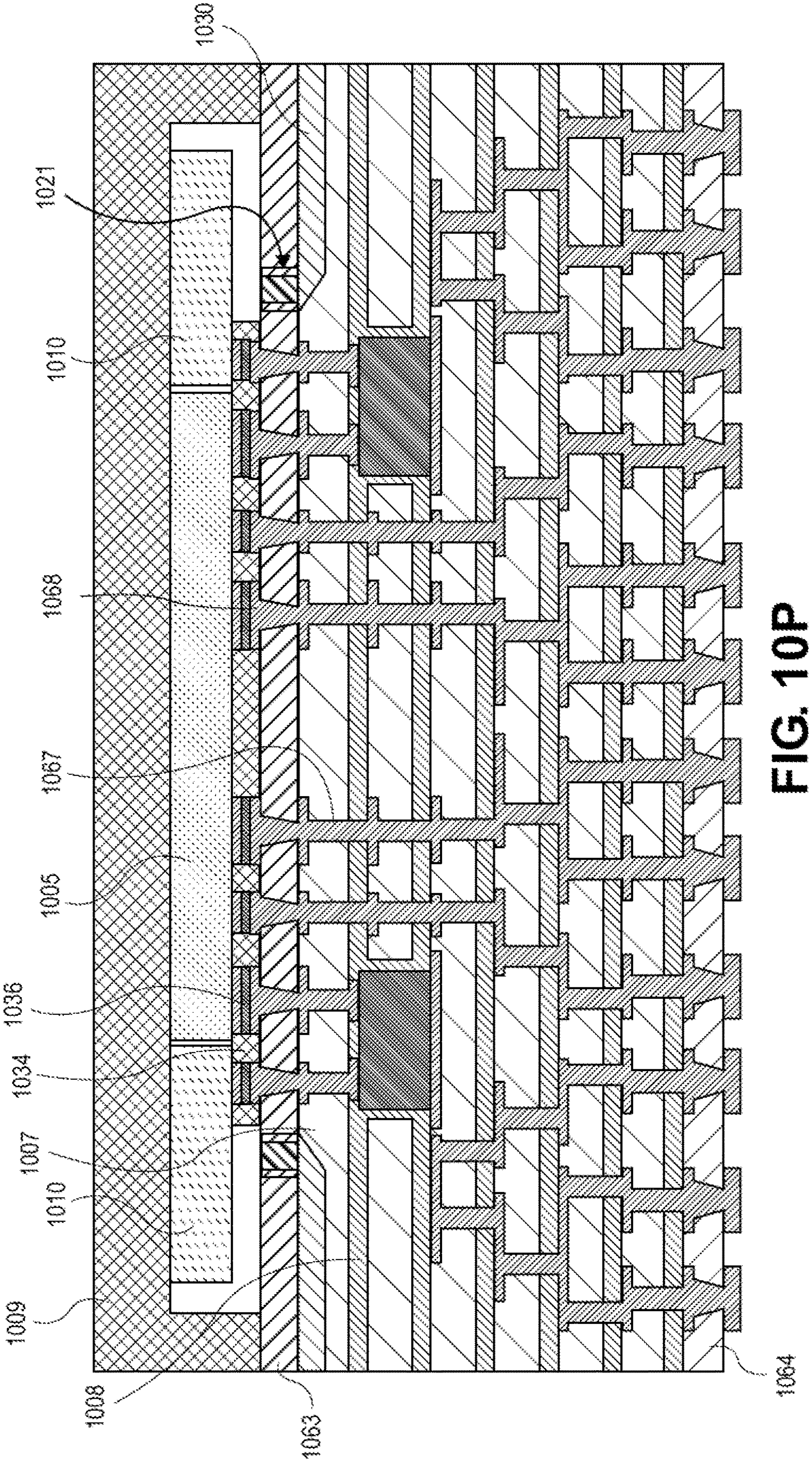

Referring now to FIGS. 10A-10P, a series of cross-sectional illustrations depicting a process for forming an optical package similar to the optical package 900 in FIG. 9B is shown, in accordance with an embodiment.

Referring now to FIG. 10A, a cross-sectional illustration of a first glass layer 1007 and a first dielectric layer 1008 over a carrier 1071 is shown, in accordance with an embodiment. In an embodiment, the glass layer 1007 may have a thickness that is approximately 40 μm or less. The dielectric layer 1008 may be an adhesive dielectric, such as a buildup film that can be approximately 5 μm thick. In an embodiment, the first dielectric layer 1008 may be adhered to the carrier 1071 by a temporary release layer 1072.

Referring now to FIG. 10B, a cross-sectional illustration of the structure after via opening 1073 are formed through the glass layer 1007 and the dielectric layer 1008 is shown, in accordance with an embodiment. In an embodiment, the via openings 1073 are formed with a laser drilling process, a dry etching process, and/or a wet etching process. In the case of a laser or dry etching process, the dielectric 1008 will also be drilled or etched through. In the case of a wet etching process, a second operation comprising a laser drill may be needed to open the vias openings 1073 through the underlying dielectric layer 1008. In an embodiment, a desmear operation may also be used to clean the via openings 1073.

Referring now to FIG. 10C, a cross-sectional illustration of the structure after surface trenches 1074 are formed into the top surface of the glass layer 1007 is shown, in accordance with an embodiment. A laser or chemical etching process may be used to form the surface trenches 1074. In an embodiment, the surface trenches 1074 may have a depth of approximately 15 μm.

Referring now to FIG. 10D, a cross-sectional illustration of the structure after a conductive material is filled into the via openings 1073 and the surface trenches 1074 is shown, in accordance with an embodiment. In an embodiment, a seed layer (not shown) is applied over the surfaces (e.g., with a sputtering process using titanium and/or copper). After the seed layer is formed, a standard electrolytic plating with lithography patterning is performed to fill the via openings 1073 and the surface trenches 1074. In an embodiment, a planarization process may be used after plating to ensure flat surfaces are provided.

Referring now to FIG. 10E, a cross-sectional illustration of the structure after a second glass layer 1007 is provided is shown, in accordance with an embodiment. The second glass layer 1007 may be adhered to the underlying glass layer 1007 by a dielectric layer 1008. Patterning and plating processes similar to those described in FIGS. 10B-10D may be implemented in order to provide conductive routing in the next layer.

Referring now to FIG. 10F, a cross-sectional illustration of the structure after multiple glass layers are laminated and patterned is shown, in accordance with an embodiment. The subsequent glass layers 1007 and dielectric layers 1008 may be patterned and plated using processes similar to those described in FIGS. 10B-10D. The topmost glass layer 1007 in FIG. 10F may be the layer in which the bridges (not shown) will be embedded.

Referring now to FIG. 10G, a cross-sectional illustration of the structure after via openings 1073 and surface trenches 1074 are formed into the topmost glass layer 1007 and dielectric layer 1008 is shown, in accordance with an embodiment. The via openings 1073 and the surface trenches 1074 may be formed with processes similar to those described with respect to FIGS. 10B and 10C.

Referring now to FIG. 10H, a cross-sectional illustration of the structure after the via openings 1073 and the surface trenches 1074 are filled with conductive material is shown, in accordance with an embodiment. The conductive features 1067 may be formed with a plating process similar to the process described above with respect to FIG. 10D.

Referring now to FIG. 10I, a cross-sectional illustration of the structure after bridges 1015 are embedded in a glass layer 1007 is shown, in accordance with an embodiment. In an embodiment, a trench is formed through a glass layer 1007 and the dielectric layer 1008. For example, the trench may be formed with a laser drilling process or an etching process. In an embodiment, the bridges 1015 are then placed in the trenches (e.g., with a pick and place process). A dielectric layer 1008 is then disposed over the glass layer 1007 and the bridges 1015. The dielectric layer 1008 may fill remaining portions of the trench. For example, as shown in FIG. 10I, dielectric material is provided between sidewalls of the bridge 1015 and the glass layer 1007. An additional glass layer 1007 may then be laminated over the dielectric layer 1008.

Referring now to FIG. 10J, a cross-sectional illustration of the structure after an optical waveguide 1030 is embedded in the topmost glass layer 1007 is shown, in accordance with an embodiment. In an embodiment, the optical waveguide 1030 is formed by first forming a trench in the surface of the glass layer 1007. The trench extends to an edge of the glass layer 1007. The trench may be created using a laser drilling process, a dry etching process, or a wet etching process. In an embodiment, the surfaces of the trench may be smooth (e.g., 70 nm RMS or lower) to prevent light scattering.

In an embodiment, the trench is filled with a paste printable high index of refraction epoxy resin, such as, but not limited to a polyimide, a polyalkane, a polycyanate, a diazobenzoquinone, a metal-centered (e.g., iron, aluminum, copper, etc.) dendrite polymer, a high-density polycarbonate, a polythiphene, a polythiadiazole, or a polysulfone. In an embodiment, the optical waveguide 1030 is in direct contact with the glass layer 1007. However, in other embodiments, a cladding layer (e.g., silver) may be provided between the optical waveguide 1030 and the glass layer 1007 to further improve efficiency by enabling total internal reflectance over a wide range of wavelengths, which results in very low attenuation. In some embodiments, a polishing process may be needed to remove excess resin from the top surface of the glass layer 1007. Additionally, while an in-built optical waveguide 1030 is described in FIG. 10J, it is to be appreciated that a prefabricated optical waveguide may also be inserted into the trench formed in the glass layer 1007. Such embodiments may allow for even higher efficiencies to be obtained.

In an embodiment, the optical waveguide 1030 comprises a first end 1031 and a second end 1032. The second end 1032 may be substantially coplanar with the edge of the glass layer 1007. In an embodiment, the first end 1031 may be sloped. For example, the slope may be approximately 45°. The slope of the first end 1031 allows for optical signals coming into the optical waveguide 1030 from above the first end 1031 to be reflected towards the second end 1032.

Referring now to FIG. 10K, a cross-sectional illustration of the structure after conductive connections to the bridges 1015 are formed is shown, in accordance with an embodiment. In an embodiment, the conductive features 1067 to the bridges 1015 may be formed with patterning and plating processes, such as those described above.

Referring now to FIG. 10L, a cross-sectional illustration of the structure after a solder resist layer 1063 is disposed over the topmost glass layer 1007 is shown, in accordance with an embodiment. In an embodiment, an optical path 1021 is formed through the solder resist layer 1063 above the first end 1031 of the optical waveguide 1030. The optical path 1021 may be filled in some embodiments. For example, the optical path 1021 may be filled with a cladding 1023 and a core 1022. Cladding 1023 ensures low roughness (e.g., approximately 70 nm RMS or lower) that minimizes light scattering. Standard cladding 1023 and core 1022 materials may be used, such as, but not limited to low-density versions of polyimides, polyalkanes, polycyanates, polyacrylates, polysiloxanes, and thin metal layers, such as copper, silver, gold, and aluminum. Additionally, polyperflurocarbon polymers may be used as the cladding 1023.

Referring now to FIG. 10M, a cross-sectional illustration of the structure after conductive routing through the solder resist layer 1063 is formed is shown, in accordance with an embodiment. In an embodiment, vias and pads 1068 may be formed through and over the solder resist layer 1063 using standard patterning and plating processes. In an embodiment, the optical paths 1021 are protected by a mask layer (not shown) during formation of the conductive features in the solder resist layer 1063.

Referring now to FIG. 10N, a cross-sectional illustration of the structure after the compute die 1005 and the photonics dies 1010 are attached to the pads 1068 is shown, in accordance with an embodiment. The compute die 1005 and the photonics dies 1010 may be attached to the pads 1068 using FLIs 1036. In an embodiment, the FLIs 1036 are surrounded by an underfill 1034. The underfill 1034 may be blocked from flowing over the optical paths 1021 by a dam (not shown) or the like. As shown, the photonics die 1010 is entirely within a footprint of the glass layers 1007. That is, no portion of the photonics die 1010 overhangs an edge of the glass layers 1007.

Referring now to FIG. 10O, a cross-sectional illustration of the structure after the carrier is removed and backside processing is implemented is shown, in accordance with an embodiment. In an embodiment, the structure is transferred to a second carrier (not shown) that is attached to the topside of the structure during backside processing. In an embodiment, backside processing includes the formation of a second solder resist layer 1064 over the bottommost dielectric layer 1008. Conductive features (e.g., vias, pads, etc.) are then formed through and/or over the solder resist layer 1064 using standard packaging patterning and plating processes.

Referring now to FIG. 10P, a cross-sectional illustration of the structure after an IHS 1009 is attached is shown, in accordance with an embodiment. In an embodiment, the IHS 1009 may be thermally coupled to the photonics dies 1010 and the compute die 1005 by a TIM (not shown). In an embodiment, the IHS 1009 is connected to the solder resist layer 1063.

Referring now to FIGS. 11A-11G, a series of cross-sectional illustrations depicting a process for forming an optical package similar to the optical package 900 in FIG. 9C is shown, in accordance with an additional embodiment. The optical package in FIGS. 11A-11G is similar to the optical package in FIGS. 10A-10P, with the exception of the conductive routing between the photonics dies and the compute die being implemented with high-density routing instead of an embedded bridge.

Figure 11A:
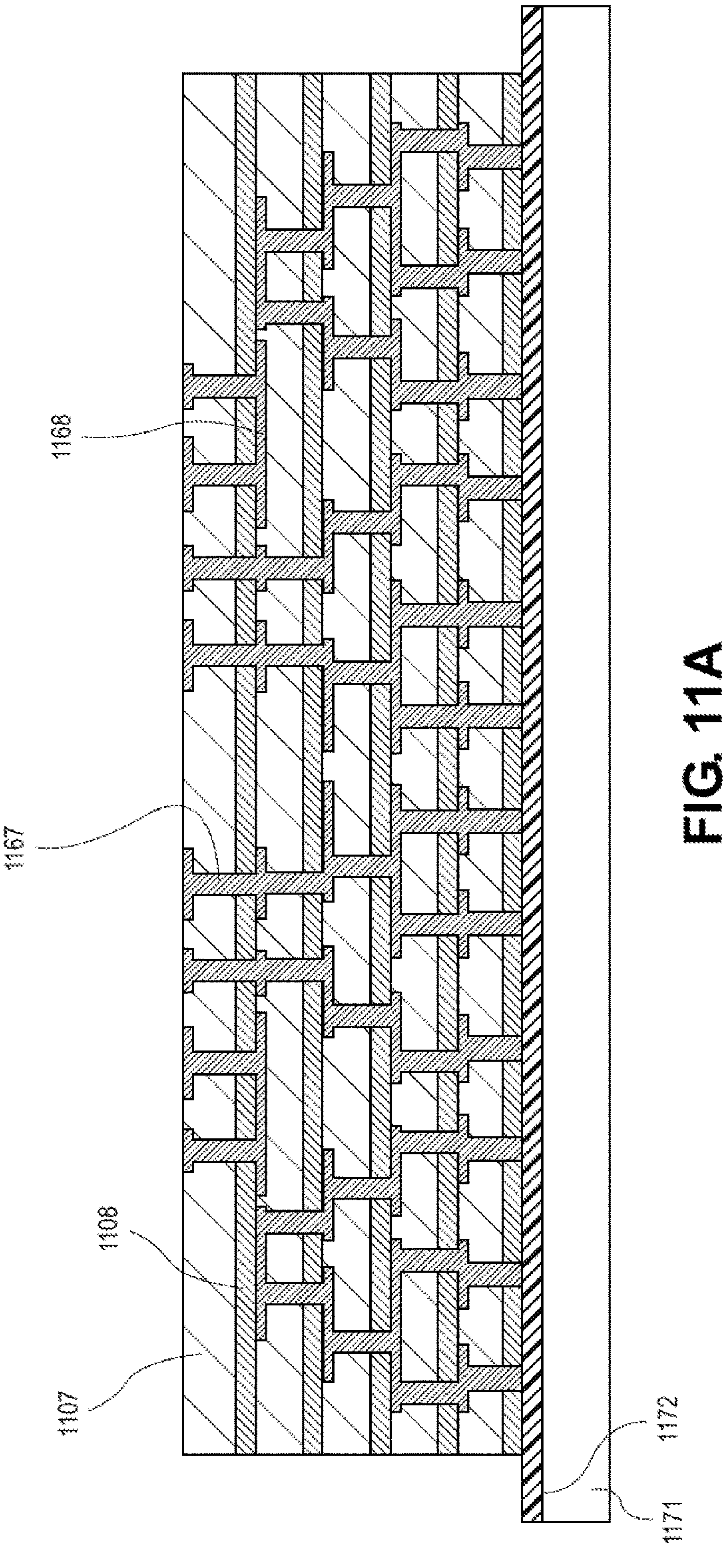
FIGS. 11A-11G are cross-sectional illustrations of a process for forming an optical package with a multi-layer glass substrate with an embedded optical waveguide, in accordance with an embodiment.

Referring now to FIG. 11A, a cross-sectional illustration of a structure with a plurality of glass layers 1107 and dielectric layers 1108 over a carrier 1171 is shown, in accordance with an embodiment. In an embodiment, the bottommost dielectric layer 1108 is adhered to the carrier by a temporary release layer 1172. Conductive routing 1167 is provided through the dielectric layers 1108 and the glass layers 1107. The conductive routing 1167 may be formed with patterning and plating processes, such as those described above in FIGS. 10A-10P.

In an embodiment, the conductive routing 1167 may further comprise high-density routing 1168. The high-density routing 1168 may be fabricated to provide electrical coupling between the photonics dies and the compute die. High-density routing 1168 is made possible by the high dimensional stability and coplanarity provided by the use of glass layers 1107.

Figure 11B:
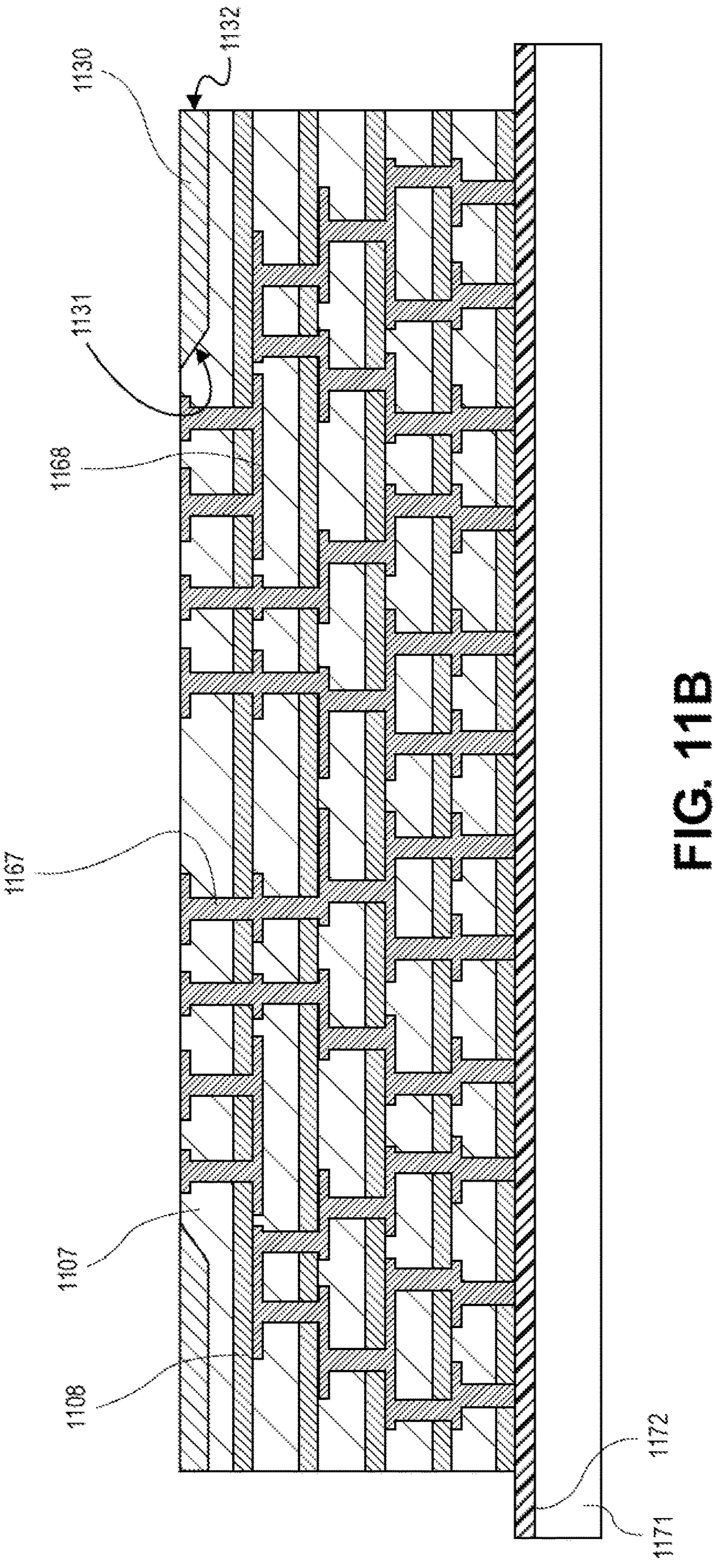

Referring now to FIG. 11B, a cross-sectional illustration of the structure after the formation of optical waveguides 1130 is shown, in accordance with an embodiment. In an embodiment, the optical waveguide 1130 is formed by first forming a trench in the surface of the glass layer 1107. The trench extends to an edge of the glass layer 1107. The trench may be created using a laser drilling process, a dry etching process, or a wet etching process. In an embodiment, the surfaces of the trench may be smooth (e.g., 70 nm RMS or lower) to prevent light scattering.

In an embodiment, the trench is filled with a paste printable high index of refraction epoxy resin, such as, but not limited to a polyimide, a polyalkane, a polycyanate, a diazobenzoquinone, a metal-centered (e.g., iron, aluminum, copper, etc.) dendrite polymer, a high-density polycarbonate, a polythiphene, a polythiadiazole, or a polysulfone. In an embodiment, the optical waveguide 1130 is in direct contact with the glass layer 1107. However, in other embodiments, a cladding layer (e.g., silver) may be provided between the optical waveguide 1130 and the glass layer 1107 to further improve efficiency by enabling total internal reflectance over a wide range of wavelengths, which results in very low attenuation. In some embodiments, a polishing process may be needed to remove excess resin from the top surface of the glass layer 1107. Additionally, while an in-built optical waveguide 1130 is described in FIG. 11B, it is to be appreciated that a prefabricated optical waveguide 1130 may also be inserted into the trench formed in the glass layer 1107. Such embodiments may allow for even higher efficiencies to be obtained.

In an embodiment, the optical waveguide 1130 comprises a first end 1131 and a second end 1132. The second end 1132 may be substantially coplanar with the edge of the glass layer 1107. In an embodiment, the first end 1131 may be sloped. For example, the slope may be approximately 45°. The slope of the first end 1131 allows for optical signals coming into the optical waveguide 1130 from above the first end 1131 to be reflected towards the second end 1132.

Figure 11C:
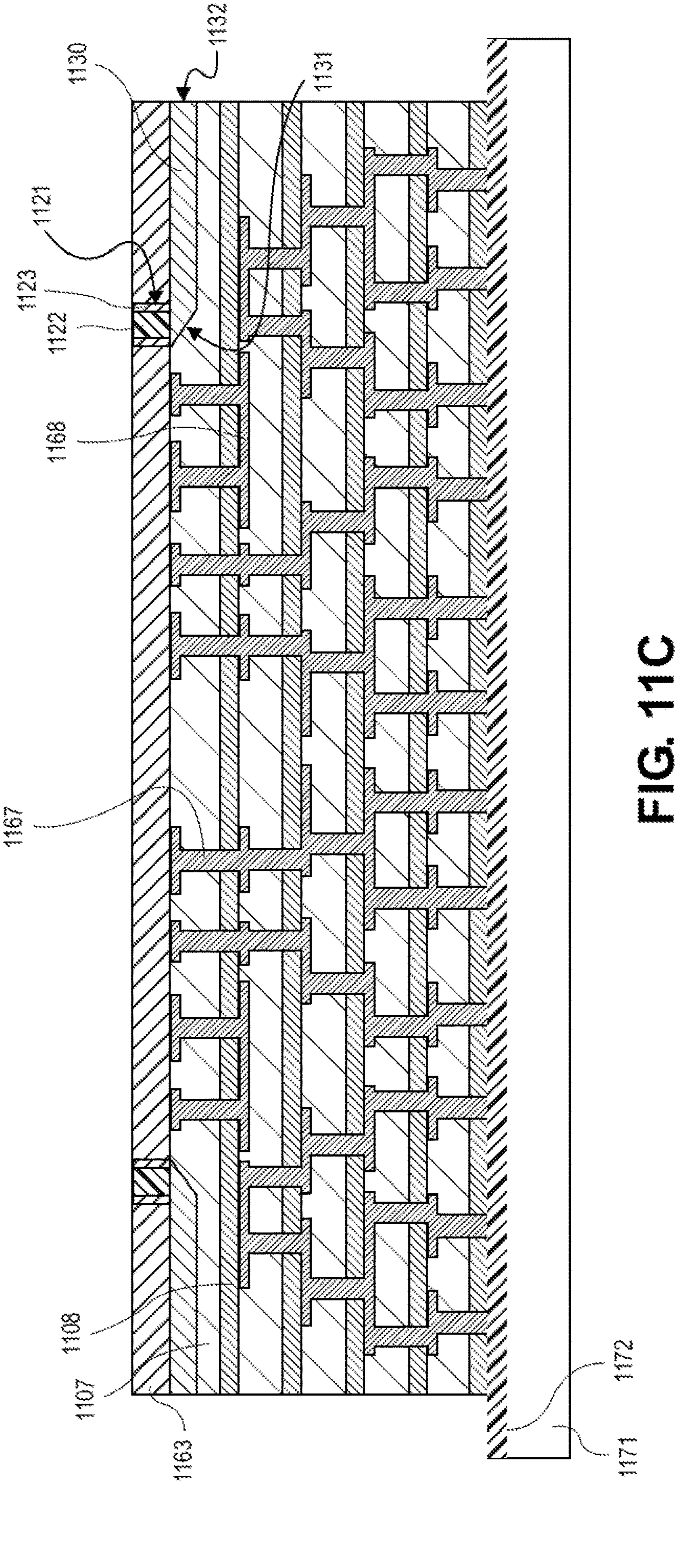

Referring now to FIG. 11C, a cross-sectional illustration of the structure after a solder resist layer 1163 is disposed over the topmost glass layer 1107 is shown, in accordance with an embodiment. In an embodiment, an optical path 1121 is formed through the solder resist layer 1163 above the first end 1131 of the optical waveguide 1130. The optical path 1121 may be filled in some embodiments. For example, the optical path 1121 may be filled with a cladding 1123 and a core 1122. Cladding 1123 ensures low roughness (e.g., approximately 70 nm RMS or lower) that minimizes light scattering. Standard cladding 1123 and core 1122 materials may be used, such as, but not limited to low-density versions of polyimides, polyalkanes, polycyanates, polyacrylates, polysiloxanes, and thin metal layers, such as copper, silver, gold, and aluminum. Additionally, polyperflurocarbon polymers may be used as the cladding 1123.

Figure 11D:
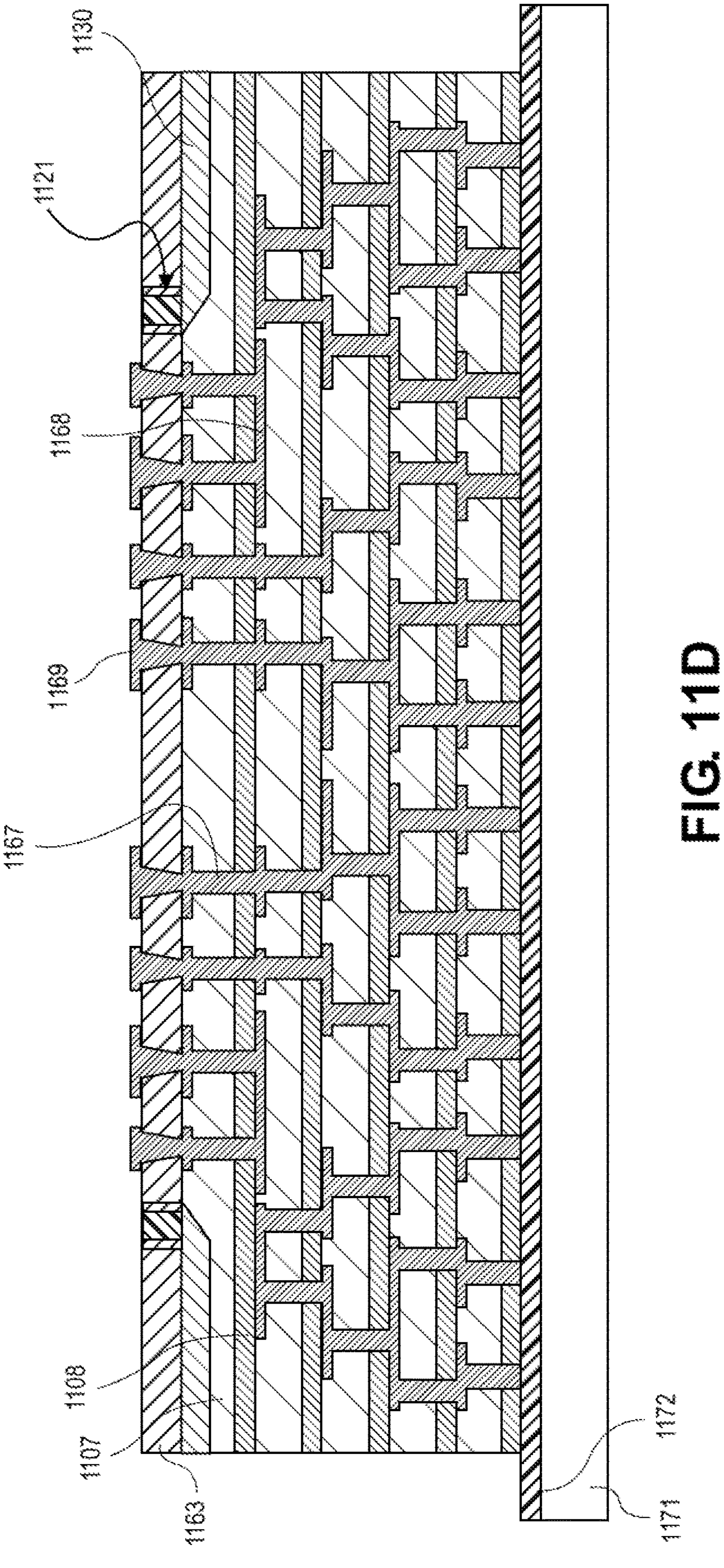

Referring now to FIG. 11D, a cross-sectional illustration of the structure after conductive routing through the solder resist layer 1163 is formed is shown, in accordance with an embodiment. In an embodiment, vias and pads 1169 may be formed through and over the solder resist layer 1163 using standard patterning and plating processes. In an embodiment, the optical paths 1121 are protected by a mask layer (not shown) during formation of the conductive features in the solder resist layer 1163.

Figure 11E:
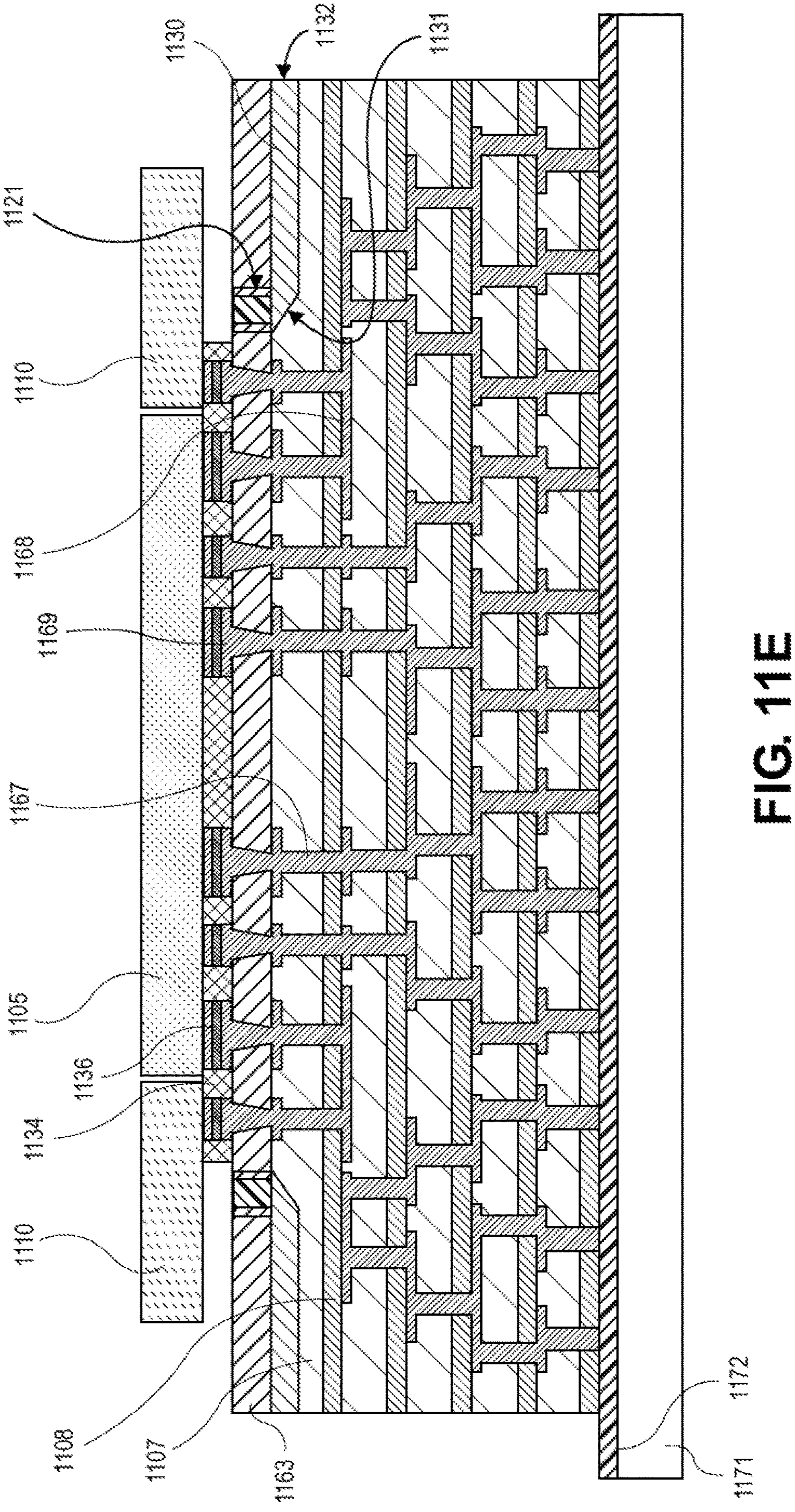

Referring now to FIG. 11E, a cross-sectional illustration of the structure after the compute die 1105 and the photonics dies 1110 are attached to the pads 1169 is shown, in accordance with an embodiment. The compute die 1105 and the photonics dies 1110 may be attached to the pads 1169 using FLIs 1136. In an embodiment, the FLIs 1136 are surrounded by an underfill 1134. The underfill 1134 may be blocked from flowing over the optical paths 1121 by a dam (not shown) or the like. As shown, the photonics die 1110 is entirely within a footprint of the glass layers 1107. That is, no portion of the photonics die 1110 overhangs an edge of the glass layers 1107.

Figure 11F:
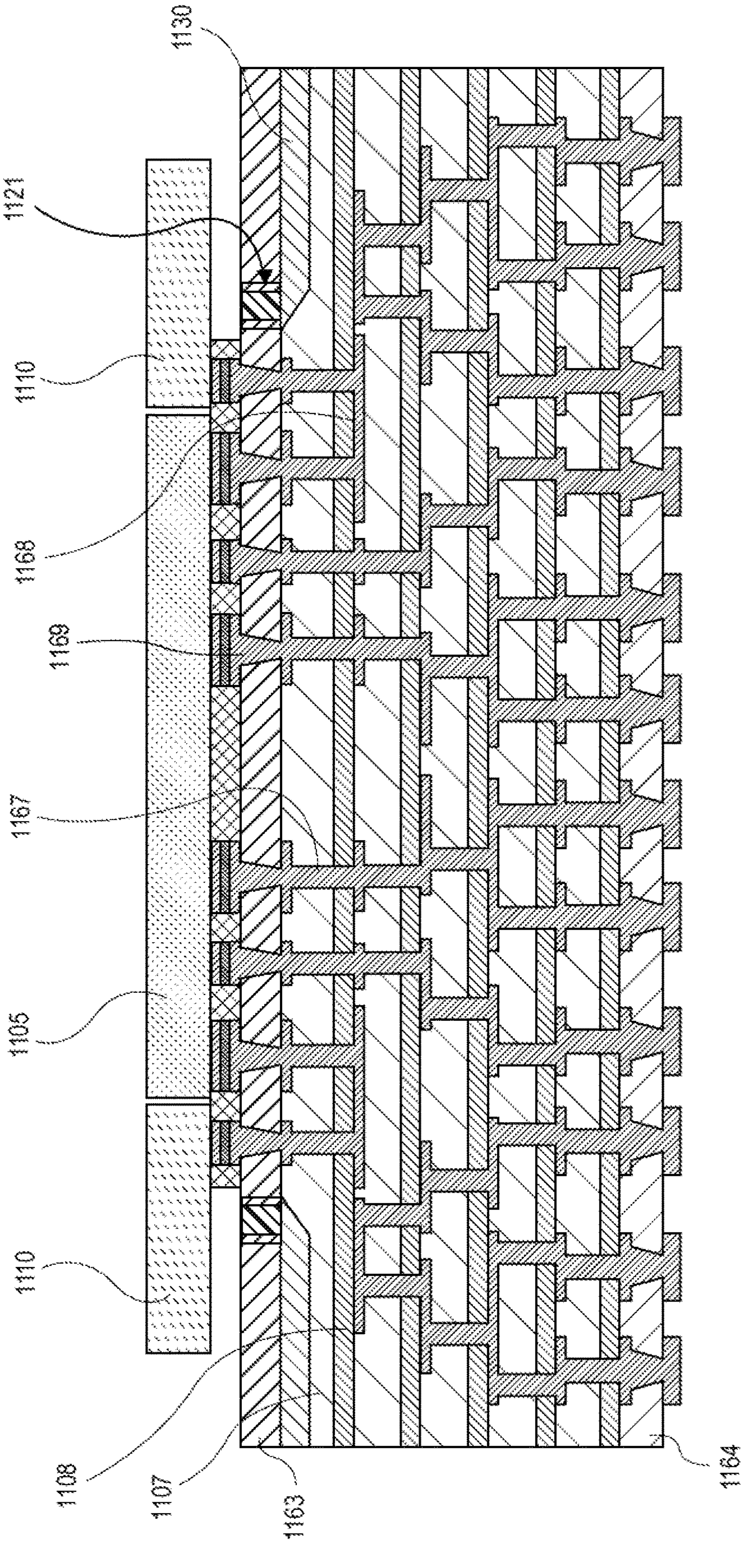

Referring now to FIG. 11F, a cross-sectional illustration of the structure after the carrier is removed and backside processing is implemented is shown, in accordance with an embodiment. In an embodiment, the structure is transferred to a second carrier (not shown) that is attached to the topside of the structure during backside processing. In an embodiment, backside processing includes the formation of a second solder resist layer 1164 over the bottommost dielectric layer 1108. Conductive features (e.g., vias, pads, etc.) are then formed through and/or over the solder resist layer 1164 using standard packaging patterning and plating processes.

Figure 11G:
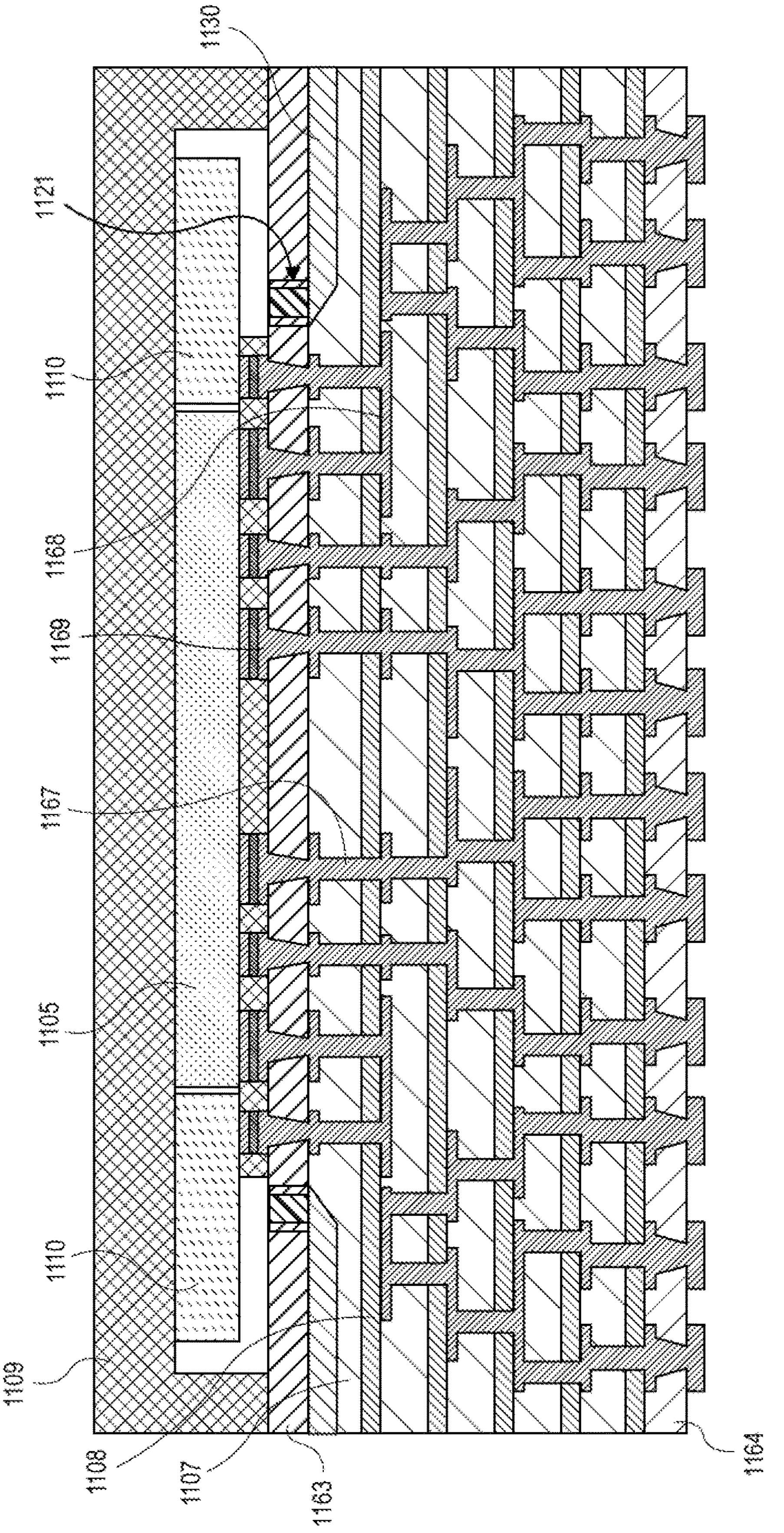

Referring now to FIG. 11G, a cross-sectional illustration of the structure after an IHS 1109 is attached is shown, in accordance with an embodiment. In an embodiment, the IHS 1109 may be thermally coupled to the photonics dies 1110 and the compute die 1105 by a TIM (not shown). In an embodiment, the IHS 1109 is connected to the solder resist layer 1163.

Figure 12:
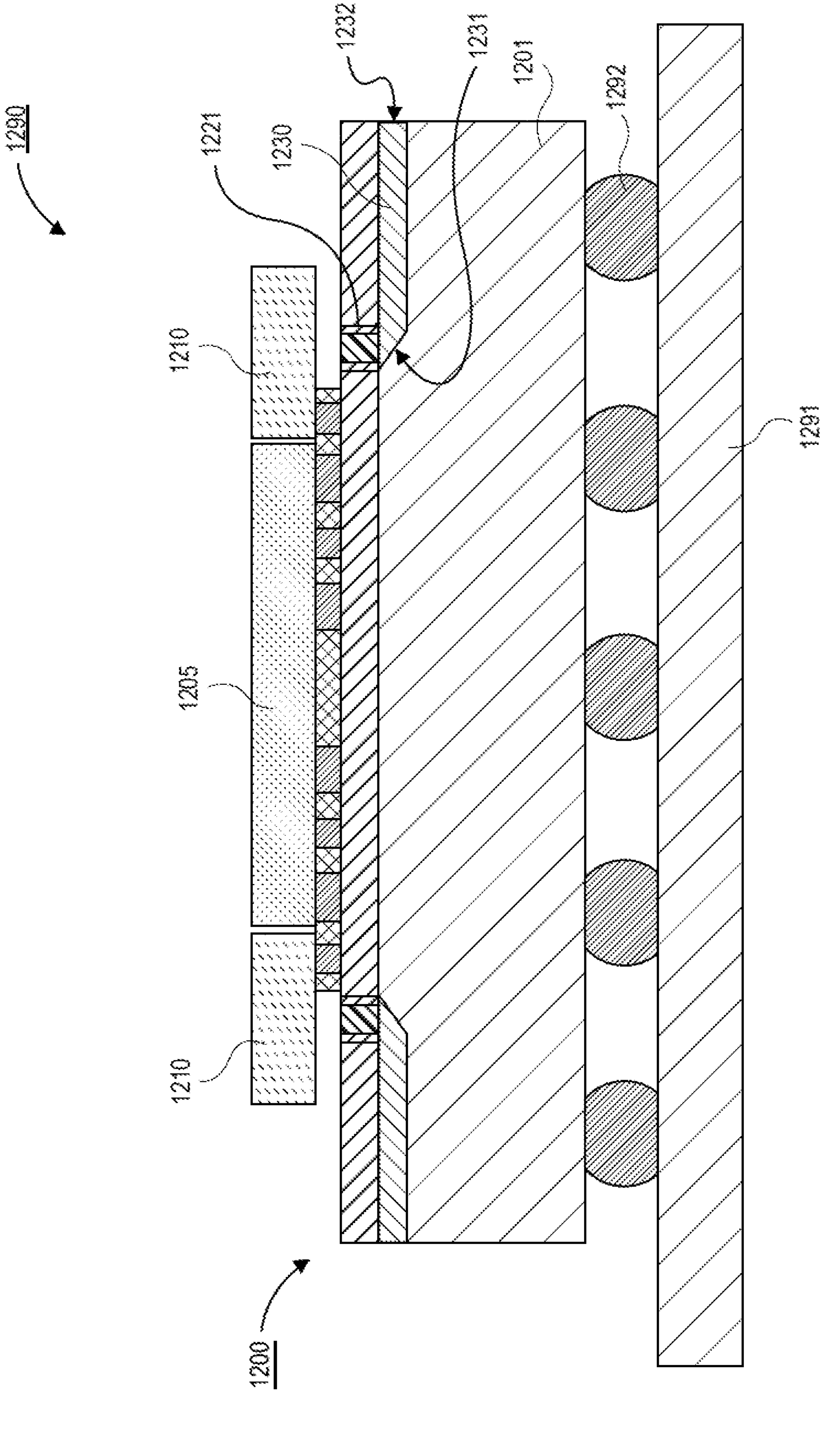
FIG. 12 is a cross-sectional illustration of an optical system with optical waveguides embedded in a package substrate, in accordance with an embodiment.

Referring now to FIG. 12, an optical system 1290 is shown, in accordance with an embodiment. In an embodiment, the optical system 1290 comprises a board 1291, such as a printed circuit board (PCB) or the like. In an embodiment, an optical package 1200 is attached to the board 1291 by interconnects 1292, such as solder balls, sockets or the like. In an embodiment, the optical package 1200 comprises a compute die 1205 and photonics dies 1210 that are attached to a package substrate 1201. In an embodiment, the package substrate 1201 may be substantially similar to any of the package substrates above (e.g., organic package substrates, package substrates with glass layers, or a glass patch over an organic substrate). In an embodiment, the photonics dies 1210 are entirely within a footprint of the package substrate 1201. That is, the photonics dies 1210 do not overhang any edge of the package substrate 1201. In an embodiment, the photonics dies 1210 may be communicatively coupled to the compute die by interconnects (not shown) in the package substrate 1201. For example, the interconnects may comprise a high-density routing layer or an embedded bridge.

In an embodiment, optical waveguides 1230 are embedded in the package substrate 1201. A first end 1231 is below the photonics die 1210, and a second end 1232 is at the edge of the package substrate 1201. An optical path 1221 through a solder resist layer provides optical coupling from the first end 1231 of the optical waveguide 1230 to the photonics die 1210. In some embodiments, the optical waveguide 1230 is an in-built optical waveguide 1230. In other embodiments, the optical waveguide 1230 is a discrete optical waveguide 1230 that is embedded in the package substrate 1201. While shown without lenses, in some embodiments, a lens may be between the optical path 1221 and the photonics die 1210 and/or at the second end 1232 of the optical waveguide 1230.

Referring now to FIGS. 13A-15C, a series of cross-sectional illustrations of an optical package is shown, in accordance with additional embodiments. In the illustrated embodiments, the photonics die is directly coupled to the compute die. That is, instead of relying on an embedded bridge or high-density routing in the package substrate, the routing is provided on the photonics die. For example, FLIs between the photonics die and the compute die provide the electrical coupling between the photonics die and the compute die. As such, the complexity of the package substrate is reduced.

The optical coupling to the photonics die may be implemented with various architectures. In one embodiment, a grating coupler is provided on the photonics die to allow for incoming optical signals from above to be routed to the photonics module for converting optical signals to electrical signals. In an alternative embodiment, a V-groove architecture is used to align an optical fiber to the photonics module for converting optical signals to electrical signals.

Figure 13A:
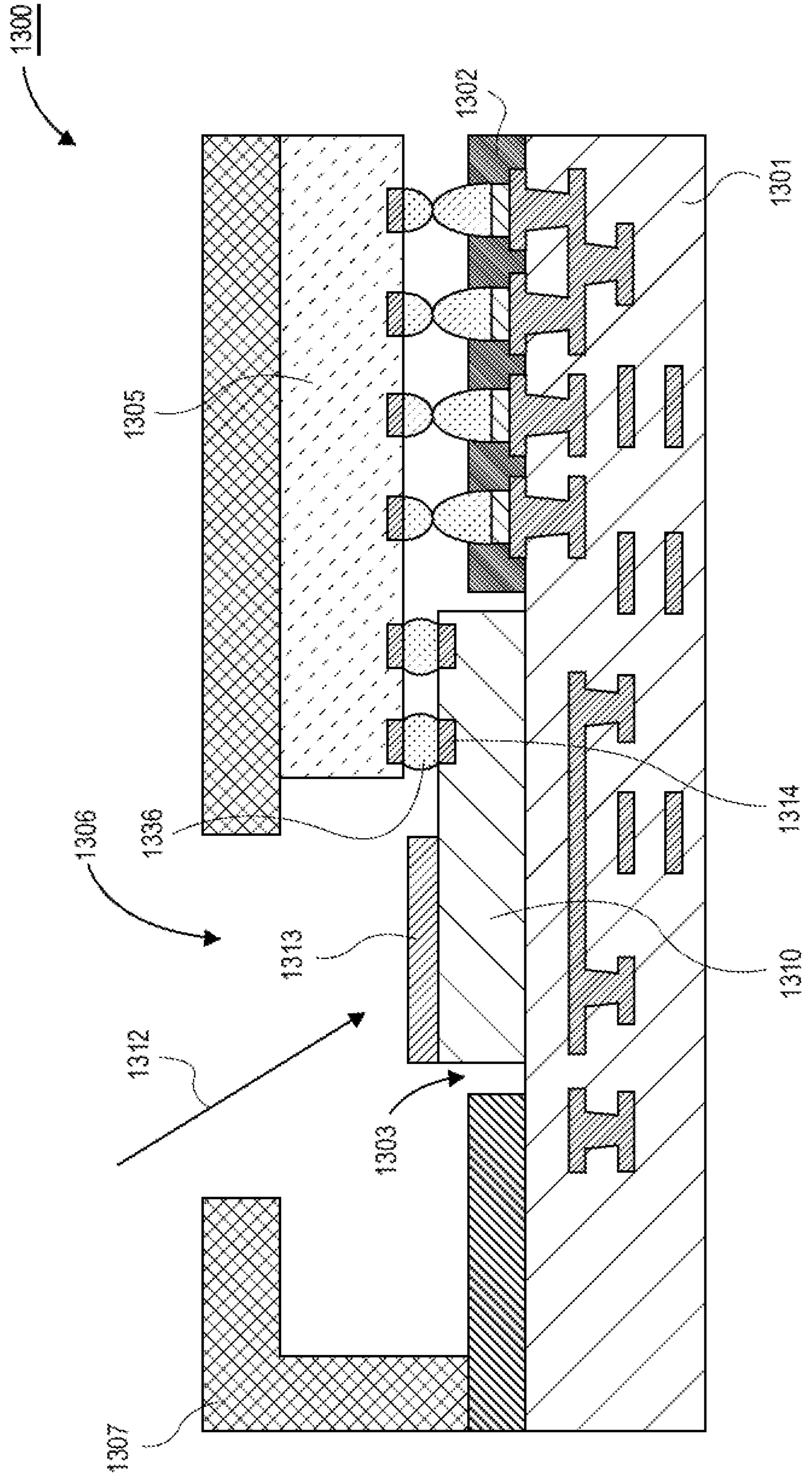
FIG. 13A is a cross-sectional illustration of an optical package with a photonics die directly coupled to a compute die, in accordance with an embodiment.

Referring now to FIG. 13A, a cross-sectional illustration of an optical package 1300 is shown, in accordance with an embodiment. In an embodiment, the optical package 1300 comprises a package substrate 1301. The package substrate 1301 may be an organic package substrate that comprises conductive routing. In an embodiment, a solder resist layer 1302 is provided over the package substrate 1301. A channel 1303 may be provided in the solder resist layer 1302. The channel 1303 may be sized to receive a photonics die 1310. Such a configuration may sometimes be referred to as an open cavity architecture. In an embodiment, the package substrate 1301 may be coupled to a board (not shown).

In an embodiment, the photonics die 1310 may comprise a photonics module 1313. The photonics module 1313 may comprise features suitable for receiving or transmitting an optical signal and features for converting between optical and electrical signals. In the illustrated embodiment, the photonics module 1313 is configured to receive incoming optical signals 1312 from above. For example, the incoming optical signal 1312 may pass through an opening 1306 in an IHS 1307.

In an embodiment, the photonics die 1310 is directly coupled to the compute die 1305. For example, FLIs 1336 may be provided on pads 1314 of the photonics die 1310. That is, the photonics die 1310 may be coupled to the compute die 1305 without the need for an embedded bridge or high-density routing. In such instances, an electrical signal generated by the photonics module 1313 may be transmitted to the compute die 1305 without passing through the package substrate 1301. In order to allow for such direct coupling, a footprint of the compute die 1305 may at least partially overlap a footprint of the photonics die.

Figure 13B:
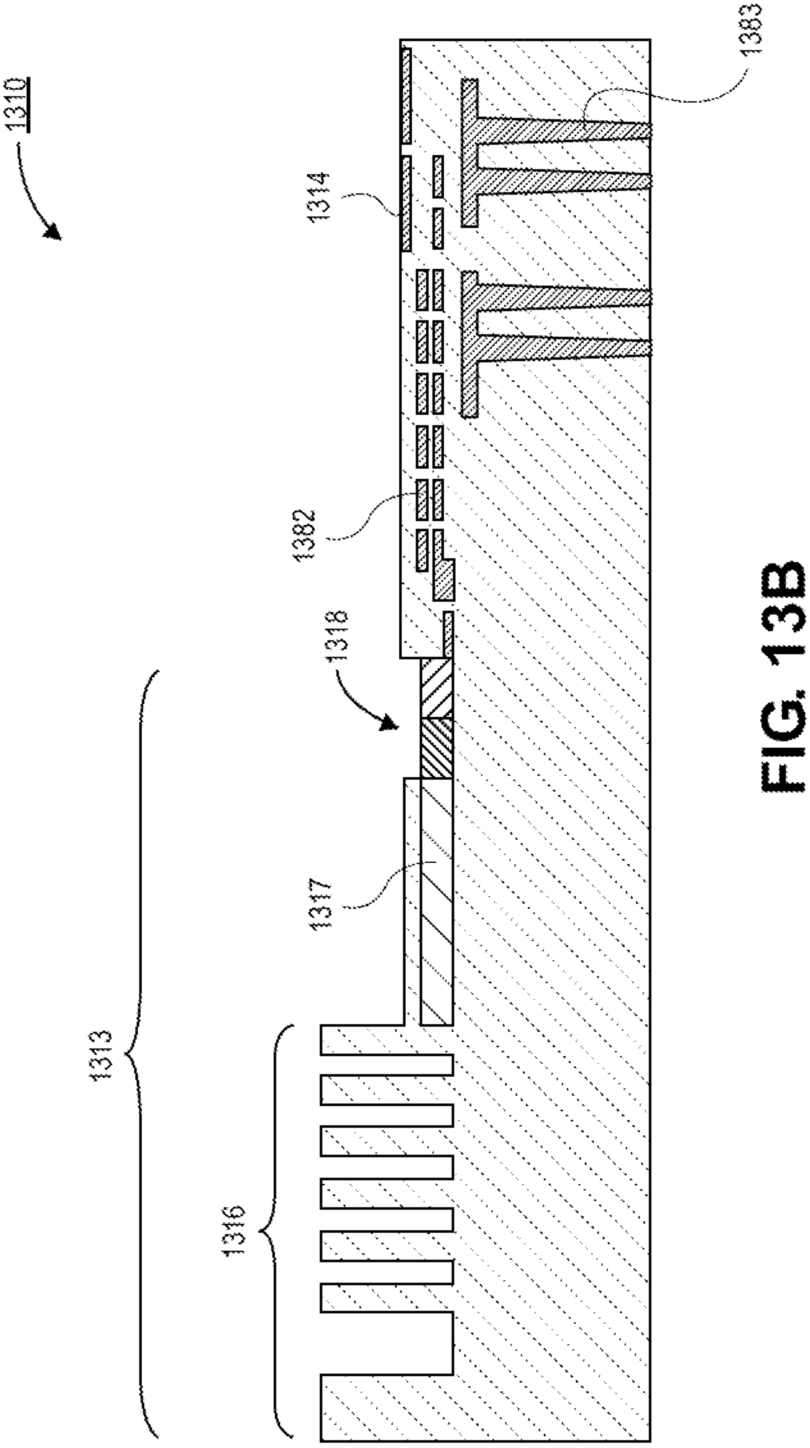
FIG. 13B is a cross-sectional illustration of a photonics die with a grating coupler, in accordance with an embodiment.

Referring now to FIG. 13B, a cross-sectional illustration of the photonics die 1310 is shown, in accordance with an embodiment. In an embodiment, the photonics die 1310 may comprise a semiconductor substrate, such as silicon. In order to receive incoming optical signals from above, the photonics module 1313 may comprise a grating coupler 1316. The grating coupler 1316 may be optically coupled to a group III-V heterojunction 1318 by an optical waveguide 1317. The group III-V heterojunction 1318 may allow for the conversion of an optical signal to an electrical signal. In an embodiment, the electrical signal is routed to pads 1314 through conductive routing 1382 embedded in the substrate. The conductive routing 1382 may be high-density routing in order to enable pads 1314 that are suitable for forming FLIs with the compute die 1305.

In some embodiments, through substrate vias 1383 may be provide through all, or a portion of the thickness of the photonics die 1310. The through substrate vias 1383 may be used to provide power to the overlying compute die (not shown in FIG. 13B).

Figure 14A:
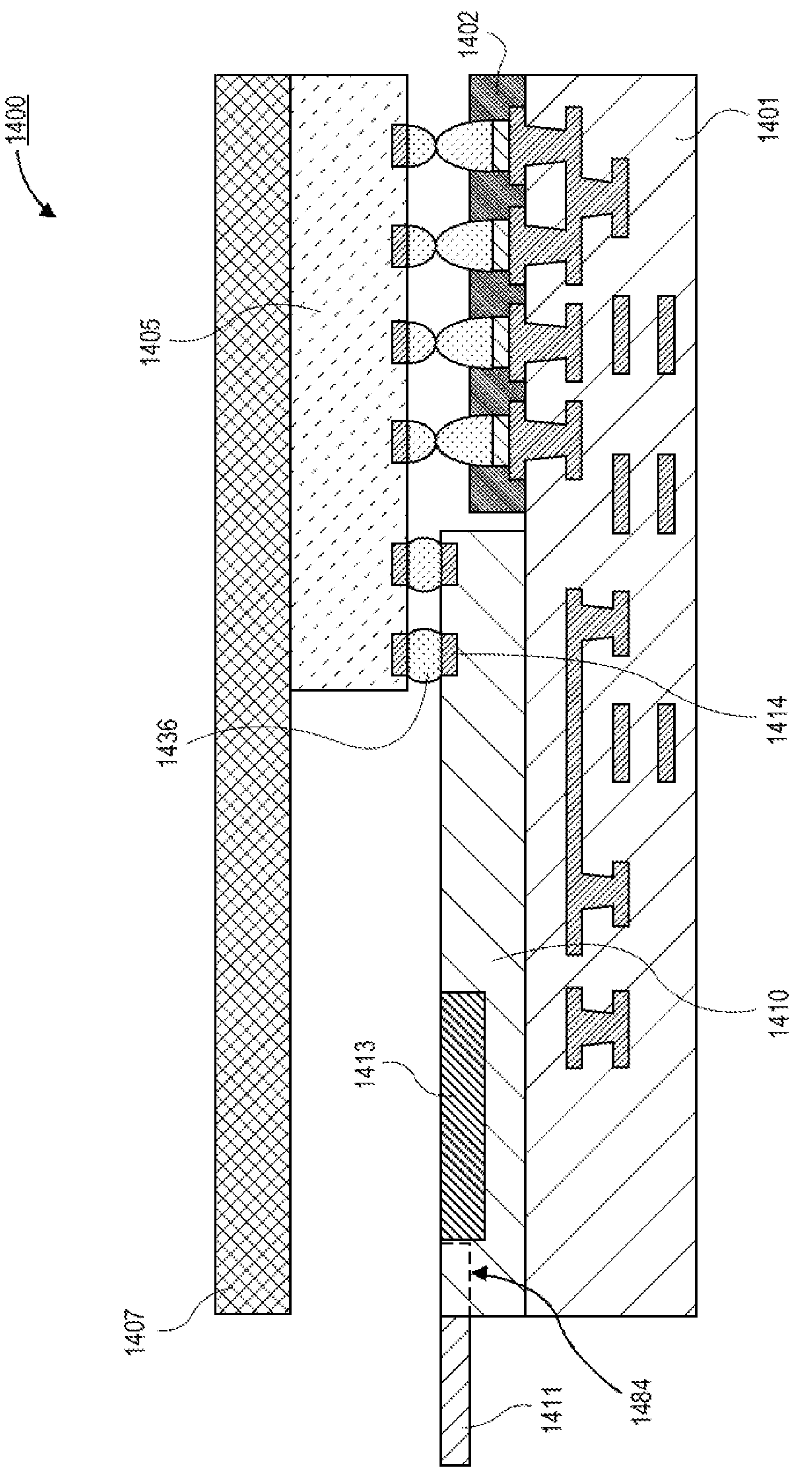
FIG. 14A is a cross-sectional illustration of an optical package with a photonics die directly coupled to a compute die, in accordance with an additional embodiment.

Referring now to FIG. 14A, a cross-sectional illustration of an optical package 1400 is shown, in accordance with an additional embodiment. As shown, the optical package 1400 comprises a package substrate 1401 with a solder resist 1402. The package substrate 1401 may be an organic package substrate. In an embodiment, the package substrate 1401 may be coupled to a board (not shown). In an embodiment, a photonics die 1410 is provided on the package substrate 1401. That is, the photonics die 1410 may be placed in a channel in the solder resist 1402. In an embodiment, the photonics die 1410 may receive optical signals from an optical fiber 1411 that is inserted along a V-groove 1484. Since the optical signal is received from the side, there may be no need for an opening into the IHS 1407 overhead. The optical signal is processed by a photonics module 1413 and is converted into an electrical signal that is sent to the pads 1414.

In an embodiment, the photonics die 1410 is directly coupled to a compute die 1405 by FLIs 1436. The direct coupling of the photonics die 1410 and the compute die 1405 may result in the electrical signal not needing to pass through the package substrate 1401. In an embodiment, a footprint of the compute die 1405 may at least partially overlap a footprint of the photonics die 1410 in order to allow for the FLI 1436 connection.

Figure 14B:
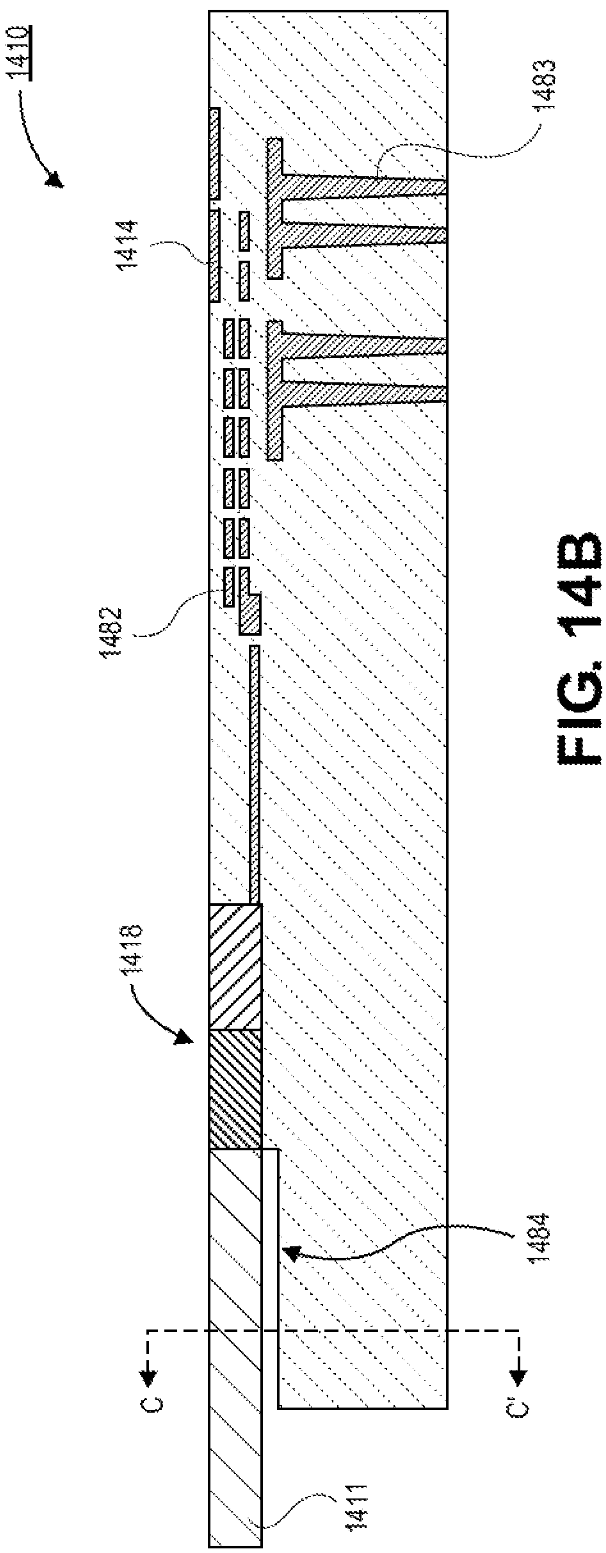
FIG. 14B is a cross-sectional illustration of a photonics die with a V-groove attachment, in accordance with an embodiment.
Figure 14C:
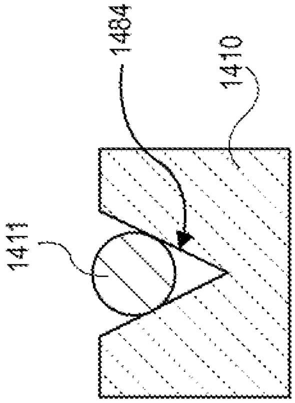
FIG. 14C is a cross-section of the photonics die in FIG. 14B that illustrates the V-groove, in accordance with an embodiment.

Referring now to FIGS. 14B and 14C, cross-sectional illustrations of the photonics die 1410 are shown, in accordance with an embodiment. As shown, an optical fiber 1411 is set into a V-groove 1484. The V-groove construction is shown in FIG. 14C. The optical fiber 1411 feeds an optical signal to a group III-V heterojunction 1418. The group III-V heterojunction 1418 may allow for the conversion of an optical signal to an electrical signal. In an embodiment, the electrical signal is routed to pads 1414 through conductive routing 1482 embedded in the substrate. The conductive routing 1482 may be high-density routing in order to enable pads 1414 that are suitable for forming FLIs with the compute die 1405. In some embodiments, through substrate vias 1483 may be provide through all, or a portion of the thickness of the photonics die 1410. The through substrate vias 1483 may be used to provide power to the overlying compute die (not shown in FIG. 14B).

It is to be appreciated that the photonics modules in FIGS. 13A-14C are sensitive to heat. That is, the photonics modules may not function properly at elevated temperatures. Typically, the photonics dies are able to be thermally coupled to the IHS in order to remove thermal energy from the photonics dies. However, by moving the photonics die down into the package substrate 1501, there may not be a direct path to the IHS. Accordingly, embodiments disclosed herein include additional thermal control features that allow for thermal regulation of the photonics dies.

Figure 15A:
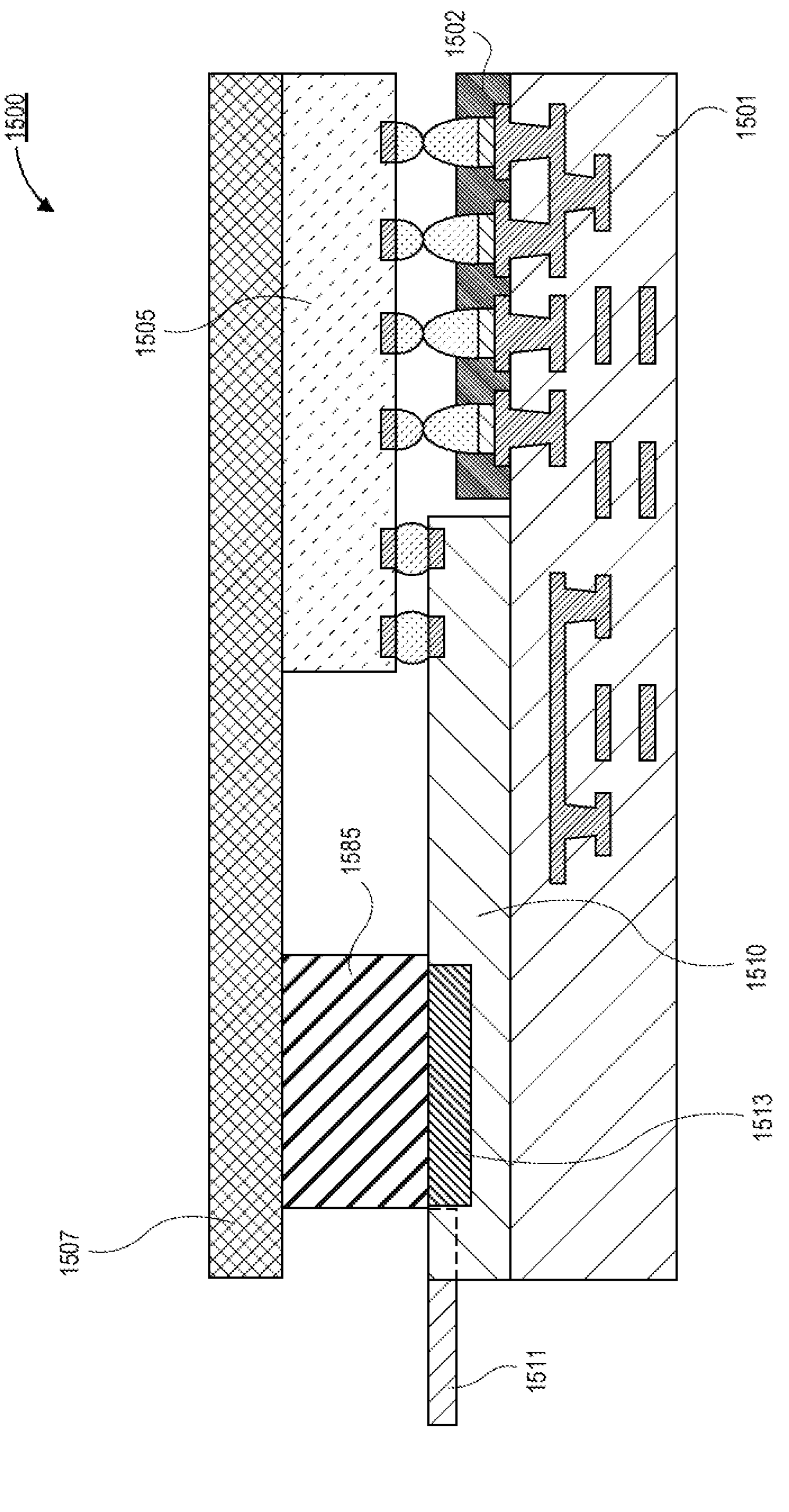
FIG. 15A is a cross-sectional illustration of an optical package with a photonics die that is thermally coupled to an integrated heat spreader by a thermal block, in accordance with an embodiment.

Referring now to FIG. 15A, a cross-sectional illustration of an optical package 1500 is shown, in accordance with an embodiment. The optical package 1500 may comprise a package substrate 1501 with a solder resist 1502. A photonics die 1510 that is fed an optical signal from an optical fiber 1511 is shown. The photonics die 1510 may be directly coupled to the compute die 1505 through FLIs. An IHS 1507 may be provided above the compute die 1505. Since the photonics die 1510 is lowered, the IHS 1507 may not be able to be directly coupled to the photonics die 1510.

Accordingly, a thermal block 1585 may be provided to allow for thermal coupling between the photonics die 1510 and the IHS 1507. In a particular embodiment, the thermal block 1585 may be provided over the photonics module 1513. The thermal block 1585 may be a thermally conductive material. In a particular embodiment, the thermal block 1585 is a dummy silicon die. That is, a blank silicon die without functional circuitry may be used. In an alternative embodiment, the thermal block 1585 may comprise a thermoelectric cooling (TEC) device. The TEC device may be used to actively cool the photonics module 1513.

Figure 15B:
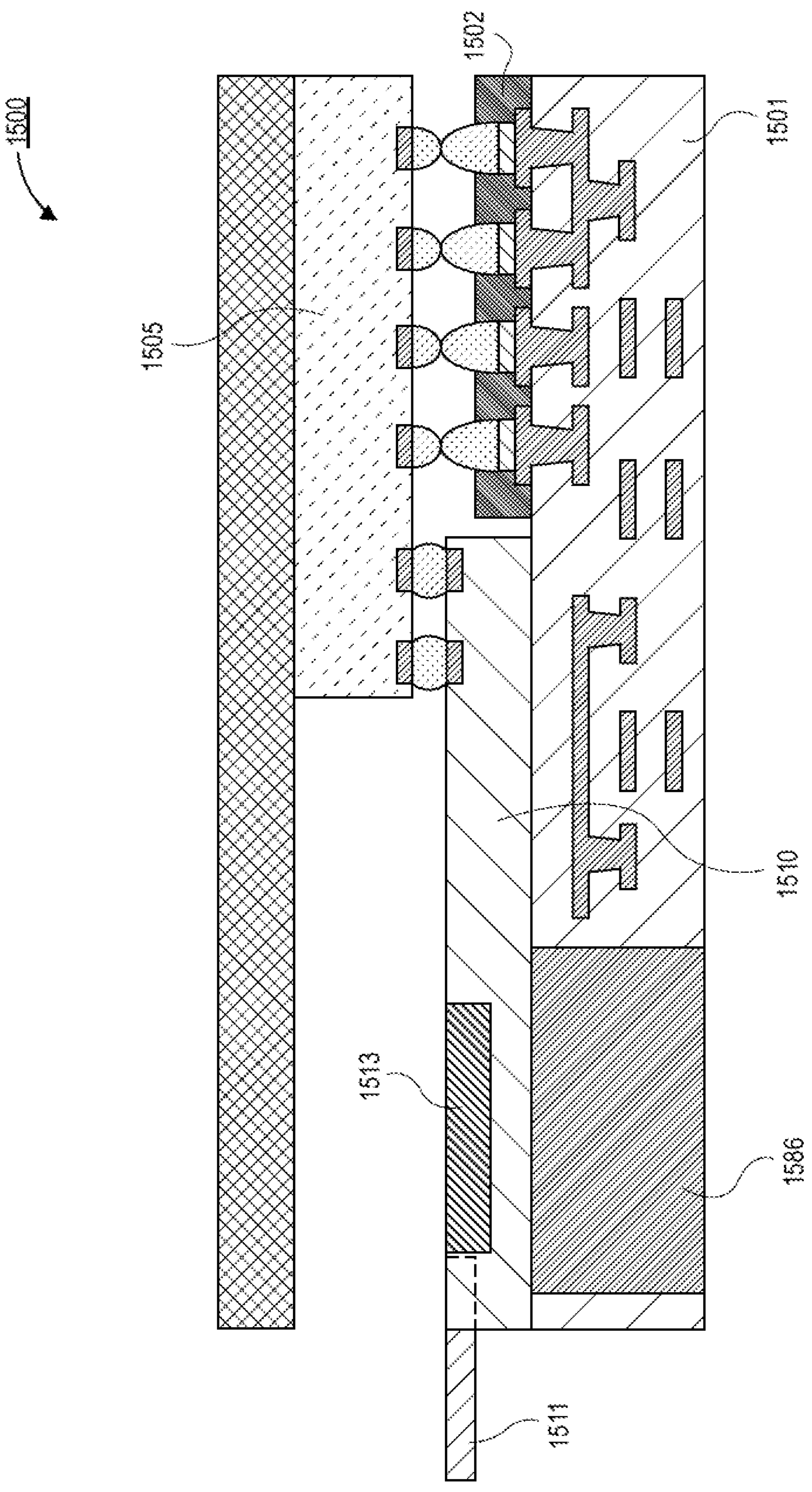
FIG. 15B is a cross-sectional illustration of an optical package with a photonics die and a thermal block below the photonics die, in accordance with an embodiment.

Referring now to FIG. 15B, a cross-sectional illustration of an optical package 1500 is shown, in accordance with an additional embodiment. Instead of providing cooling from above to the IHS 1507, a thermal block 1586 is provided through the package substrate 1501. In an embodiment, the thermal block 1586 may be provided below the photonics module 1513. The thermal block 1586 may be a thermally conductive material, such as, but not limited to, copper.

Figure 15C:
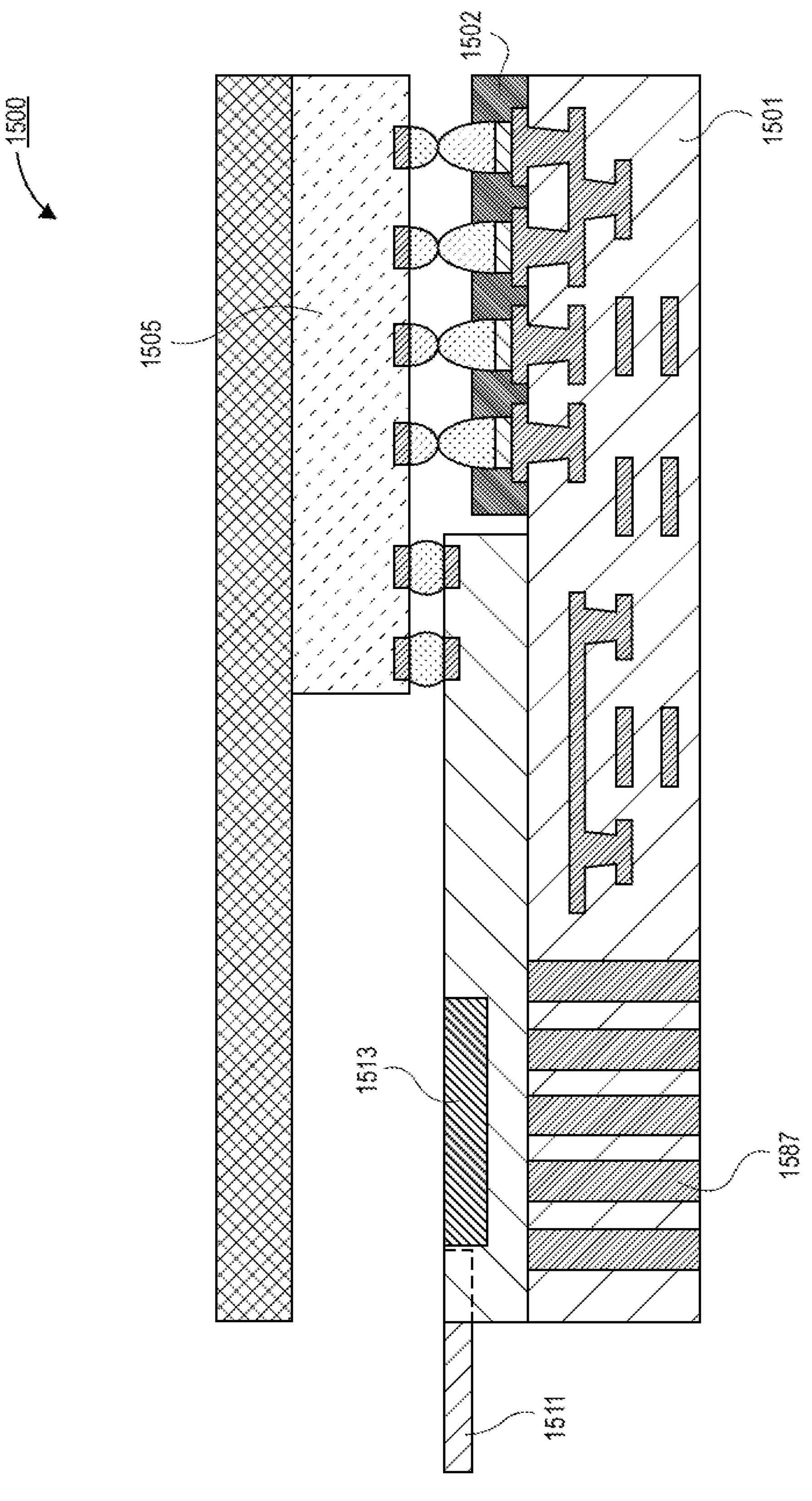
FIG. 15C is a cross-sectional illustration of an optical package with a photonics die and a plurality of thermal pillars below the photonics die, in accordance with an embodiment.

Referring now to FIG. 15C, a cross-sectional illustration of an optical package 1500 is shown, in accordance with an additional embodiment. The optical package 1500 in FIG. 15C is substantially similar to the optical package 1500 in FIG. 15B, with the exception of there being a plurality of thermally conductive pillars 1587 instead of a single thermal block 1586. The plurality of thermally conductive pillars 1587 may comprise a thermally conductive material such as, but not limited to, copper.

In FIGS. 15A-15C, the thermal control features are shown in conjunction with an optical package that is similar to the optical package 1400 in FIG. 4A. However, it is to be appreciated that similar thermal control features may also be applied to an optical package similar to the optical package 1300 in FIG. 13A.

Figure 16:
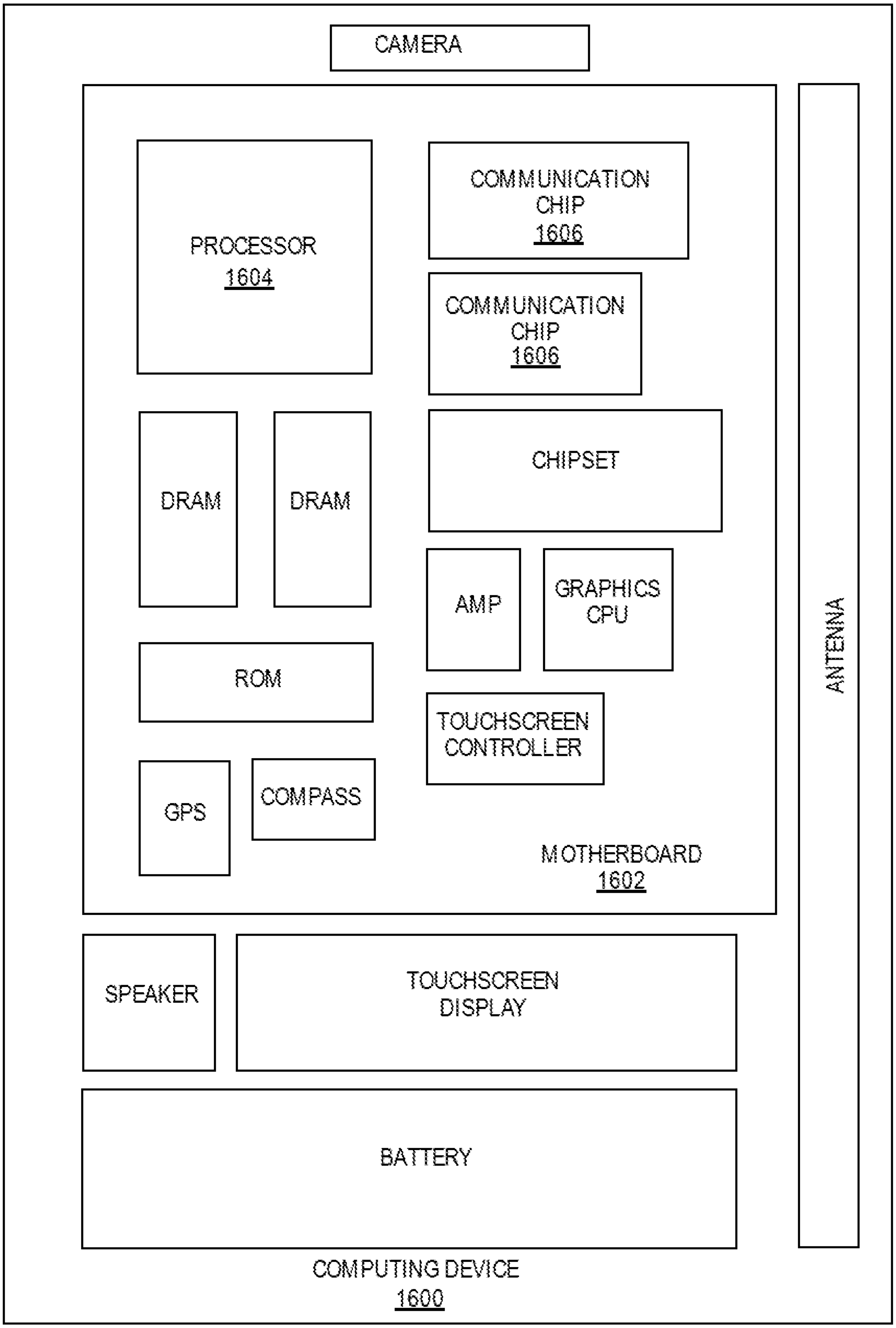
FIG. 16 is a schematic of a computing device built in accordance with an embodiment.

FIG. 16 illustrates a computing device 1600 in accordance with one implementation of the invention. The computing device 1600 houses a board 1602. The board 1602 may include a number of components, including but not limited to a processor 1604 and at least one communication chip 1606. The processor 1604 is physically and electrically coupled to the board 1602. In some implementations the at least one communication chip 1606 is also physically and electrically coupled to the board 1602. In further implementations, the communication chip 1606 is part of the processor 1604.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1606 enables wireless communications for the transfer of data to and from the computing device 1600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1600 may include a plurality of communication chips 1606. For instance, a first communication chip 1606 may be dedicated to shorter range wireless communications such as Wi-Fi and Bluetooth and a second communication chip 1606 may be dedicated to longer range wireless communications such as GPS, EDGE, GPRS, CDMA, WiMAX, LTE, Ev-DO, and others.

The processor 1604 of the computing device 1600 includes an integrated circuit die packaged within the processor 1604. In some implementations of the invention, the integrated circuit die of the processor may be part of an optical package that comprises an embedded optical waveguide that routs an optical signal from an edge of package substrate to an overlying photonics die, in accordance with embodiments described herein. The term "processor" may refer to any device or portion of a device that processes electronic data from registers and/or memory to transform that electronic data into other electronic data that may be stored in registers and/or memory.

The communication chip 1606 also includes an integrated circuit die packaged within the communication chip 1606. In accordance with another implementation of the invention, the integrated circuit die of the communication chip may be part of an optical package that comprises an embedded optical waveguide that routs an optical signal from an edge of package substrate to an overlying photonics die, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an optical package, comprising: a package substrate; a photonics die coupled to the package substrate; a compute die coupled to the package substrate, wherein the photonics die is communicatively coupled to the compute die by a bridge in the package substrate; and an optical waveguide embedded in the package substrate, wherein a first end of the optical waveguide is below the photonics die, and wherein a second end of the optical waveguide is substantially coplanar with an edge of the package substrate.

Example 2: the optical package of Example 1, wherein the first end of the optical waveguide is angled.

Example 3: the optical package of Example 1 or Example 2, further comprising: a solder resist over the package substrate; and an optical path from the first end of the optical waveguide through the solder resist.

Example 4: the optical package of Example 3, wherein the optical path comprises a cladding and a core.

Example 5: the optical package of Example 4, wherein the cladding comprises a polyimide, a polyalkane, a polycyanate, a polyacrylate, a polysiloxane, a metallic material, or a polyperflurocarbon polymer.

Example 6: the optical package of Example 4, further comprising: a first lens over the core; and a second lens over the second end of the optical waveguide.

Example 7: the optical package of Examples 1-6, wherein an optical path into the photonics die enters the photonics die at a surface of the photonics die facing the package substrate.

Example 8: the optical package of Examples 1-7, wherein the optical waveguide is in direct contact with the package substrate.

Example 9: the optical package of Example 8, wherein a surface of the package substrate contacting the optical waveguide has a surface roughness of approximately 70 nm RMS or smoother.

Example 10: the optical package of Example 8, wherein the optical waveguide comprises a polyimide, a polyalkane, a polycyanate, a diazobenzoquinone, a metal-centered dendrite polymer, a high-density polycarbonate, a polythiphene, a polythiadiazole, or a polysulfone.

Example 11: the optical package of Examples 1-10, wherein the optical waveguide is a discrete component embedded in the package substrate.

Example 12: the optical package of Example 11, further comprising: a mirror at the first end of the optical waveguide, wherein the mirror is angled.

Example 13: the optical package of Examples 1-12, further comprising: a silver coating between the optical waveguide and the package substrate.

Example 14: the optical package of Examples 1-13, wherein the photonics die is entirely within a footprint of the package substrate.

Example 15: the optical package of Examples 1-14, further comprising: an underfill between the photonics die and the package substrate and between the compute die and the package substrate; and an underfill dam to prevent the flow of the underfill over the first end of the optical waveguide.

Example 16: an optical package, comprising: a package substrate; a trench in a top surface of the package substrate, wherein the trench has a first end and a second end that is positioned at an edge of the package substrate; a solder resist over the top surface of the package substrate; and an opening through the solder resist, wherein the opening is over the first end of the trench.

Example 17: the optical package of Example 16, wherein the trench is filled with a material with a refractive index greater than 1.0.

Example 18: the optical package of Example 16 or Example 17, wherein the trench has a surface roughness of approximately 70 nm RMS or lower.

Example 19: the optical package of Examples 16-18, wherein the opening is filled with a cladding and a core.

Example 20: the optical package of Examples 16-19, further comprising: a photonics die over the package substrate, wherein the photonics die is entirely within a footprint of the package substrate, and wherein the photonics die is positioned over the opening through the solder resist.

Example 21: the optical package of Example 20, further comprising: a compute die over the package substrate, wherein the photonics die is communicatively coupled to the compute die by a bridge embedded in the package substrate.

Example 22: the optical package of Examples 16-21, wherein a footprint of the package substrate is rectangular.

Example 23: the optical package of Examples 16-21, further comprising: a discrete optical waveguide positioned in the trench.

Example 24: an optical system, comprising: a board; a package substrate coupled to the board; a compute die coupled to the package substrate; a photonics die coupled to the package substrate; and an optical waveguide embedded in the package substrate, wherein a first end of the optical waveguide is below the photonics die and a second end of the optical waveguide is at an edge of the package substrate.

Example 25: the optical system of Example 24, wherein the first end of the optical waveguide is angled.

Example 26: an optical package, comprising: a package substrate; a patch over the package substrate, wherein the patch comprises: a glass substrate; a photonics die over the glass substrate; a compute die over the glass substrate; and an optical waveguide embedded in the glass substrate, wherein the optical waveguide has a first end that is below the photonics die and a second end at an edge of the glass substrate.

Example 27: the optical package of Example 26, wherein the photonics die is communicatively coupled to the compute die by a bridge embedded in the glass substrate.

Example 28: the optical package of Example 26 or Example 27, further comprising: a high-density routing stack over the glass substrate, wherein the photonics die is communicatively coupled to the compute die by interconnects in the high-density routing stack.

Example 29: the optical package of Example 28, further comprising: an optical path through the high-density routing stack, wherein the optical path is above the first end of the optical waveguide.

Example 30: the optical package of Example 29, wherein the optical path comprises a cladding and a core.

Example 31: the optical package of Examples 26-30, wherein the optical waveguide comprises a polyimide, a polyalkane, a polycyanate, a diazobenzoquinone, a metal-centered dendrite polymer, a high-density polycarbonate, a polythiphene, a polythiadiazole, or a polysulfone.

Example 32: the optical package of Examples 26-31, wherein the first end of the optical waveguide is angled.

Example 33: the optical package of Examples 26-32, further comprising: an organic layer over the glass substrate; and a solder resist layer over the organic layer.

Example 34: the optical package of Example 33, further comprising: an optical path through the organic layer and the solder resist layer, wherein the optical path is above the first end of the optical waveguide.

Example 35: the optical package of Example 34, wherein the optical path comprises a cladding and a core.

Example 36: the optical package of Examples 26-34, further comprising: vias through a thickness of the glass substrate, wherein the vias are electrically coupled to the package substrate.

Example 37: an optical package, comprising: a glass substrate; a photonics die over the glass substrate, wherein the photonics die is entirely within a footprint of the glass substrate; a compute die over the glass substrate, wherein the compute die is communicatively coupled to the photonics die; and an optical waveguide embedded in the glass substrate, wherein the optical waveguide has a first end that is below the photonics die and a second end at an edge of the glass substrate.

Example 38: the optical package of Example 37, wherein the photonics die is communicatively coupled to the compute die by a bridge embedded in the glass substrate.

Example 39: the optical package of Example 37 or Example 38, further comprising: a high-density routing stack over the glass substrate, wherein the photonics die is communicatively coupled to the compute die by interconnects in the high-density routing stack.

Example 40: the optical package of Examples 37-39, further comprising: vias through an entire thickness of the glass substrate.

Example 41: the optical package of Examples 37-40 wherein the first end is tapered.

Example 42: the optical package of Example 41, wherein the taper is at a 45° angle.

Example 43: the optical package of Examples 37-42, wherein the optical waveguide comprises a polyimide, a polyalkane, a polycyanate, a diazobenzoquinone, a metal-centered dendrite polymer, a high-density polycarbonate, a polythiphene, a polythiadiazole, or a polysulfone.

Example 44: the optical package of Examples 37-43, wherein a silver layer is between the optical waveguide and the glass substrate.

Example 45: the optical package of Examples 37-44, further comprising: an underfill between the photonics die and the glass substrate and between the compute die and the glass substrate, wherein the underfill is blocked from being disposed over the first end of the optical waveguide.

Example 46: the optical package of Examples 37-45, further comprising: a package substrate coupled to the glass substrate.

Example 47: the optical package of Example 46, wherein the package substrate comprises a core layer.

Example 48: an optical system, comprising: a board; a package substrate coupled to the board; and a patch coupled to the package substrate, wherein the patch comprises: a glass substrate; a photonics die over the glass substrate, wherein the photonics die is entirely within a footprint of the glass substrate; a compute die over the glass substrate, wherein the compute die is communicatively coupled to the photonics die; and an optical waveguide embedded in the glass substrate, wherein the optical waveguide has a first end that is below the photonics die and a second end at an edge of the glass substrate.

Example 49: the optical system of Example 48, wherein the photonics die is communicatively coupled to the compute die by a bridge embedded in the glass substrate.

Example 50: the optical system of Example 48, further comprising: a high-density routing stack over the glass substrate, wherein the photonics die is communicatively coupled to the compute die by interconnects in the high-density routing stack.

Example 51: an optical package, comprising: a package substrate, wherein the package substrate comprises: a plurality of glass layers; and a plurality of dielectric layers, wherein the plurality of glass layers and the plurality of dielectric layers are alternated in a stack; a photonics die over the package substrate; a compute die over the package substrate; and an optical waveguide embedded in the package substrate, wherein the optical waveguide has a first end below the photonics die and a second end at an edge of the package substrate.

Example 52: the optical package of Example 51, wherein the optical waveguide is embedded in one of the plurality of glass layers.

Example 53: the optical package of Example 52, wherein the optical waveguide is embedded in the glass layer closest to the photonics die.

Example 54: the optical package of Examples 51-53, further comprising: a plurality of conductive paths from a first surface of the package substrate to a second surface of the package substrate.

Example 55: the optical package of Examples 51-54, wherein the photonics die is communicatively coupled to the compute die by a bridge embedded in the package substrate.

Example 56: the optical package of Examples 51-54, wherein the photonics die is communicatively coupled to the compute die by interconnects embedded in the package substrate.

Example 57: the optical package of Examples 51-56, wherein the photonics die is entirely within a footprint of the package substrate.

Example 58: the optical package of Examples 51-56, further comprising: a solder resist over the package substrate; and an optical path through the solder resist above the first end of the optical waveguide.

Example 59: the optical package of Example 58, wherein the optical path comprises a cladding and a core.

Example 60: the optical package of Examples 51-59, wherein the first end of the optical waveguide is tapered.

Example 61: the optical package of Examples 51-60, wherein the optical waveguide comprises a polyimide, a polyalkane, a polycyanate, a diazobenzoquinone, a metal-centered dendrite polymer, a high-density polycarbonate, a polythiphene, a polythiadiazole, or a polysulfone.

Example 62: the optical package of Examples 51-61, wherein conductive traces and pads in the package substrate are embedded in the plurality of glass layers, and wherein vias pass through the glass layers and the dielectric layers.

Example 63: the optical package of Examples 51-62, further comprising: an underfill between the photonics die and the package substrate and between the compute die and the package substrate, wherein the underfill is blocked from being disposed over the first end of the optical waveguide.

Example 64: an optical package, comprising: a package substrate, wherein the package substrate comprises a plurality of glass layers; a photonics die over the package substrate, wherein the photonics die is entirely within a footprint of the package substrate; a compute die over the package substrate, wherein the photonics die is communicatively coupled to the compute die; and an optical waveguide, wherein the optical waveguide provides an optical path from an edge of the package substrate to below the photonics die.

Example 65: the optical package of Example 64, wherein the optical waveguide comprises a first end below the photonics die and a second end at the edge of the package substrate, wherein the first end is tapered.

Example 66: the optical package of Example 65, further comprising: a solder resist over the package substrate; and an optical path through the solder resist above the first end of the optical waveguide.

Example 67: the optical package of Example 66, wherein the optical path comprises a cladding and a core.

Example 68: the optical package of Examples 64-67, wherein the plurality of glass layers are adhered to each other by a plurality of dielectric layers.

Example 69: the optical package of Examples 64-68, wherein the optical waveguide comprises a polyimide, a polyalkane, a polycyanate, a diazobenzoquinone, a metal-centered dendrite polymer, a high-density polycarbonate, a polythiphene, a polythiadiazole, or a polysulfone.

Example 70: the optical package of Examples 64-69, wherein the photonics die is communicatively coupled to the compute die by a bridge embedded in the package substrate.

Example 71: the optical package of Examples 64-69, wherein the photonics die is communicatively coupled to the compute die by interconnects embedded in the package substrate.

Example 72: the optical package of Examples 64-71, further comprising: an underfill between the photonics die and the package substrate and between the compute die and the package substrate, wherein the underfill is blocked from being disposed over an end of the optical waveguide below the photonics die.

Example 73: an optical system, comprising: a board; and an optical package coupled to the board, wherein the optical package comprises: a package substrate, wherein the package substrate comprises a plurality of glass layers; a photonics die over the package substrate, wherein the photonics die is entirely within a footprint of the package substrate; a compute die over the package substrate, wherein the photonics die is communicatively coupled to the compute die; and an optical waveguide, wherein the optical waveguide provides an optical path from an edge of the package substrate to below the photonics die.

Example 74: the optical system of Example 73, wherein the photonics die is communicatively coupled to the compute die by a bridge embedded in the package substrate.

Example 75: the optical system of Example 73, wherein the photonics die is communicatively coupled to the compute die by interconnects embedded in the package substrate.

Example 76: an optical package, comprising: a package substrate; a photonics die on the package substrate, wherein the photonics die comprises a photonics module and conductive routing with interconnect pads; and a compute die on the package substrate, wherein a footprint of the compute die overlaps a footprint of the photonics die, and wherein the interconnect pads on the photonics die are coupled to the compute die by first level interconnects (FLIs).

Example 77: the optical package of Example 76, further comprising: an integrated heat spreader (IHS) thermally coupled to the compute die.

Example 78: the optical package of Example 77, further comprising: an opening through the IHS.

Example 79: the optical package of Example 78, wherein a light source is configured to pass through the opening to optically couple with the photonics module.

Example 80: the optical package of Example 79, wherein the photonics module comprises: a grating coupler; and a group III-V heterojunction.

Example 81: the optical package of Example 76, further comprising: an optical fiber that is optically coupled to the photonics module.

Example 82: the optical package of Example 81, wherein the optical fiber is set into a V-groove on the photonics die.

Example 83: the optical package of Examples 76-82, wherein the photonics die is placed in a cavity through a solder resist over the package substrate.

Example 84: the optical package of Examples 76-83, wherein the photonics die further comprises: through substrate vias through a thickness of the photonics die.

Example 85: the optical package of Examples 76-84, further comprising: a thermally conductive block embedded in the package substrate below the photonics module.

Example 86: the optical package of Examples 76-85, further comprising: an array of thermally conductive pillars embedded in the package substrate below the photonics module.

Example 87: the optical package of Examples 76-86, further comprising: a dummy silicon die over the photonics module, wherein the dummy silicon die is thermally coupled to an integrated heat spreader.

Example 88: the optical package of Examples 76-87, further comprising: a thermoelectric cooler over the photonics module, wherein the thermoelectric cooler is thermally coupled to an integrated heat spreader.

Example 89: a photonics die, comprising: a substrate; an optical coupler; a photonics module, wherein the photonics module comprises a group III-V heterojunction to convert optical signals to electrical signals; electrical routing electrically coupled to the photonics module; and conductive pads on a surface of the substrate, wherein the conductive pads are electrically coupled to the electrical routing.

Example 90: the photonics die of Example 89, wherein the optical coupler is a grating coupler.

Example 91: the photonics die of Example 90, wherein the grating coupler is optically coupled to the photonics module by a silicon waveguide.

Example 92: the photonics die of Example 89, wherein the optical coupler comprises a V-groove configured to receive an optical fiber.

Example 93: the photonics die of Examples 89-92, further comprising: through substrate vias through a thickness of the substrate.

Example 94: the photonics die of Examples 89-93, further comprising: a dummy silicon die attached over the photonics module.

Example 95: the photonics die of Examples 89-94, further comprising: a thermoelectric cooler attached over the photonics module.

Example 96: an optical system, comprising: a board; a package substrate over the board; a photonics die over the package substrate; and a compute die over the package substrate, wherein a footprint of the photonics die at least partially overlaps a footprint of the compute die.

Example 97: the optical system of Example 96, wherein the photonics die is electrically coupled to the compute die by first level interconnects.

Example 98: the optical system of Example 96 or Example 97, wherein the photonics die comprises an optical coupler.

Example 99: the optical system of Example 98, wherein the optical coupler is a grating coupler.

Example 100: the optical system of Example 98, wherein the optical coupler comprises a V-groove configured to receive an optical fiber.

What is claimed is:

1. An optical package, comprising:

a package substrate having an uppermost surface;

a first photonics die and a second photonics die coupled to the package substrate;

a compute die coupled to the package substrate, the compute die laterally between the first photonics die and the second photonics die, wherein the first photonics die is coupled to the compute die by a first bridge in the package substrate, and the second photonics die is coupled to the compute die by a second bridge in the package substrate, wherein each of the first bridge and the second bridge is a discrete component set in a cavity in the package substrate, and wherein each of the first bridge and the second bridge has an uppermost surface below the uppermost surface of the package substrate; and a first optical waveguide and a second optical waveguide embedded in the package substrate, wherein a first end of the first optical waveguide is below the first photonics die and wherein a first end of the second optical waveguide is below the second photonics die, wherein a second end of the first optical waveguide is substantially coplanar with a first edge of the package substrate and a second end of the second optical waveguide is substantially coplanar with a second edge of the package substrate, and wherein the first optical waveguide is laterally spaced apart from the first bridge, and the second optical waveguide is laterally spaced apart from the second bridge.

2. The optical package of claim 1, wherein the first end of each of the first the optical waveguide and the second optical waveguide is angled.

3. The optical package of claim 1, further comprising:

a solder resist over the package substrate; and an optical path from the first end of the first optical waveguide through the solder resist.

4. The optical package of claim 3, wherein the optical path comprises a cladding and a core.

5. The optical package of claim 4, wherein the cladding comprises a polyimide, a polyalkane, a polycyanate, a polyacrylate, a polysiloxane, a metallic material, or a polyperflurocarbon polymer.

6. The optical package of claim 4, further comprising:
a first lens over the core; and
a second lens over the second end of the first optical waveguide.

7. The optical package of claim 1, wherein an optical path into the first photonics die enters the first photonics die at a surface of the first photonics die facing the package substrate.

8. The optical package of claim 1, wherein each of the first optical waveguide and the second optical waveguide is in direct contact with the package substrate.

9. The optical package of claim 8, wherein a surface of the package substrate contacting the first optical waveguide and the second optical waveguide has a surface roughness of approximately 70 nm RMS or smoother.

10. The optical package of claim 8, wherein each of the first optical waveguide and the second optical waveguide comprises a polyimide, a polyalkane, a polycyanate, a diazobenzoquinone, a metal-centered dendrite polymer, a high-density polycarbonate, a polythiphene, a polythiadiazole, or a polysulfone.

11. The optical package of claim 1, wherein each of the first optical waveguide and the second optical waveguide is a discrete component embedded in the package substrate.

12. The optical package of claim 11, further comprising:
a mirror at the first end of the first optical waveguide, wherein the mirror is angled.

13. The optical package of claim 1, further comprising:
a silver coating between each of the first optical waveguide and the second optical waveguide and the package substrate.

14. The optical package of claim 1, wherein each of the first photonics die and the second photonics die is entirely within a footprint of the package substrate.

15. The optical package of claim 1, further comprising:
an underfill between the first photonics die and the package substrate, between the second photonics die and the package substrate, and between the compute die and the package substrate; and
an underfill dam to prevent the flow of the underfill over the first end of the first optical waveguide.

16. An optical system, comprising:
a board;
a package substrate coupled to the board, the package substrate having an uppermost surface;
a compute die coupled to the package substrate;
a first photonics die and a second photonics die coupled to the package substrate, the compute die laterally between the first photonics die and the second photonics die, wherein the first photonics die is coupled to the compute die by a first bridge in the package substrate, and the second photonics die is coupled to the compute die by a second bridge in the package substrate, wherein each of the first bridge and the second bridge is a discrete component set in a cavity in the package substrate, and wherein each of the first bridge and the second bridge has an uppermost surface below the uppermost surface of the package substrate; and
a first optical waveguide and a second optical waveguide embedded in the package substrate, wherein a first end of the first optical waveguide is below the first photonics die and wherein a first end of the second optical waveguide is below the second photonics die, wherein a second end of the first optical waveguide is substantially coplanar with a first edge of the package substrate and a second end of the second optical waveguide is substantially coplanar with a second edge of the package substrate, and wherein the first optical waveguide is laterally spaced apart from the first bridge, and the second optical waveguide is laterally spaced apart from the second bridge.

17. The optical system of claim 16, wherein the first end of each of the first optical waveguide and the second optical waveguide is angled.

* * * * *